US012641854B2

(12) United States Patent
Chang et al.

(10) Patent No.:  US 12,641,854 B2
(45) Date of Patent:      May 26, 2026

(54) SEMICONDUCTOR DEVICE HAVING IMPROVED GATE STACKS AND METHODS OF FABRICATION THEREOF

(71) Applicant: TAIWAN SEMICONDUCTOR MANUFACTURING COMPANY, LTD., Hsinchu (TW)

(72) Inventors: Cheng-Wei Chang, Taipei City (TW); Shahaji B. More, Hsinchu (TW); Chi-Yu Chou, Hsinchu (TW); Yueh-Ching Pai, Taichung City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 851 days.

(21) Appl. No.: 17/883,201

(22) Filed: Aug. 8, 2022

(65) Prior Publication Data

US 2023/0352546 A1      Nov. 2, 2023

Related U.S. Application Data

(60) Provisional application No. 63/336,659, filed on Apr. 29, 2022.

(51) Int. Cl.
*H01L 29/40* (2006.01)
*H01L 21/28* (2025.01)
(Continued)

(52) U.S. Cl.
CPC ..... *H10D 64/118* (2025.01); *H01L 21/28158* (2013.01); *H01L 21/28185* (2013.01);
(Continued)

(58) Field of Classification Search
CPC .......... H01L 21/3115; H01L 21/28185; H10D 84/0144; H10D 84/0181; H10D 64/514
See application file for complete search history.

(56) References Cited

U.S. PATENT DOCUMENTS

| | | | |
|---|---|---|---|
| 2020/0118891 A1 | 4/2020 | Cheng et al. | |
| 2020/0273700 A1* | 8/2020 | Cheng ................... | H10D 64/01 |

(Continued)

FOREIGN PATENT DOCUMENTS

| | | | | |
|---|---|---|---|---|
| CN | 1641895 | * | 7/2005 | ............. H01L 21/28 |
| CN | 113257898 | * | 8/2021 | ........... H01L 21/022 |
| TW | 202109880 A | | 3/2021 | |

OTHER PUBLICATIONS

Machine translation, Peng, Chinese Pat. Pub. No. CN1641895, translation date: Aug. 18, 2025, Espacenet, all pages. (Year: 2025).*

*Primary Examiner* — Ictoria K. Hall

(74) *Attorney, Agent, or Firm* — NZ Carr Law Office

(57) ABSTRACT

A semiconductor device structure is provided. The semiconductor device structure includes one or more semiconductor layers, an interfacial layer surrounding at least one semiconductor layer of the one or more semiconductor layers, a work function metal disposed over the interfacial layer, and a high-K (HK) dielectric layer disposed between the interfacial layer and the work function metal. The HK dielectric layer includes a first dopant region adjacent to a first interface of the HK dielectric layer and the interfacial layer, wherein the first dopant region comprises first dopants having a first polarity. The HK dielectric layer also includes a second dopant region adjacent to a second interface of the HK dielectric layer and the work function metal, wherein the second dopant region comprises second dopants having a second polarity opposite the first polarity.

20 Claims, 42 Drawing Sheets

(51) Int. Cl.

| | |
|---|---|
| *H01L 21/8238* | (2006.01) |
| *H01L 27/092* | (2006.01) |
| *H01L 29/49* | (2006.01) |
| *H01L 29/66* | (2006.01) |
| *H10D 30/01* | (2025.01) |
| *H10D 30/67* | (2025.01) |
| *H10D 64/00* | (2025.01) |
| *H10D 64/01* | (2025.01) |
| *H10D 84/01* | (2025.01) |
| *H10D 84/03* | (2025.01) |
| *H10D 84/85* | (2025.01) |

(52) U.S. Cl.
CPC ......... *H10D 30/014* (2025.01); *H10D 30/031* (2025.01); *H10D 30/6739* (2025.01); *H10D 64/01* (2025.01); *H10D 64/017* (2025.01); *H10D 84/0167* (2025.01); *H10D 84/0181* (2025.01); *H10D 84/038* (2025.01); *H10D 84/85* (2025.01); *H10D 84/856* (2025.01); *H10D 30/6735* (2025.01); *H10D 30/6757* (2025.01)

(56) References Cited

U.S. PATENT DOCUMENTS

| 2021/0082706 | A1 | 3/2021 | Yu et al. | |
|---|---|---|---|---|
| 2021/0091202 | A1* | 3/2021 | He | H10D 84/85 |
| 2021/0098304 | A1* | 4/2021 | Chang | H10D 30/014 |
| 2021/0134951 | A1 | 5/2021 | Chen et al. | |
| 2021/0242351 | A1 | 8/2021 | Gardner et al. | |
| 2021/0375629 | A1* | 12/2021 | Lai | H10D 84/0144 |
| 2021/0384313 | A1* | 12/2021 | Cheng | H10D 84/0144 |

* cited by examiner

SEMICONDUCTOR DEVICE HAVING IMPROVED GATE STACKS AND METHODS OF FABRICATION THEREOF

CROSS-REFERENCE TO RELATED APPLICATIONS

This application claims priority to U.S. Provisional Application Ser. No. 63/336,659 filed Apr. 29, 2022, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-15A are perspective views of various stages of manufacturing the semiconductor device structure taken along cross-section A-A of FIG. 8, in accordance with some embodiments.

FIGS. 9B-15B are cross-sectional side views of various stages of manufacturing the semiconductor device structure taken along cross-section B-B of FIG. 8, in accordance with some embodiments.

FIGS. 9C-15C are cross-sectional side views of various stages of manufacturing the semiconductor device structure taken along cross-section C-C of FIG. 8, in accordance with some embodiments.

FIGS. 15B-1 and 15B-3 illustrate enlarged views of a portion of the dielectric material showing a curved surface profile, in accordance with some embodiments.

FIGS. 15B-2 illustrate enlarged views of a portion of the insulating material showing a curved surface profile, in accordance with some embodiments.

FIGS. 19-1 and 19-2 illustrate enlarged views of a portion of the semiconductor device structure showing layers with dopant distribution after a thermal treatment, in accordance with one embodiment.

FIGS. 19-3 and 19-4 illustrate enlarged views of a portion of the semiconductor device structure showing layers with dopant distribution after a thermal treatment, in accordance with another embodiment.

FIGS. 23-1 to 23-8 illustrate enlarged views of a portion of the semiconductor device structure showing layers with dopant distribution after a thermal treatment, in accordance with some embodiments.

FIGS. 29A-1 and 29D-1 are enlarged views of a portion of the semiconductor device structure in FIGS. 29A and 29D, respectively, showing arrangement of the layers between adjacent first semiconductor layers, in accordance with the embodiment of FIG. 28.

FIGS. 29A-2 and 29D-2 are enlarged views of a portion of the semiconductor device structure in FIGS. 29A and 29D, respectively, showing arrangement of the layers between adjacent first semiconductor layers, in accordance with the embodiment of FIG. 23-1.

DETAILED DESCRIPTION

Figure 1:
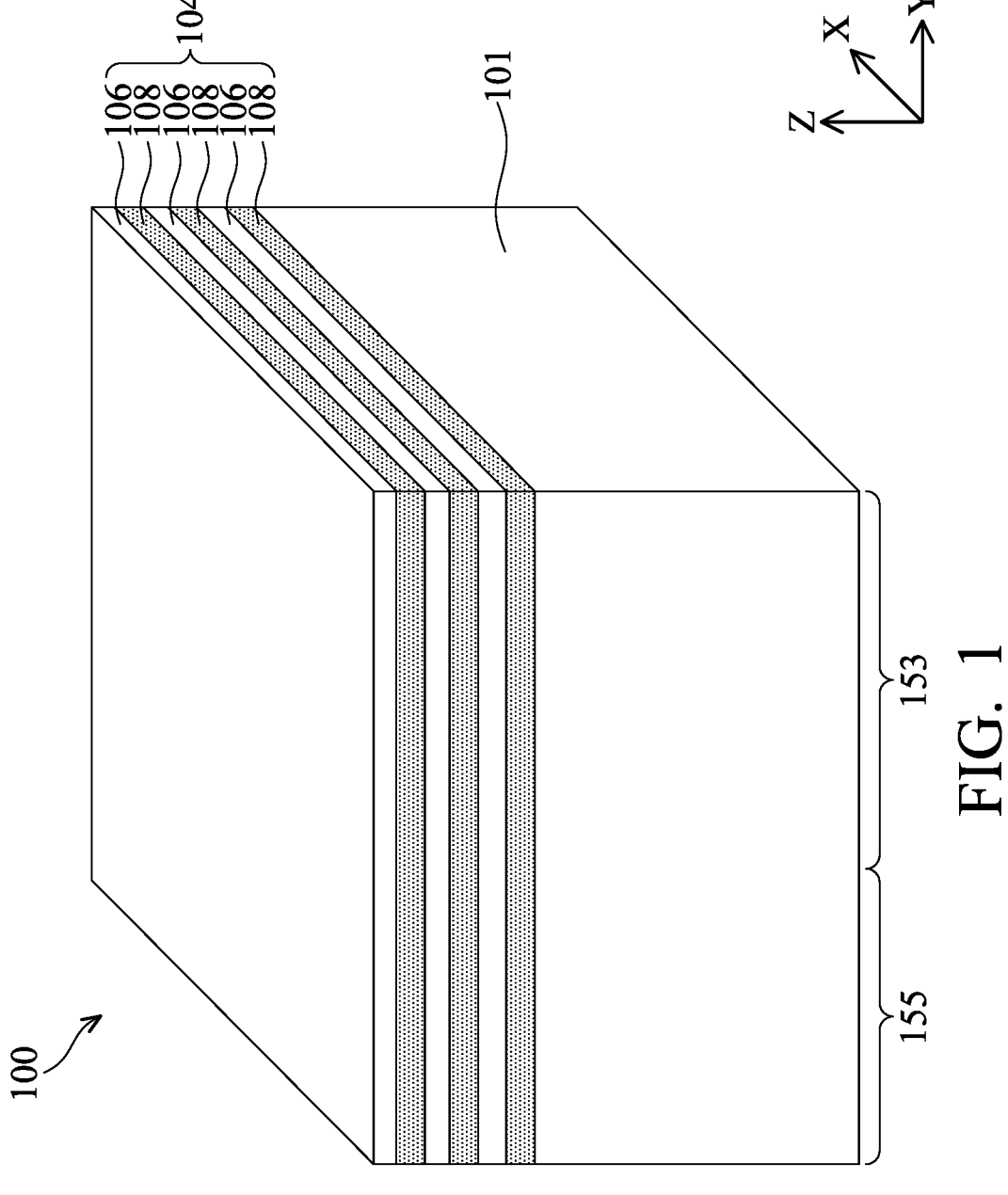
FIGS. 1-8 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-30D show exemplary processes for manufacturing a semiconductor device structure 100 according to embodiments of the present disclosure. It is understood that additional operations can be provided before, during, and after processes shown by FIGS. 1-30D, and some of the operations described below can be replaced or eliminated, for additional embodiments of the method. The order of the operations/processes is not limiting and may be interchangeable.

FIGS. 1-8 are perspective views of various stages of manufacturing a semiconductor device structure 100, in accordance with some embodiments. As shown in FIG. 1, a semiconductor device structure 100 includes a stack of semiconductor layers 104 formed over a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In one embodiment, the substrate 101 is made of silicon. In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having P-type or N-type conductivity). The dopants may be, for example boron for P-type field effect transistors (P-type FETs) and phosphorus for N-type field effect transistors (N-type FETs). For example, the substrate 101 may have a region 153 and a region 155 adjacent to the region 153. The region 153 may be designated as a P-type region or an N-type region, and the region 155 may be designated as an N-type region or a P-type region. Alternatively, both regions 153, 155 may be designated as a P-type region or N-type region. In one embodiment, the region 153 is an N-type region and the region 155 is a P-type region. While not shown in scale in some figures, the region 153 and the region 155 belong to a continuous substrate 101. In some embodiments of the present disclosure, the P-type region is used to form a PMOS structure thereon, whereas the N-type region is used to form an NMOS structure thereon. Depending on circuit design, the regions 153, 155 may be used for forming different types of circuits. For example, the region 153 may be used for forming, e.g., peripheral circuits, input/output (I/O) circuits, electrostatic discharge (ESD) circuits, and/or analog circuits and the region 155 region may be used for forming logic circuits. Other regions for forming other types of circuits are contemplated and are intended to be included within the scope of the present disclosure.

The stack of semiconductor layers 104 includes semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layer 106 and the second semiconductor layer 108 may vary depending on the application and/or device performance considerations. In some embodiments, each first and second semiconductor layer 106, 108 has a thickness in a range between about 3 nm and about 30 nm, for example about 5 nm and about 10 nm. Each second semiconductor layer 108 may have a thickness that is equal, less, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanosheet channels needed for each FET of the semiconductor device structure 100. For example, the number of first semiconductor layers 106, which is the number of channels, may be between 2 and 8.

Figure 2:
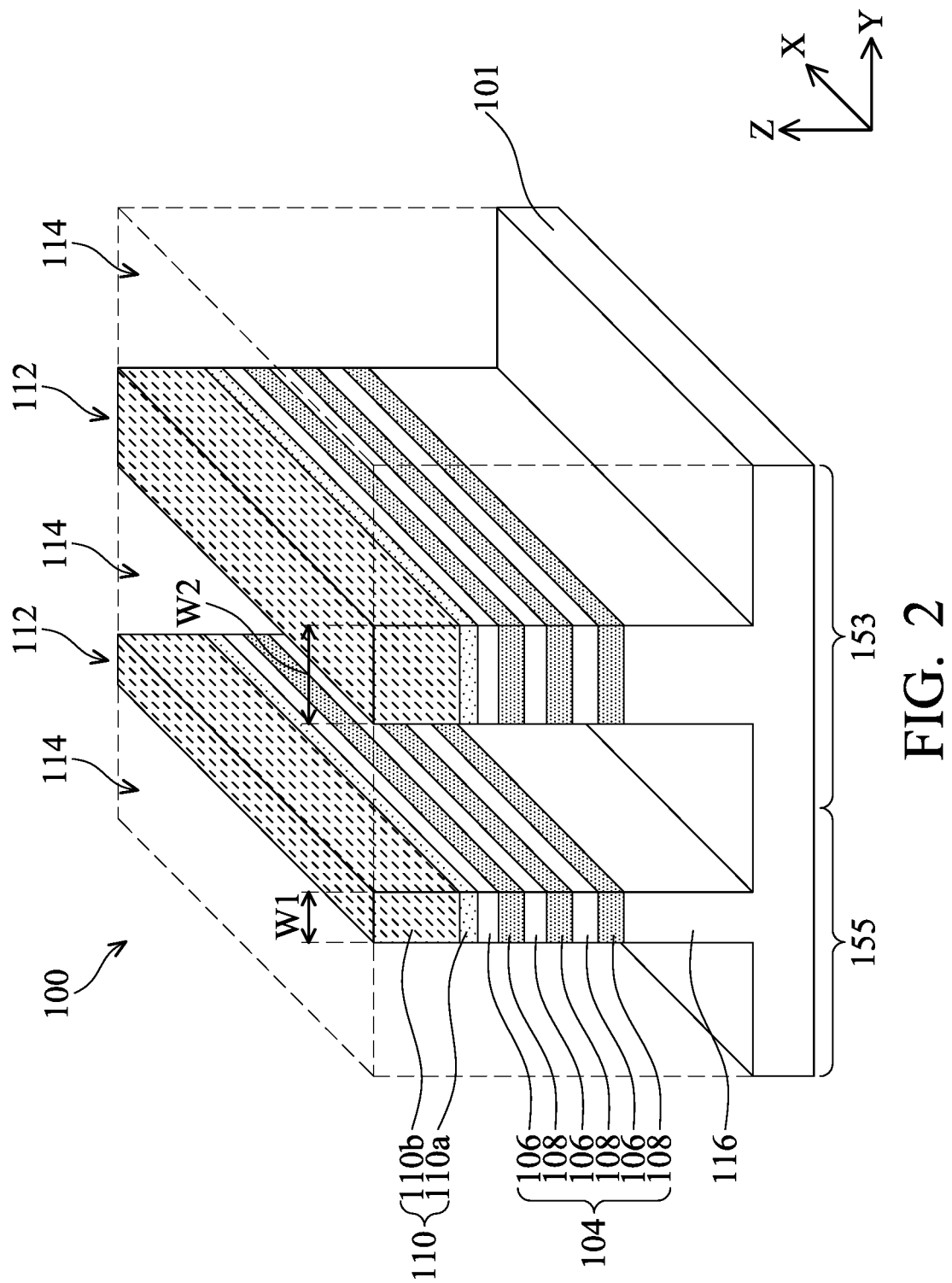

In FIG. 2, fin structures 112 are formed from the stack of semiconductor layers 104. Each fin structure 112 has an upper portion including the semiconductor layers 106, 108, a well portion 116 formed from the substrate 101, and a portion of a mask structure 110. The mask structure 110 is formed over the stack of semiconductor layers 104 prior to forming the fin structures 112. The mask structure 110 may include a pad layer 110a and a hard mask 110b. The pad layer 110a may be an oxygen-containing layer, such as a $SiO_2$ layer, or a nitrogen-containing layer, such as $Si_3N_4$. The mask structure 110 may be formed by any suitable deposition process, such as chemical vapor deposition (CVD) process.

The fin structures 112 may be fabricated using suitable processes including photolithography and etch processes. In some embodiments, the photolithography process may include forming a photoresist layer (not shown) over the mask structure 110, exposing the resist to a pattern, performing post-exposure bake processes, and developing the resist to form a patterned resist. The patterned resist may then be used to protect regions of the substrate 101, and layers formed thereupon, while an etch process forms trenches 114 in unprotected regions through the mask structure 110, the stack of semiconductor layers 104, and into the substrate 101, thereby leaving the extending fin structures 112. The trenches 114 may be etched using a dry etch (e.g., RIE), a wet etch, and/or combination thereof. While two fin structures 112 are shown, the number of the fin structures is not limited to two.

In some embodiments, the fin structures 112 may be fabricated so that the fin structures 112 at the region 155 (e.g., P-type region) have a width W1, and the fin structures 112 at the region 153 (e.g., N-type region) have a width W2 greater than the width W1. Since holes are subjected to stronger atomic force pulled by the nucleus than the electrons residing in the higher shells or farther shells, the mobility of electrons in a semiconductor is greater than that of holes. Having the fin structures 112 at the P-type region formed with a lesser width W1 (i.e., shorter channel length) than the width W2 of the fin structures 112 at the N-type region can increase the mobility of holes or compensate for lower mobility of holes in the fin structures 112 at the P-type region. In various embodiments, the ratio of W1:W2 may be about 1:1.5 to 1:3, for example about 1:2 to about 1:2.5.

Figure 3:
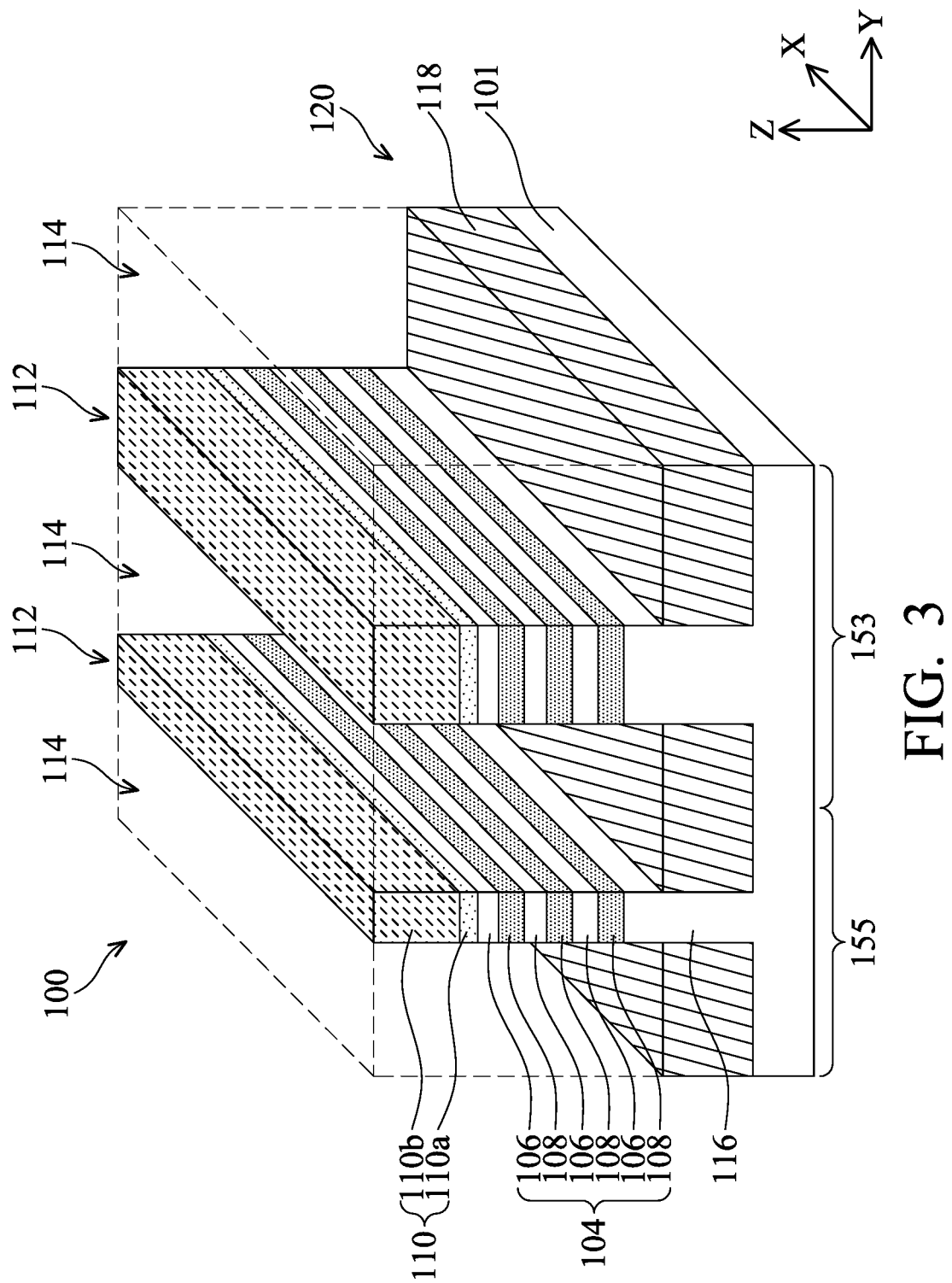

In FIG. 3, after the fin structures 112 are formed, an insulating material 118 is formed in the trenches 114 between the fin structures 112. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed to expose the top of the fin structures 112. The insulating material 118 may be made of silicon oxide, silicon nitride, silicon oxynitride (SiON), SiOCN, SiCN, fluorine-doped silicate glass (FSG), a low-k dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Next, the insulating material 118 is recessed to form an isolation region 120. The recess of the insulating material 118 exposes portions of the fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116.

Figure 4:
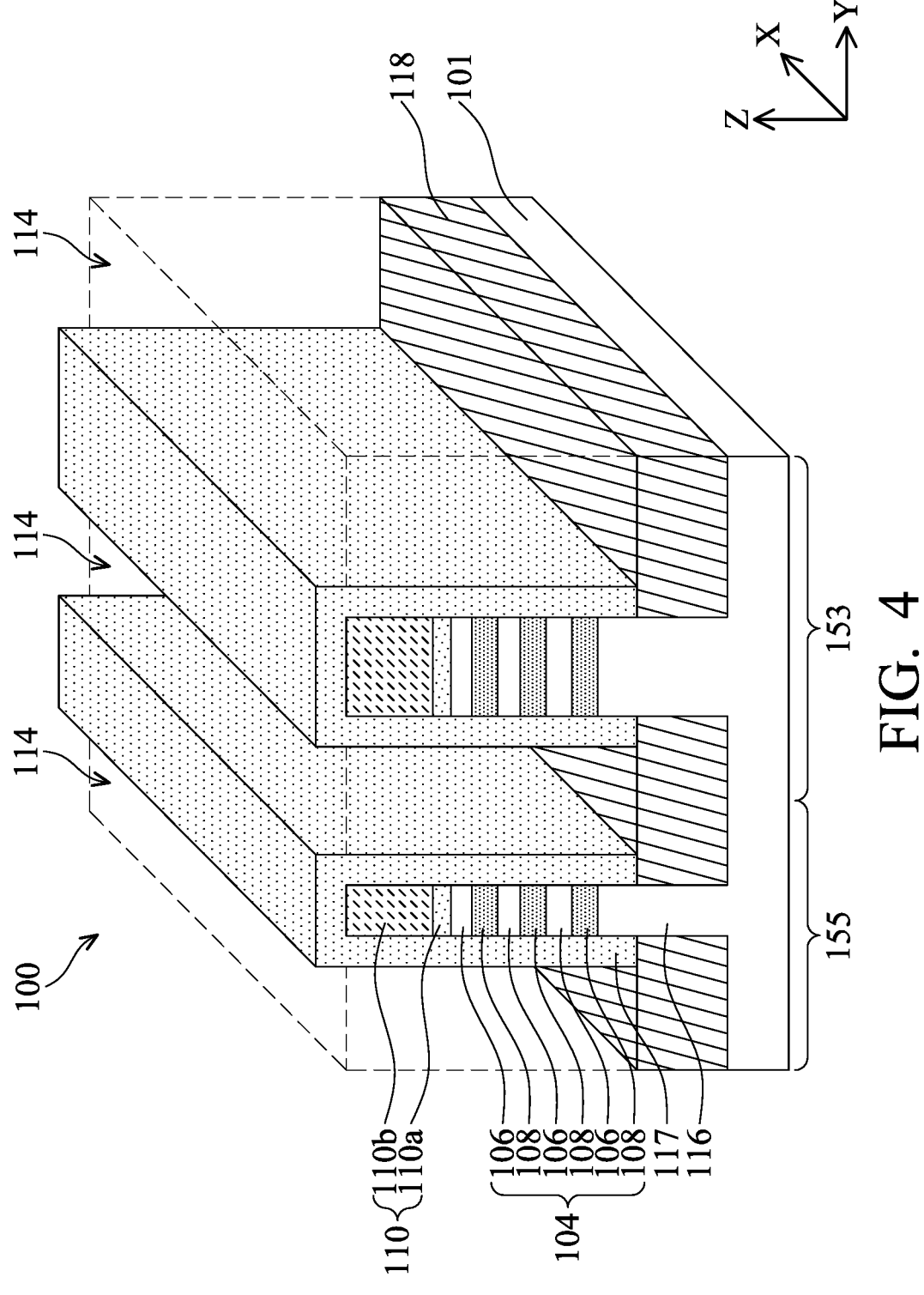

In FIG. 4, a cladding layer 117 is formed by an epitaxial process over exposed portion of the fin structures 112. In some embodiments, a semiconductor liner (not shown) may be first formed over the fin structures 112, and the cladding layer 117 is then formed over the semiconductor liner. The semiconductor liner may be diffused into the cladding layer 117 during the formation of the cladding layer 117. In either case, the cladding layer 117 is in contact with the stack of semiconductor layers 104. In some embodiments, the cladding layer 117 and the second semiconductor layers 108 include the same material having the same etch selectivity. For example, the cladding layer 117 and the second semiconductor layers 108 may be or include SiGe. The cladding layer 117 and the second semiconductor layers 108 may be removed subsequently to create space for the gate electrode layer.

Figure 5:
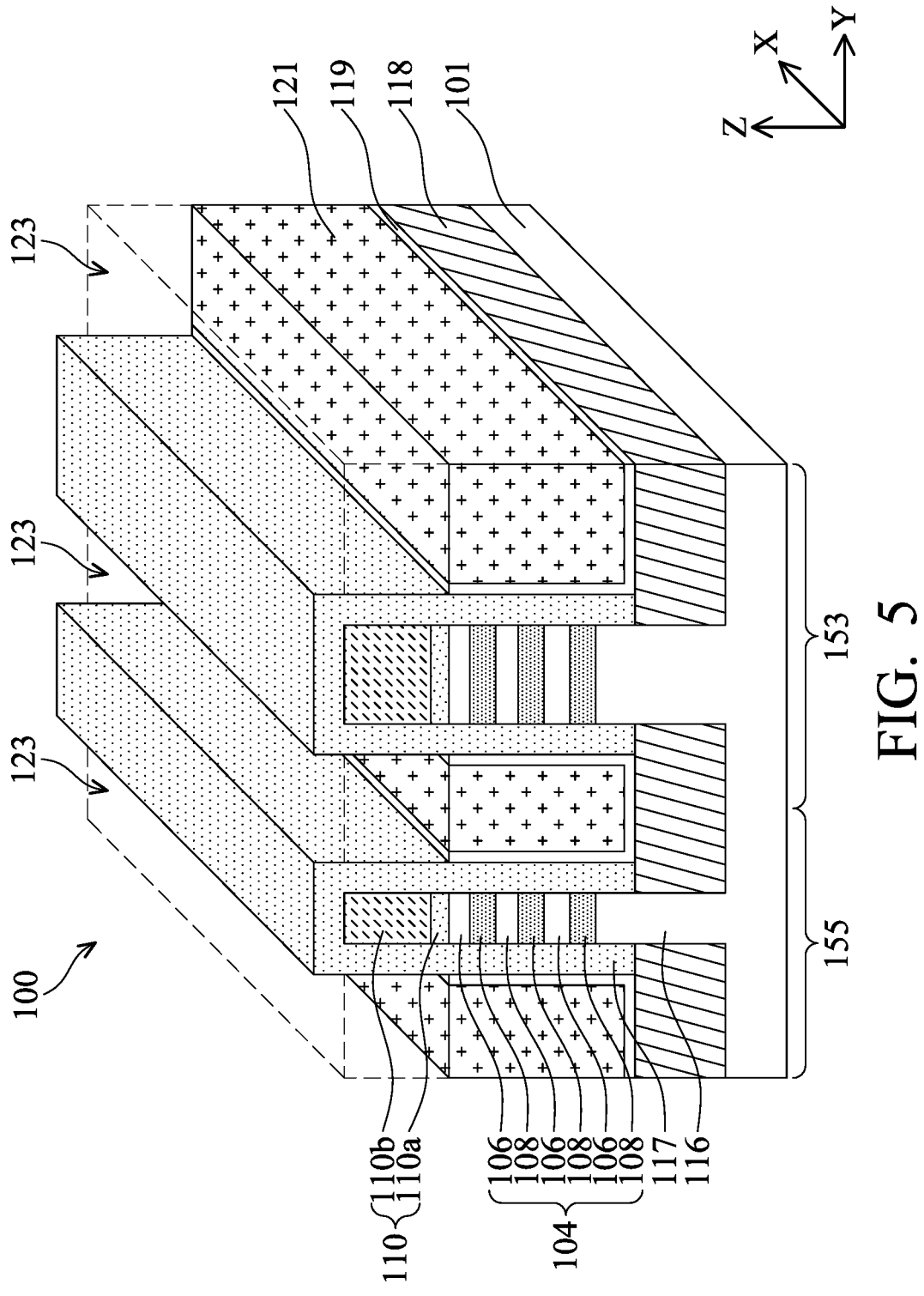

In FIG. 5, a liner 119 is formed on the cladding layer 117 and the top surface of the insulating material 118. The liner 119 may include a low-k dielectric material (e.g., a material having a k value lower than 7), such as $SiO_2$, SiN, SiCN, SiOC, or SiOCN. The liner 119 may be formed by a conformal process, such as an ALD process. A dielectric material 121 is then formed in the trenches 114 (FIG. 4) and on the liner 119. The dielectric material 121 may be an oxygen-containing material, such as an oxide, formed by FCVD. The oxygen-containing material may have a k value less than about 7, for example less than about 3. A planarization process, such as a CMP process, may be performed to remove portions of the liner 119 and the dielectric material 121 formed over the fin structures 112. The portion of the cladding layer 117 disposed on the hard mask 110b is exposed after the planarization process.

Figure 6:
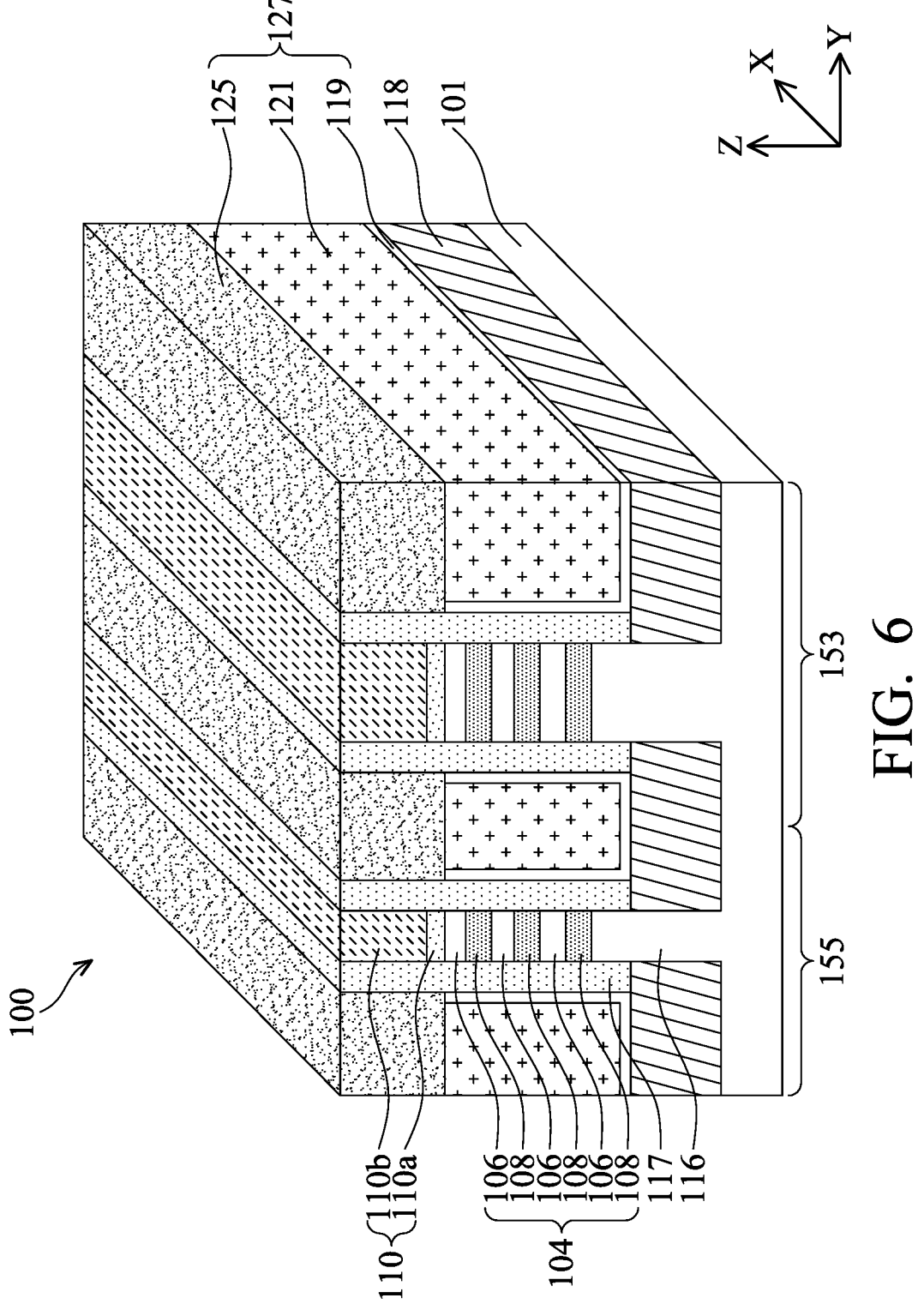

Next, the liner 119 and the dielectric material 121 are recessed using any suitable process to the level of the topmost first semiconductor layer 106. For example, in some embodiments, after the recess process, the top surfaces of the liner 119 and the dielectric material 121 may be recessed to level with a top surface of the topmost first semiconductor layer 106. The etch processes may be selective etch processes that do not remove the semiconductor material of the cladding layer 117. As a result of the recess process, trenches 123 are formed between the fin structures 112. The trenches 123 provide room for subsequent dielectric material 125 (FIG. 6). Alternatively, the dielectric material 125 may be optional and is not used. In such cases, the liner 119 and the dielectric material 121 are formed between the fin structures 112 without the recess process.

In FIG. 6, a dielectric material 125 is formed in the trenches 123 (FIG. 5) and on the dielectric material 121 and the liner 119. The dielectric material 125 may include SiN, SiC, SiCN, SION, SiCON, AlO, AlN, AlON, ZrO, ZrN, ZrAlO, HfO, or other suitable dielectric material. In some embodiments, the dielectric material 125 includes a high-k dielectric material (e.g., a material having a k value greater than 7). The dielectric material 125 may be formed by any suitable process, such as a CVD, PECVD, FCVD, or ALD process. A planarization process, such as a CMP process, is performed until the hard mask 110*b* of the mask structure 110 is exposed. The planarization process removes portions of the dielectric material 125 and the cladding layer 117 disposed over the mask structure 110. The liner 119, the dielectric material 121, and the dielectric material 125 together may be referred to as a dielectric feature 127 or a hybrid fin. The dielectric feature 127 serves as a dielectric fin that separates subsequent source/drain (S/D) epitaxial features and adjacent gate electrode layers. In some embodiments, the dielectric material 125 is omitted. In such cases, the hybrid fin includes only the liner 119 and the dielectric material 121, which may be advantageous in some applications due to reduced defect issues that may otherwise occur if a high-k dielectric material were used for the dielectric material 125.

Figure 7:
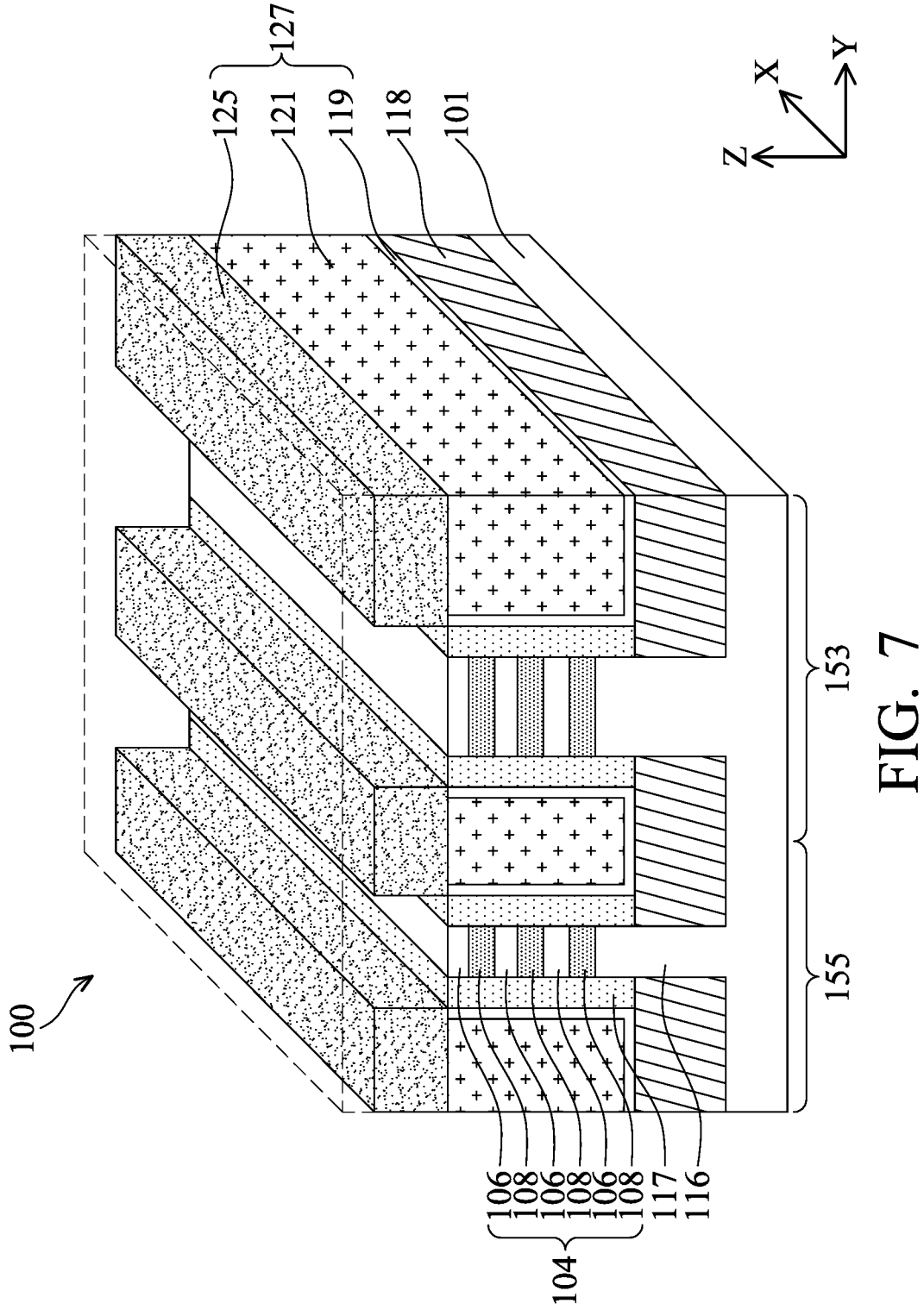

In FIG. 7, the cladding layers 117 are recessed, and the mask structures 110 are removed. A portion of the dielectric material 125 may also be removed as a result of the removal of the cladding layers 117. The recess of the cladding layers 117 may be performed by any suitable process, such as dry etch, wet etch, or a combination thereof. The recess process may be controlled so that the remaining cladding layers 117 are substantially at the same level as the top surface of the topmost first semiconductor layer 106 in the stack of semiconductor layers 104. The removal of the mask structures 110 may be performed by any suitable process, such as dry etch, wet etch, or a combination thereof.

Figure 8:
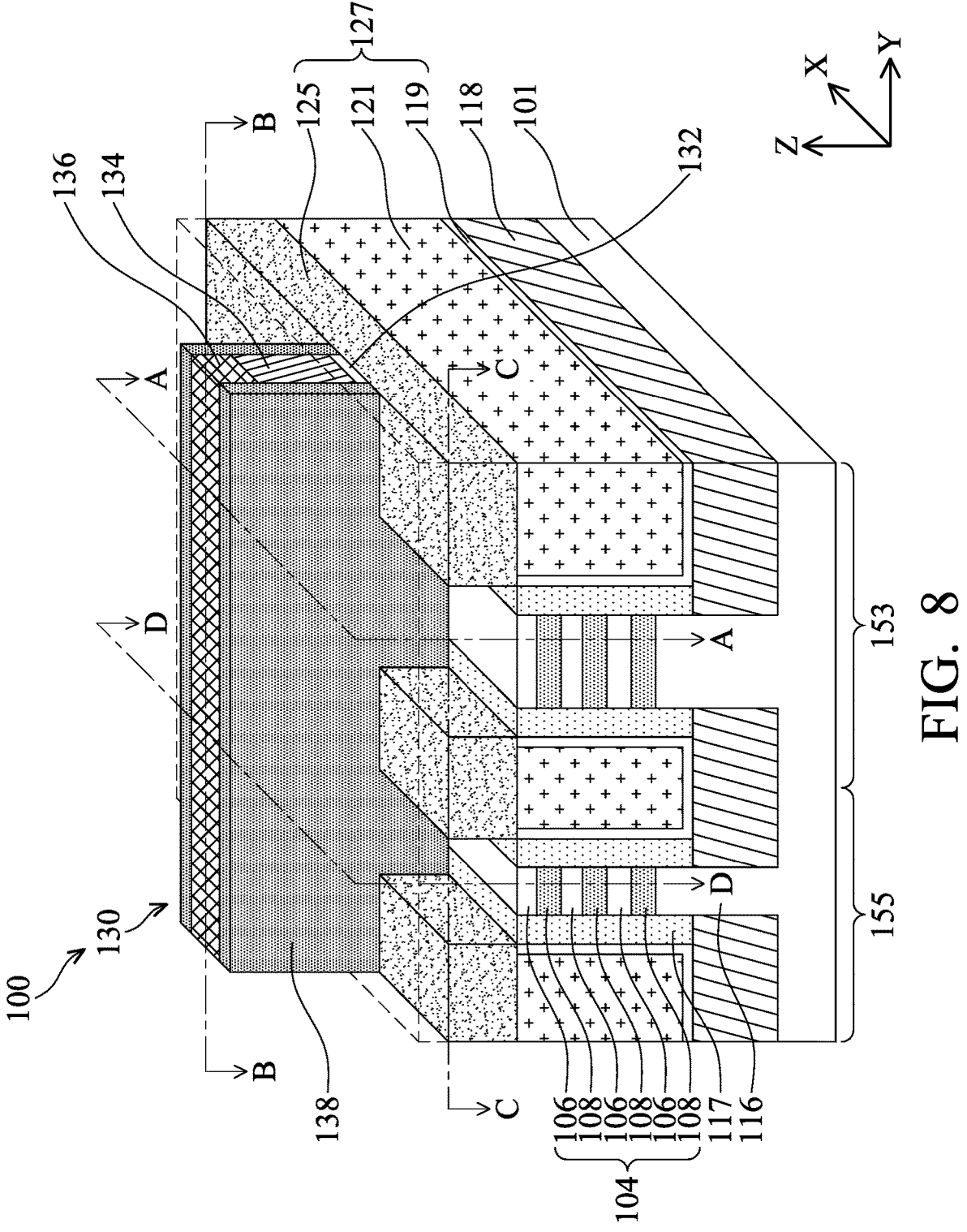

In FIG. 8, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof.

By patterning the sacrificial gate structure 130, the stacks of semiconductor layers 104 of the fin structures 112 are partially exposed on opposite sides of the sacrificial gate structure 130. The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. While one sacrificial gate structure 130 is shown, two or more sacrificial gate structures 130 may be arranged along the X direction in some embodiments.

Next, gate spacers 138 are formed on sidewalls of the sacrificial gate structures 130. The gate spacers 138 may be formed by first depositing a conformal layer that is subsequently etched back to form sidewall gate spacers 138. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fin structures 112, the cladding layer 117, the dielectric material 125, leaving the gate spacers 138 on the vertical surfaces, such as the sidewalls of sacrificial gate structures 130. The gate spacer 138 may be made of a dielectric material such as silicon oxide, silicon nitride, silicon carbide, silicon oxynitride, SiCN, silicon oxycarbide, SiOCN, and/or combinations thereof.

FIGS. 9A-15A are cross-sectional side views of various stages of manufacturing the semiconductor device structure 100 taken along cross-section A-A of FIG. 8, in accordance with some embodiments. FIGS. 9B-15B are cross-sectional side views of various stages of manufacturing the semiconductor device structure 100 taken along cross-section B-B of FIG. 8, in accordance with some embodiments. FIGS. 9C-15C are cross-sectional side views of various stages of manufacturing the semiconductor device structure 100 taken along cross-section C-C of FIG. 8, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the source/drain region (e.g., epitaxial S/D features 146 shown in FIG. 11C) along the Y-direction.

Figures 9A, 9B, 9C:
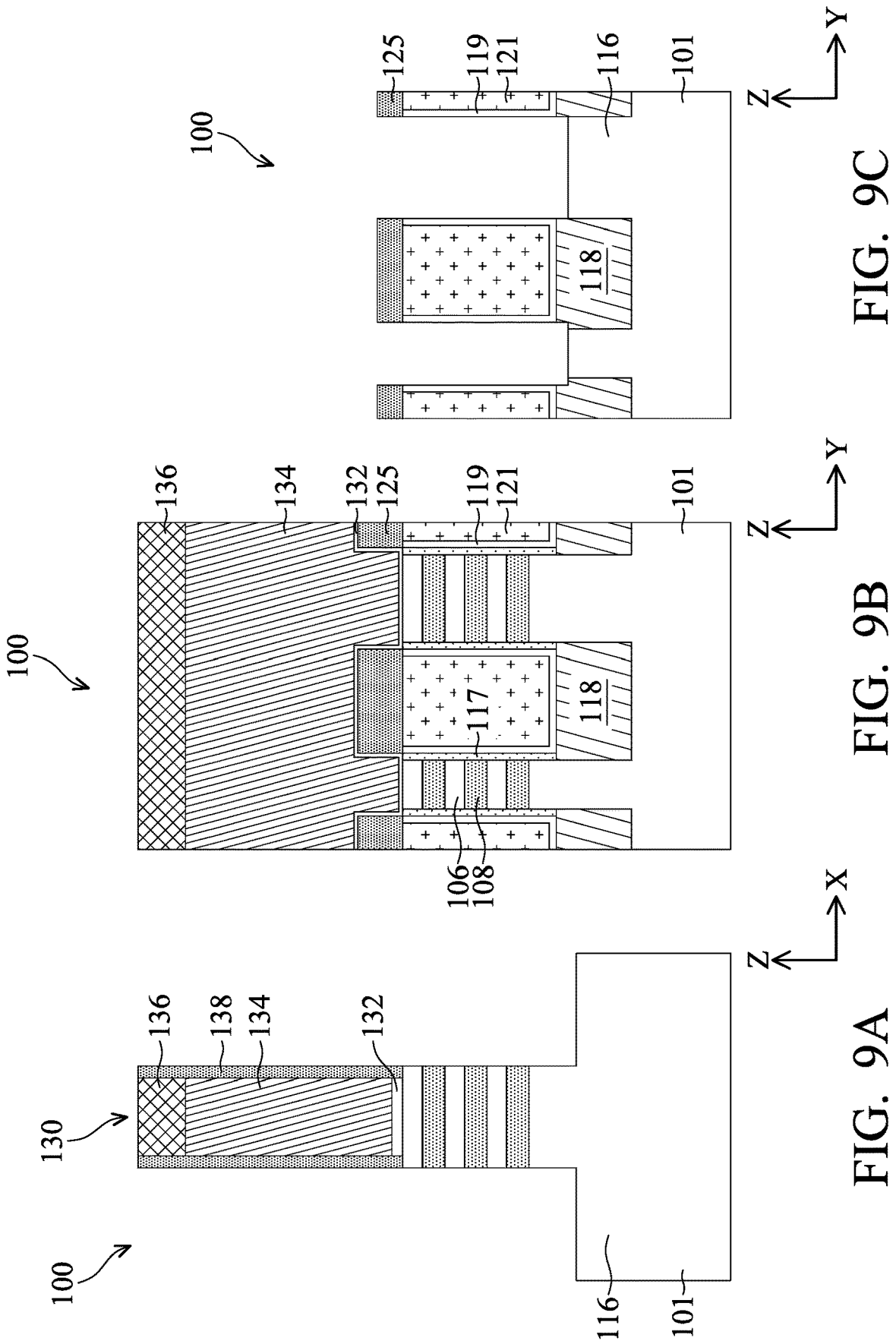

In FIGS. 9A-9C, exposed portions of the fin structures 112, exposed portions of the cladding layers 117, and exposed portions of the dielectric material 125 not covered by the sacrificial gate structures 130 and the gate spacers 138 are selectively recessed by using one or more suitable etch processes, such as dry etch, wet etch, or a combination thereof. In some embodiments, exposed portions of the stacks of semiconductor layers 104 of the fin structures 112 are removed, exposing portions of the well portions 116. As shown in FIG. 9A, the exposed portions of the fin structures 112 are recessed to a level at or slightly below the bottom surface of the second semiconductor layer 108 in contact with the well portion 116 of the substrate 101. The recess processes may include an etch process that recesses the exposed portions of the fin structures 112 and the exposed portions of the cladding layers 117.

Figures 10A, 10B, 10C:
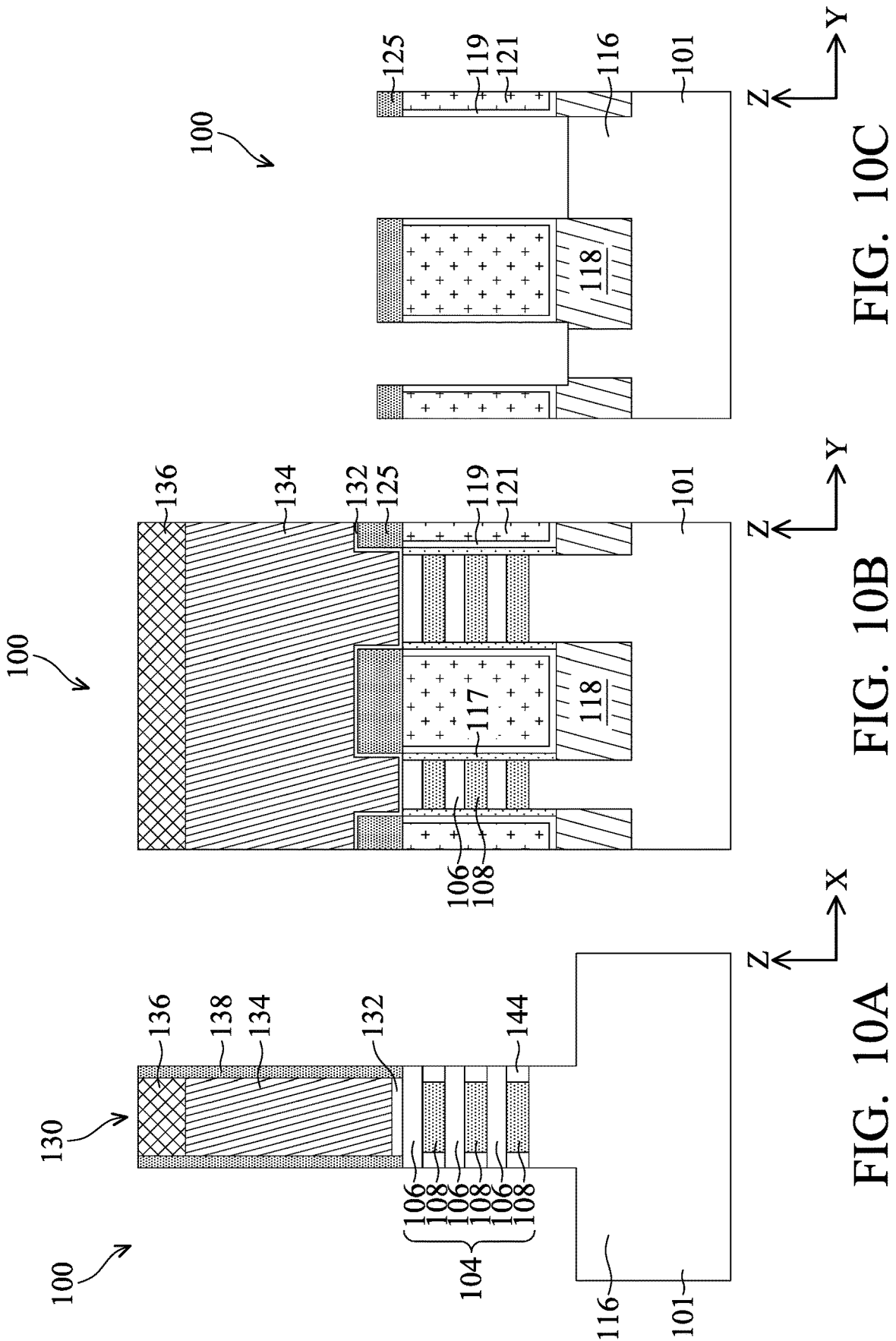

In FIGS. 10A-10C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figures 11A, 11B, 11C:
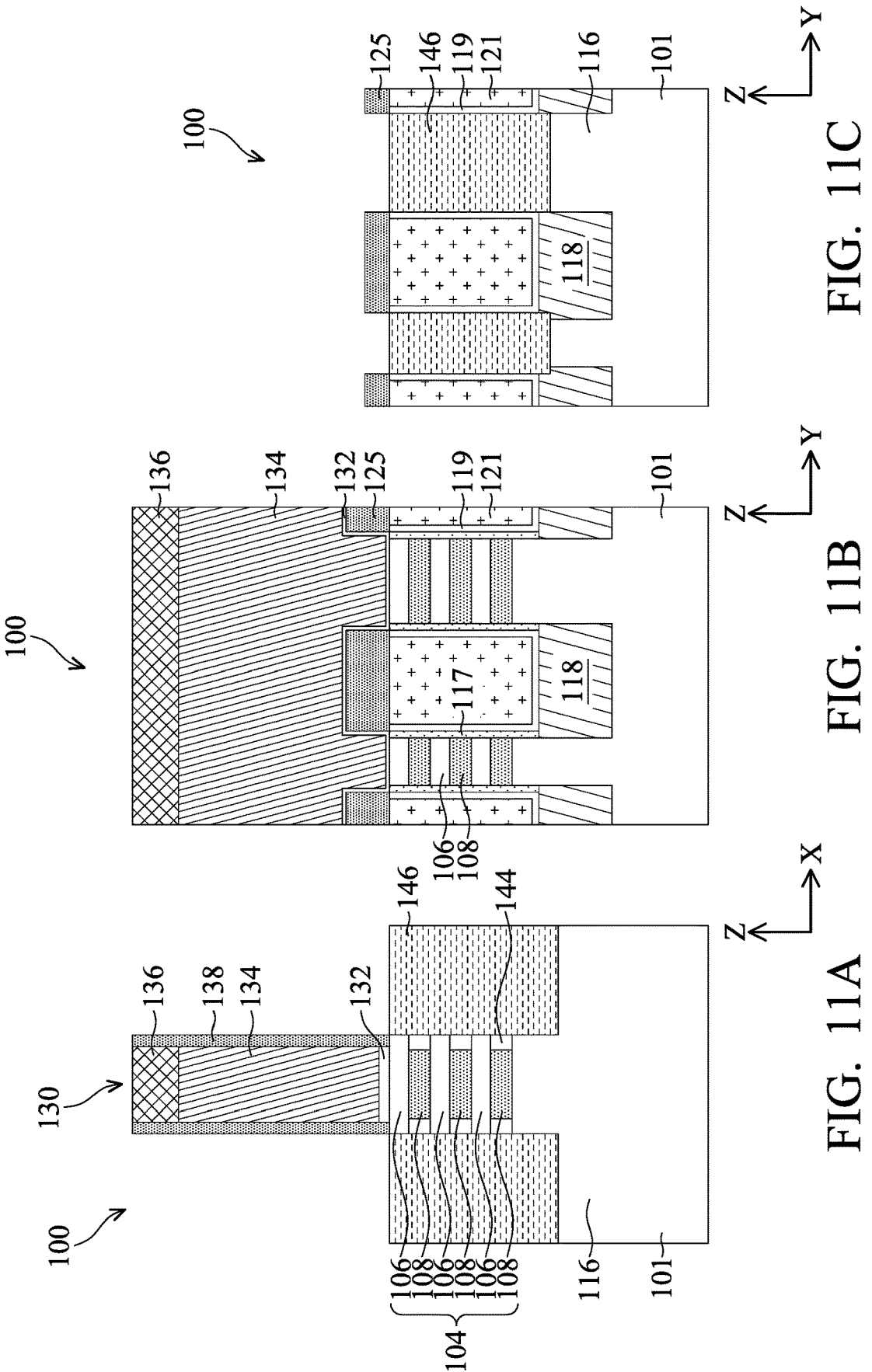

In FIGS. 11A-11C, epitaxial S/D features 146 are formed on the well portion 116 of the fin structures 112. The epitaxial S/D feature 146 may include one or more layers of Si, SiP, SiC and SiCP for an N-type FET or Si, SiGe, Ge for a P-type FET. The epitaxial S/D features 146 may grow both vertically and horizontally to form facets, which may correspond to crystalline planes of the material used for the substrate 101. The epitaxial S/D features 146 are formed by an epitaxial growth method using CVD, ALD or MBE. The epitaxial S/D features 146 are in contact with the first semiconductor layers 106 and dielectric spacers 144. The epitaxial S/D features 146 may be the S/D regions. For example, one of a pair of epitaxial S/D features 146 located on one side of the sacrificial gate structures 130 can be a source region, and the other of the pair of epitaxial S/D features 146 located on the other side of the sacrificial gate structures 130 can be a drain region. A pair of epitaxial S/D features 146 includes a source epitaxial feature 146 and a drain epitaxial feature 146 connected by the channels (i.e., the first semiconductor layers 106). The source epitaxial feature 146 and the drain epitaxial feature 146 may be referred to as a source region and a drain region, individually or collectively dependent upon the context. In this disclosure, a source and a drain are interchangeably used, and the structures thereof are substantially the same.

Figures 12A, 12B, 12C:
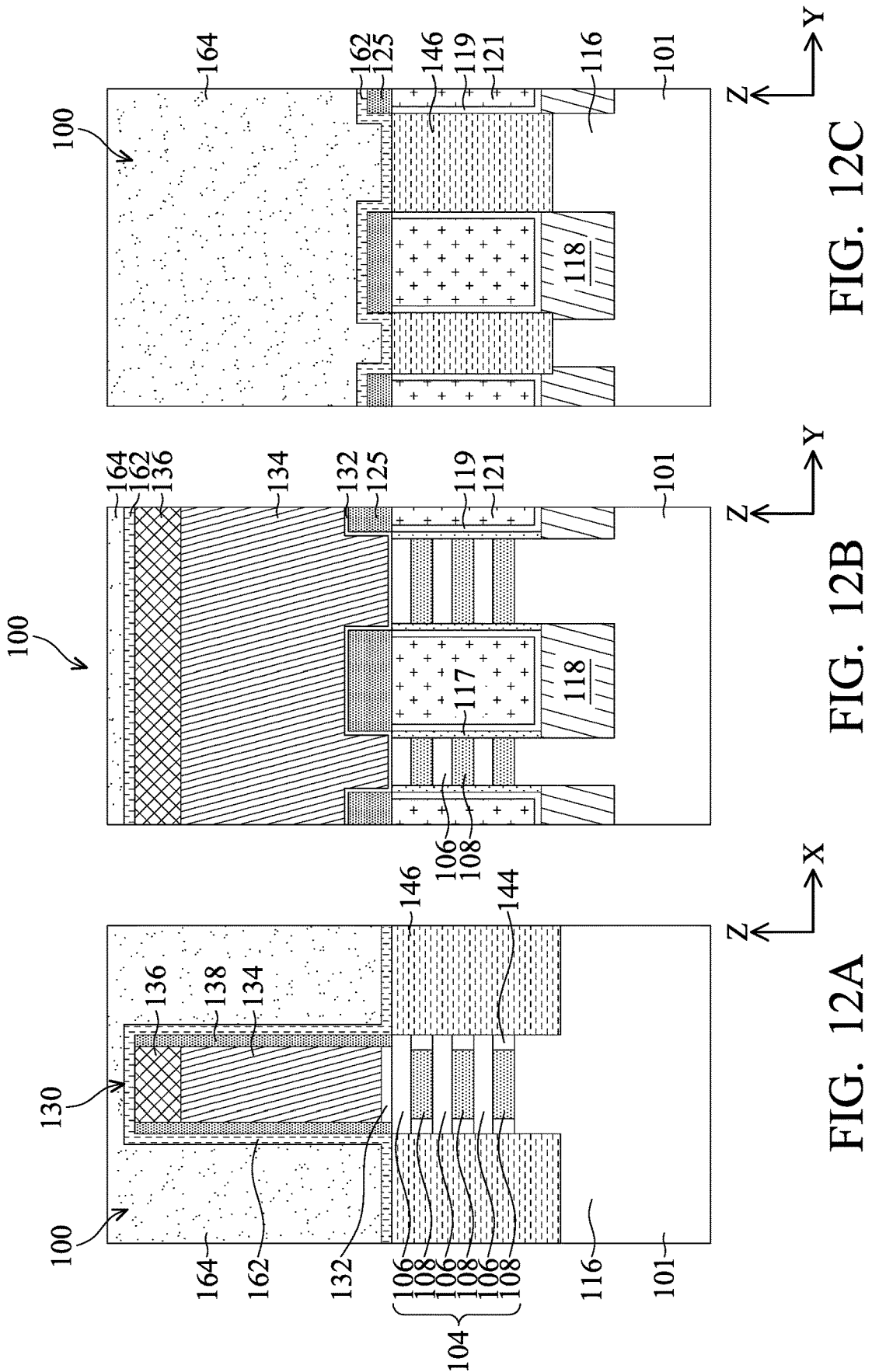

In FIGS. 12A-12C, after formation of the epitaxial S/D features 146, a contact etch stop layer (CESL) 162 is conformally formed on the exposed surfaces of the semiconductor device structure 100. The CESL 162 covers the epitaxial S/D features 146, the gate spacers 138, the dielectric material 125, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials comprising Si, O, C, and/or H. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figures 13A, 13B, 13C:
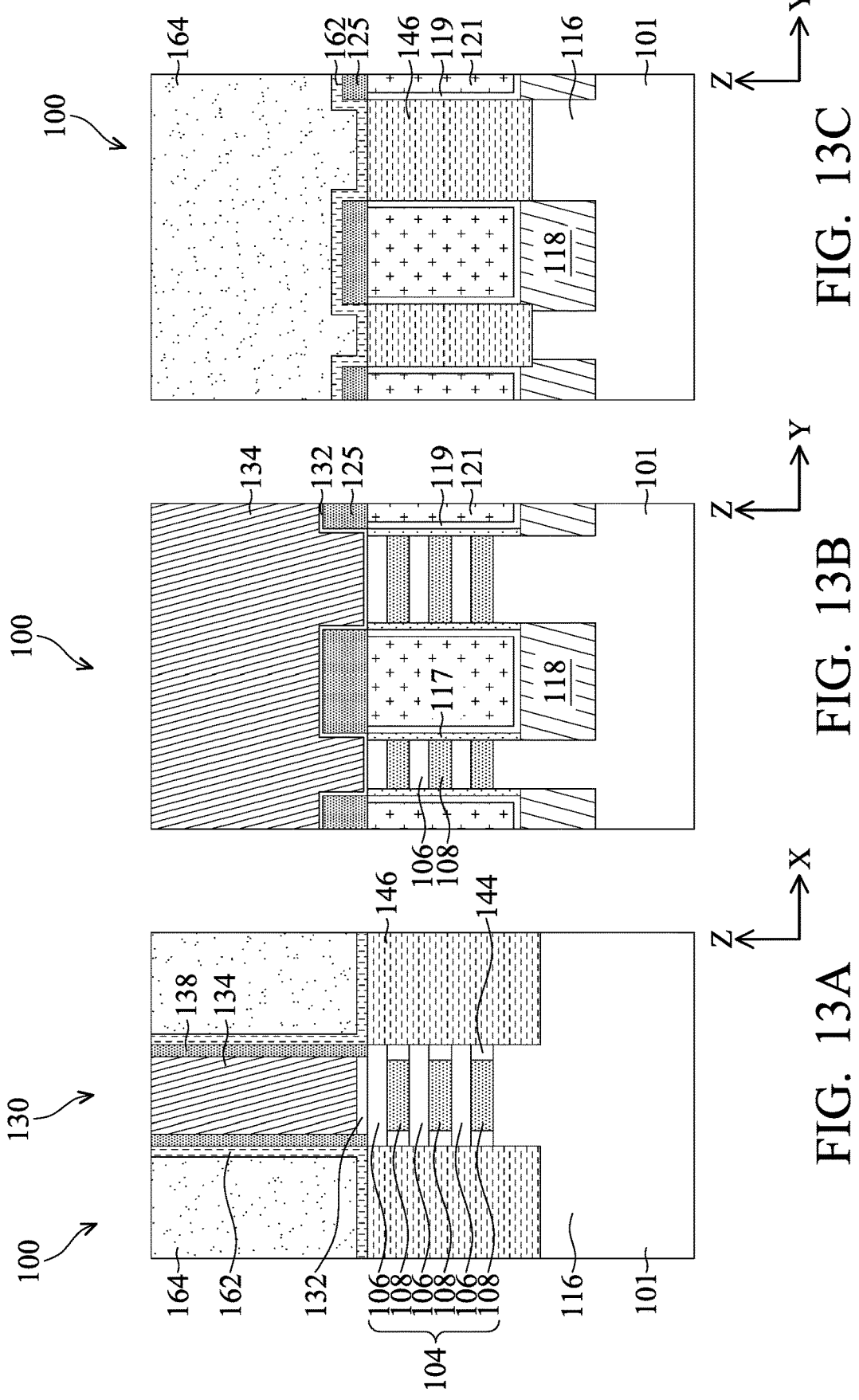

In FIGS. 13A-13C, after the ILD layer 164 is formed, a planarization operation, such as CMP, is performed on the semiconductor device structure 100 to remove portions of the ILD layer 164, the CESL 162 and the mask layer 136 until the sacrificial gate electrode layer 134 is exposed.

Figures 14A, 14B, 14C:
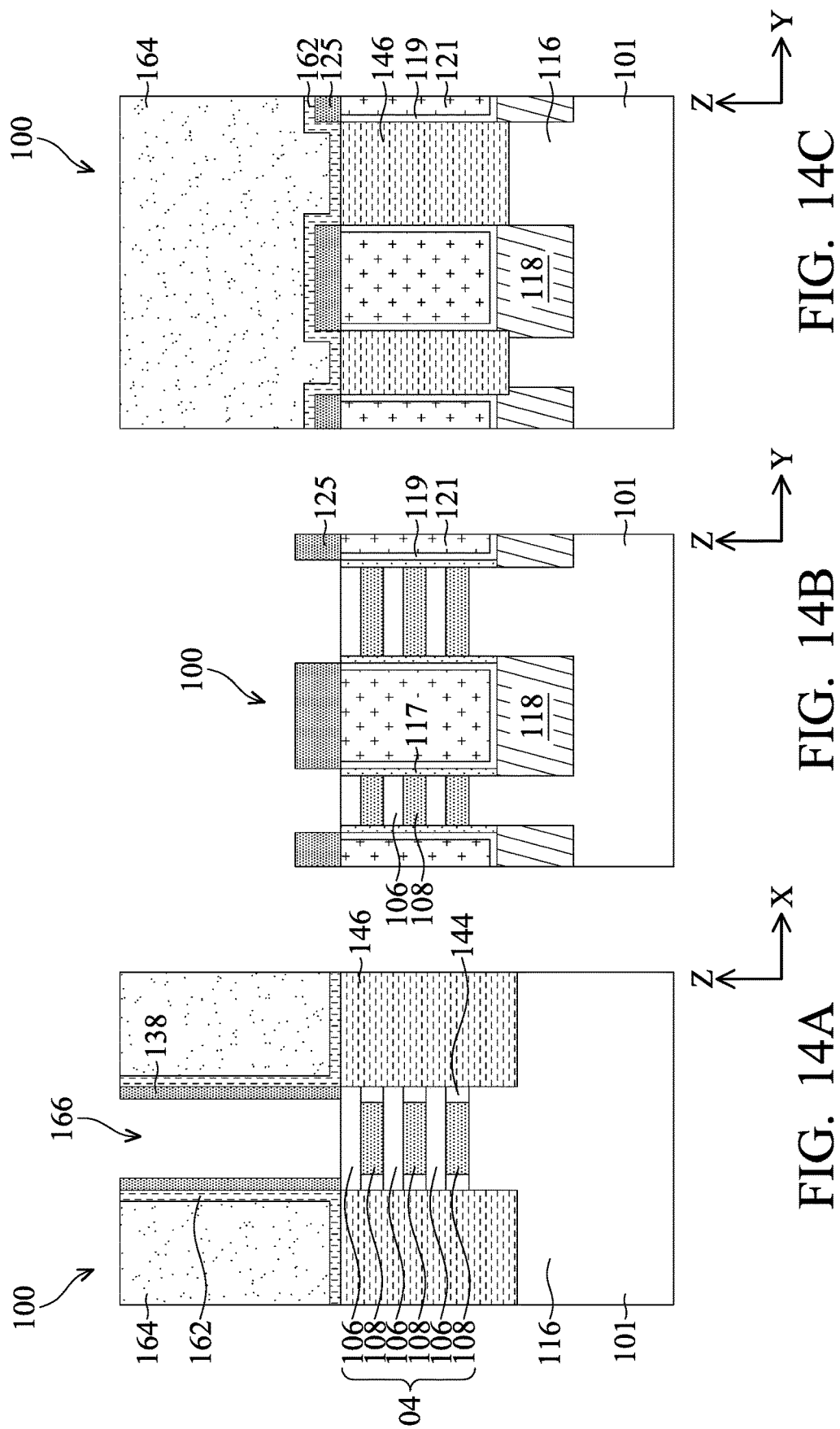

In FIGS. 14A-14C, the sacrificial gate structure 130 is removed. The removal of the sacrificial gate structure 130 forms a trench 166 in the regions where the sacrificial gate electrode layer 134 and the sacrificial gate dielectric layer 132 were removed. The trench 166 exposes portions of the cladding layer 117 and the top of the first semiconductor layer 106. The ILD layer 164 protects the epitaxial S/D features 146 during the removal of the sacrificial gate structure 130. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, and the CESL 162. In some embodiments, the gate spacers 138 may be recessed by the etchant used to remove the sacrificial gate electrode layer 134 and/or the sacrificial gate dielectric layer 132.

Figures 15A, 15B, 15C:
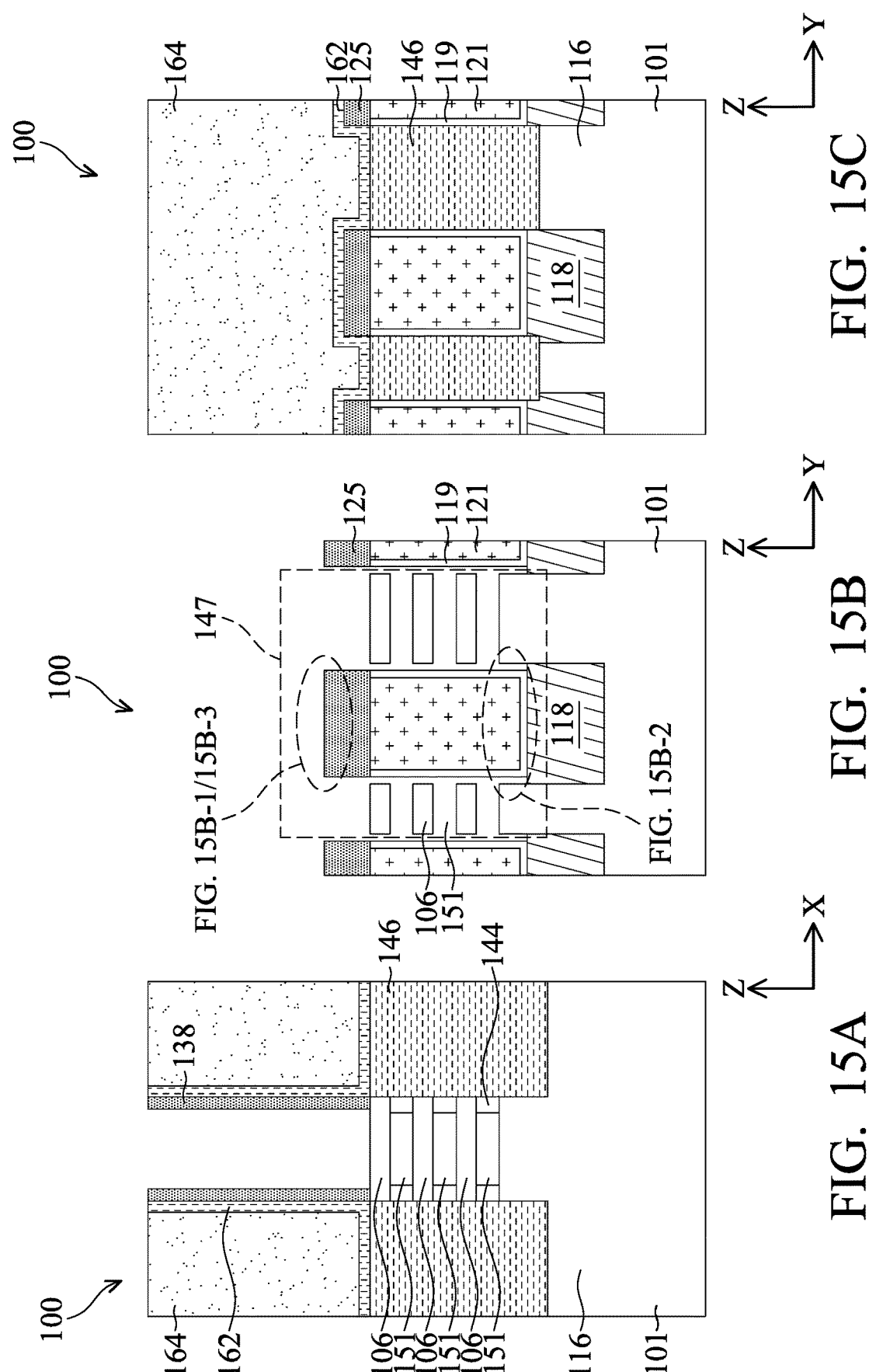
Figures 2, 15B:
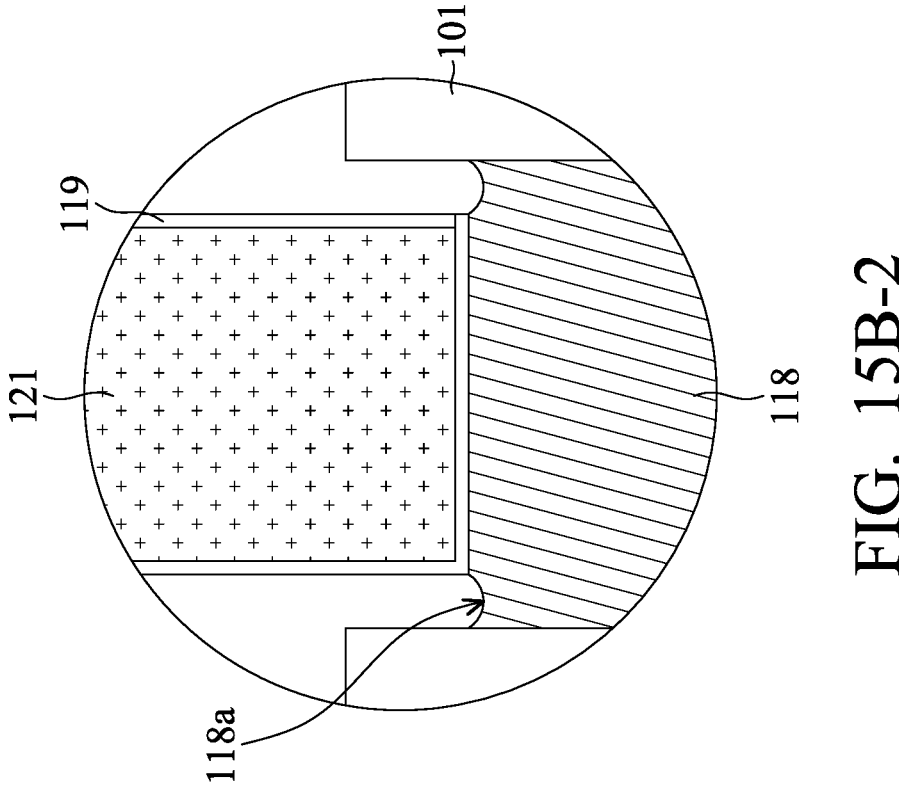
Figures 1, 15B:
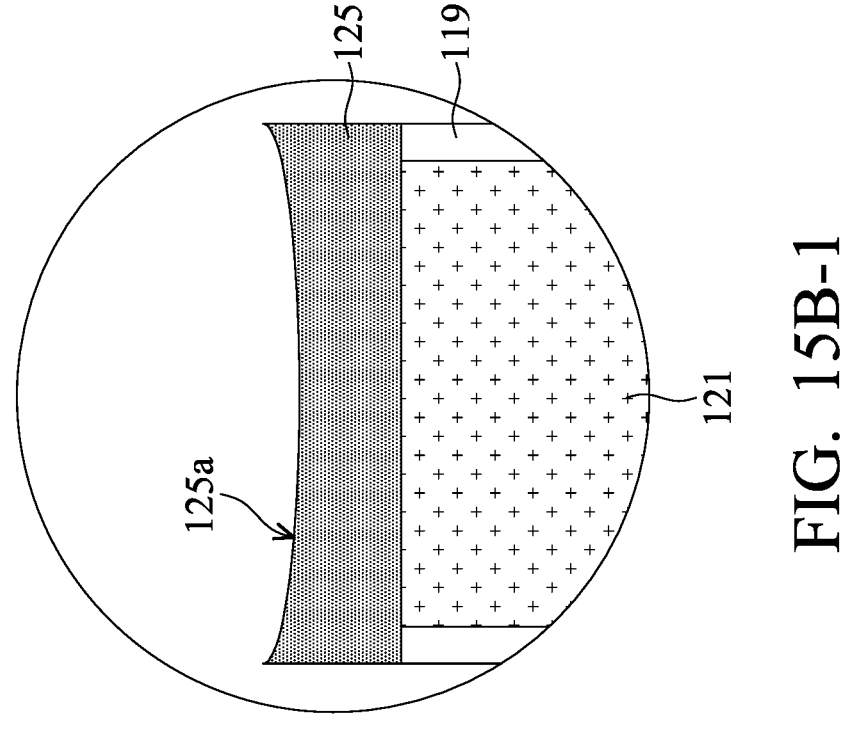
Figures 3, 15B:
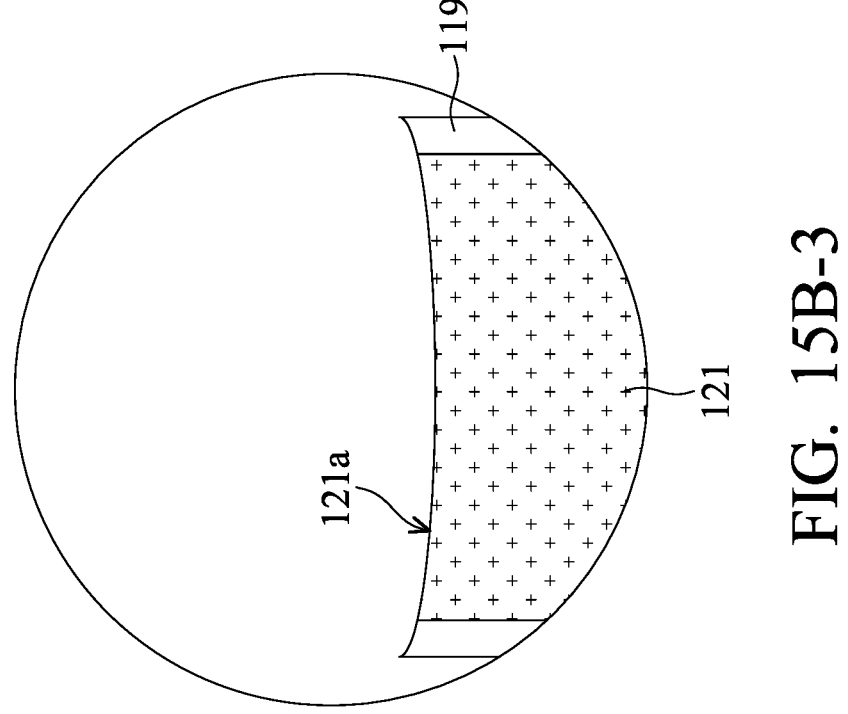

In FIGS. 15A-15C, the cladding layers 117 and the second semiconductor layers 108 are removed. The removal of the cladding layers 117 and the second semiconductor layers 108 exposes the dielectric spacers 144 and the first semiconductor layers 106. The removal process may be any suitable etch processes, such as dry etch, wet etch, or a combination thereof. The etch process may be a selective etch process that removes the cladding layers 117 (FIG. 14B) and the second semiconductor layers 108 but not the gate spacers 138, the CESL 162, the dielectric material 125, and the first semiconductor layers 106. As a result, openings 151 are formed around the first semiconductor layers 106, and the portion of the first semiconductor layers 106 not covered by the dielectric spacers 144 is exposed to the openings 151.

In some embodiments, which can be combined with any other embodiments of this disclosure, an optional plasma treatment is performed to remove etching residues or intermixed materials left from the removal of the cladding layers 117 and the second semiconductor layers 108. The plasma treatment may be an argon-based plasma, an oxygen-based plasma, or a combination thereof. In these embodiments, the top surface 125a of the dielectric material 125 and the top surface 118a of the insulating material 118 may be etched to have a curved profile. In some embodiments, the exposed top surface 125a of the dielectric material 125 and the exposed top surface 118a of the insulating material 118 are etched to have a concave surface profile, as shown in FIGS. 15B-1 and 15B-2, respectively. In cases where the dielectric material 125 is not used, exposed portions of the dielectric material 121 are etched to have a concave surface profile, such as the top surface 121a shown in FIG. 15B-3. While the top surfaces of the dielectric material 125 and the insulating material 118 are shown as a flat surface in this disclosure, it is contemplated that the curved surface profile as discussed here may apply.

Figure 16:
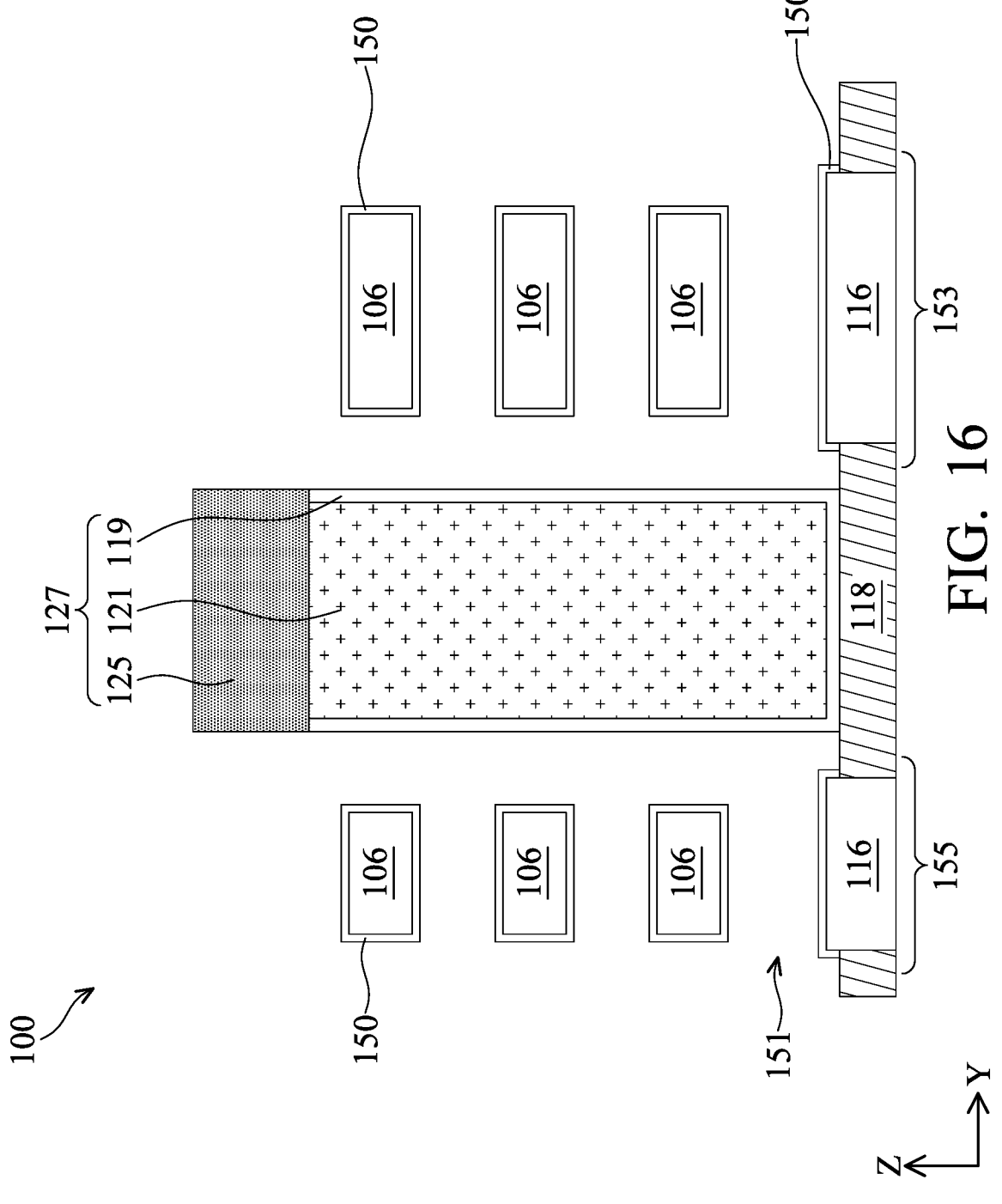
FIGS. 16-28 are enlarged views of a region of FIG. 15B showing various stages of manufacturing the semiconductor device structure, in accordance with some embodiments.

FIGS. 16-28 are enlarged views of a region 147 of FIG. 15B showing various stages of manufacturing the semiconductor device structure 100, in accordance with some embodiments. In FIG. 16, an interfacial layer (IL) 150 is formed to surround the exposed surfaces of the first semiconductor layers 106. In some embodiments, the IL 150 may also form on the well portion 116 of the substrate 101. The IL 150 may include or be made of an oxygen-containing material or a silicon-containing material, such as silicon oxide, silicon oxynitride, oxynitride, etc. In one embodiment, the IL 150 is silicon oxide. The IL 150 may be formed by oxidizing an outer portion of the first semiconductor layers 106 and an outer portion of the exposed well portion 116 of the substrate 101. That is, the outer portion of the first semiconductor layers 106 and the exposed well portion 116 of the substrate 101 is or part of the IL 150. The outer portion surrounds and is in contact with the first semiconductor layers 106 and the well portion 116 of the substrate 101 upon completion of the oxidation. In some embodiments, the IL 150 may be formed using an oxidation process such as thermal oxidation process, a rapid thermal oxidation (RTO) process, an in-situ stream generation (ISSG) process, or an enhanced in-situ stream generation (EISSG) process. In one example, the IL 150 is formed by subjecting the first semiconductor layers 106 and the well portion 116 of the substrate 101 to a rapid thermal anneal (RTA) in an oxygen-containing environment. The thermal oxidation may be performed at a temperature of about 600 degrees Celsius to about 1100 degrees Celsius, for a time span of about 10 seconds to about 30 seconds. The temperature and time span of the oxidation may contribute to the thickness of the IL 150. For example, higher temperatures and longer oxidation time spans may result in a thicker IL 150. Additionally or alternatively, the IL 150 may also be an oxide formed by CVD, ALD or any suitable conformal deposition technique. In either case, the IL 150 may have a thickness ranging from about 0.3 nm to about 1.5 nm.

Alternatively, the IL 150 may be formed by first subjecting the first semiconductor layers 106 and the exposed well portion 116 of the substrate 101 to a pre-clean process. The pre-clean process may be any suitable wet cleaning process such as an APM process, which includes at least water ($H_2O$), ammonium hydroxide ($NH_4OH$), and hydrogen peroxide ($H_2O_2$), a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof. The pre-cleaned first semiconductor layers 106 and the exposed well portion 116 of the substrate 101 may be further oxidized using the oxidation process above upon completion of the pre-clean process to form the IL 150.

Figure 17:
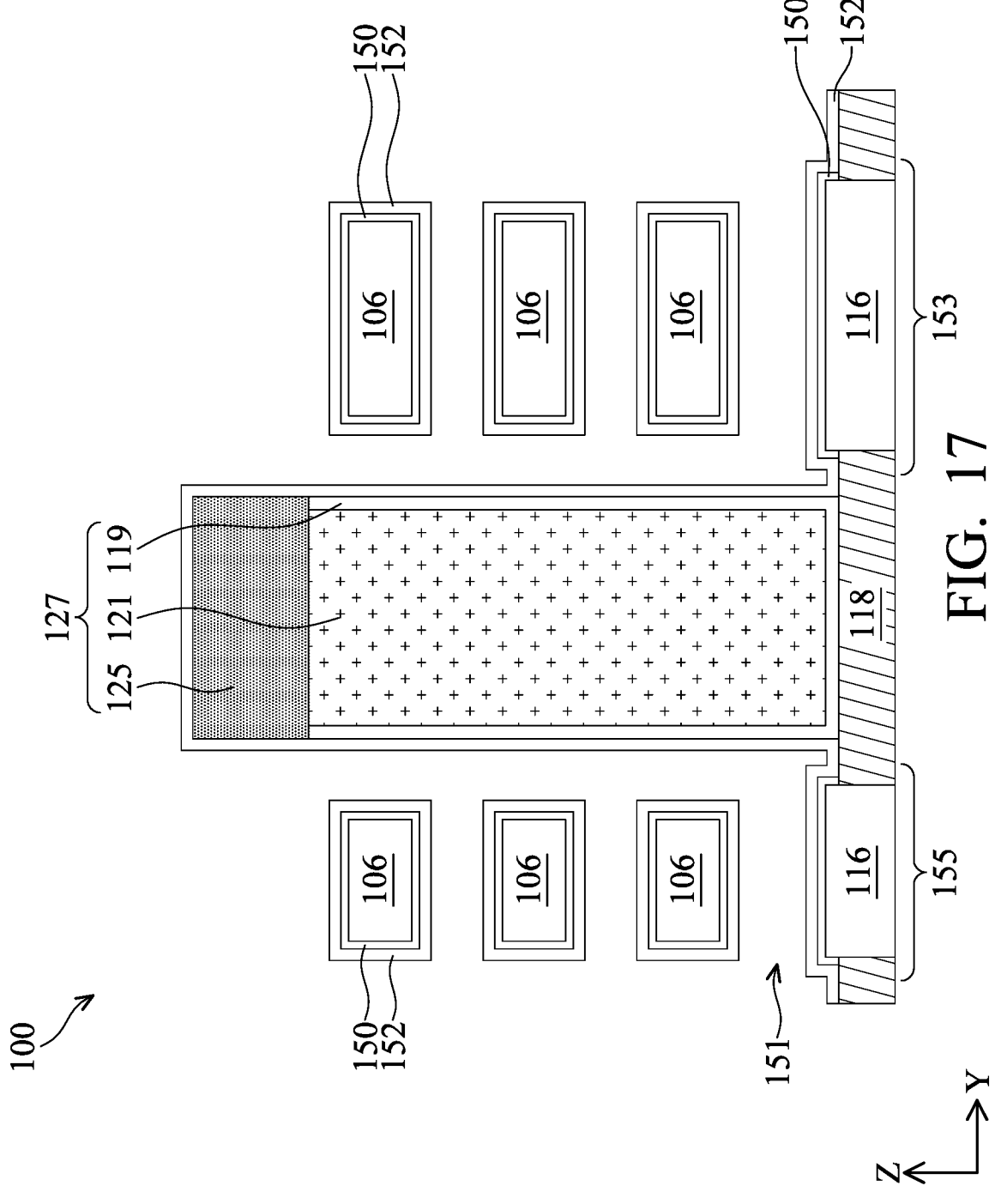

In FIG. 17, a first high-k (HK) dielectric layer 152 is formed on the exposed surfaces of the semiconductor device structure 100. In some embodiments, the first HK dielectric layer 152 is formed to wrap around and be in contact with the IL 150 over the first semiconductor layers 106. The first HK dielectric layer 152 also forms on and in contact with the exposed surfaces of the insulating material 118. The first HK dielectric layer 152 may include or made of hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. In one embodiment, the first HK dielectric layer 152 is $HfO_2$. The first HK dielectric layer 152 may be a conformal layer formed by a conformal process, such as an ALD process or a CVD process. The first HK dielectric layer 152 may have a thickness ranging from about 1.5 nm to about 6 nm.

Figure 18:
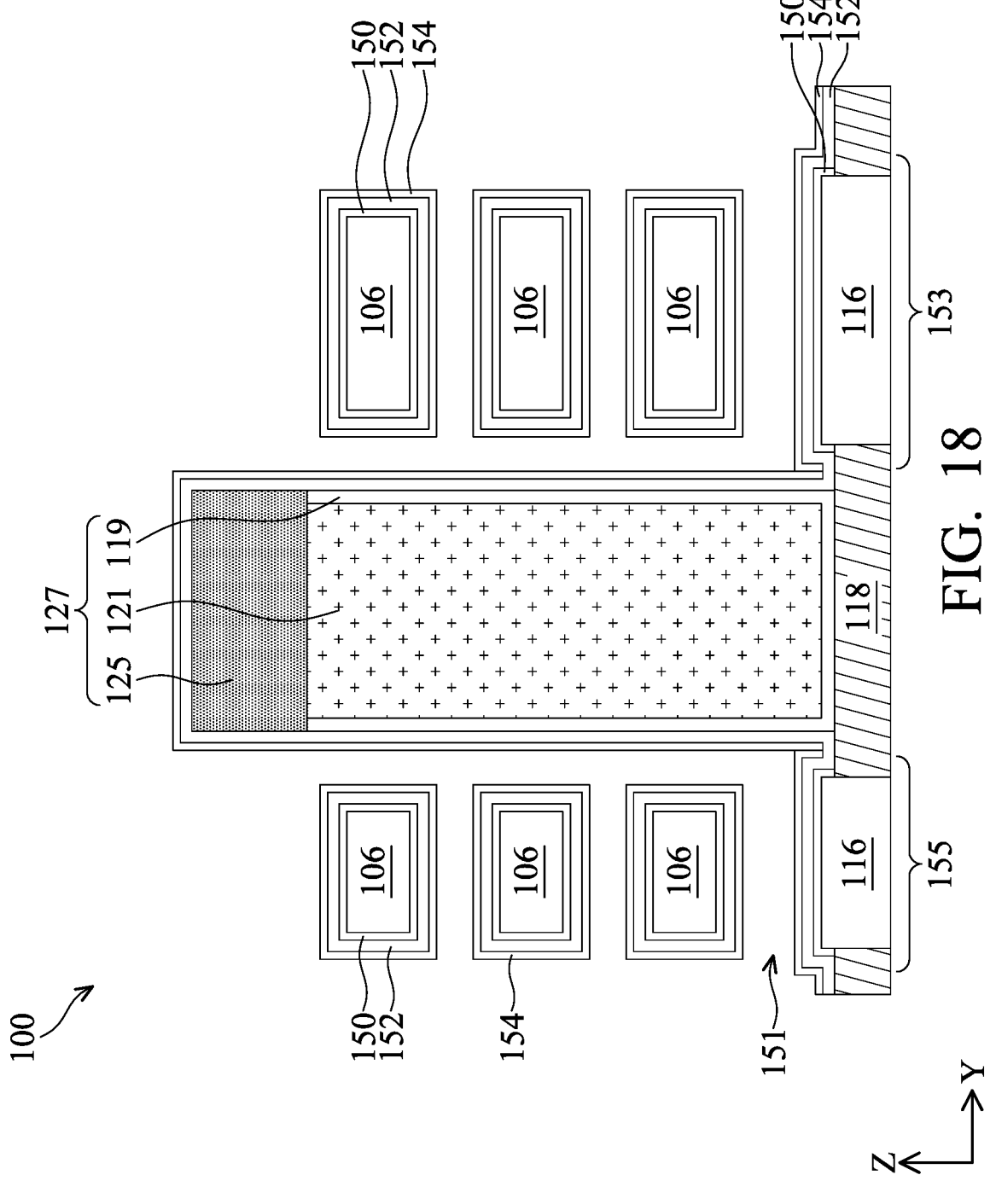

In FIG. 18, a first additive layer 154 is formed on the first HK dielectric layer 152. The first additive layer 154 surrounds the first semiconductor layers 106 and over the well portion 116 of the substrate 101. Depending on the conductivity type of the nanosheet transistor, the first additive layer 154 may include dopants having positive polarity or negative polarity. In the embodiment shown in FIG. 18, the nanosheet transistor at the region 153 is designated as an N-type FET and the nanosheet transistor at the region 155 is designated as a P-type FET. In such cases, the first additive layer 154 may include a material with dopants having a positive polarity. The first additive layer 154 functions as a source for the dopants to be introduced into the first HK dielectric layer 152 and the IL 150. As will be discussed in more detail below, the dopants (e.g., metal ions) from the first additive layer 154 can be controlled to be accumulated at and/or near the IL 150/first semiconductor layer 106 interface or IL 150/first HK dielectric layer 152 interface to help adjust a threshold voltage of subsequent N-type or P-type work function layers. As a result, the flat band voltage (VFB) of the nanosheet transistors at the regions 153, 155 can be tailored to meet different threshold voltage requirement. In various embodiments, the concentration of the dopants in the first additive layer 154 may range from about 10 ppm to about 400 ppm. Stated differently, the concentration of the dopants in the first additive layer 154 may be in a range of about $1E10^{17}$ atoms/$cm^{-3}$ to about $5E10^{21}$ atoms/$cm^{-3}$.

In some embodiments, the first additive layer 154 may include a material inherently having a positive polarity. Exemplary materials may include, but are not limited to, a zinc-containing material, an aluminum-containing material, a titanium-containing material, a germanium-containing material, a gallium-containing material, or the like. In some embodiments, the first additive layer 154 may further contain oxygen. In such cases, the first additive layer 154 may include, but are not limited to, zinc oxide (ZnO), aluminum oxide ($Al_2O_3$), titanium dioxide ($TiO_2$), germanium oxide ($GeO_2$), gallium oxide (GaO), or the like, or a combination of above mentioned. In one exemplary embodiment, the first additive layer 154 is ZnO. The first additive layer 154 can be formed by ALD, Atomic Layer Epitaxy (ALE), CVD, or any suitable conformal deposition technique. In some embodiments, the first additive layer 154 may have a thickness of about 0.1 nm to about 1.5 nm. Greater or lesser thickness is contemplated depending on the threshold voltage requirement of the devices.

Figure 19:
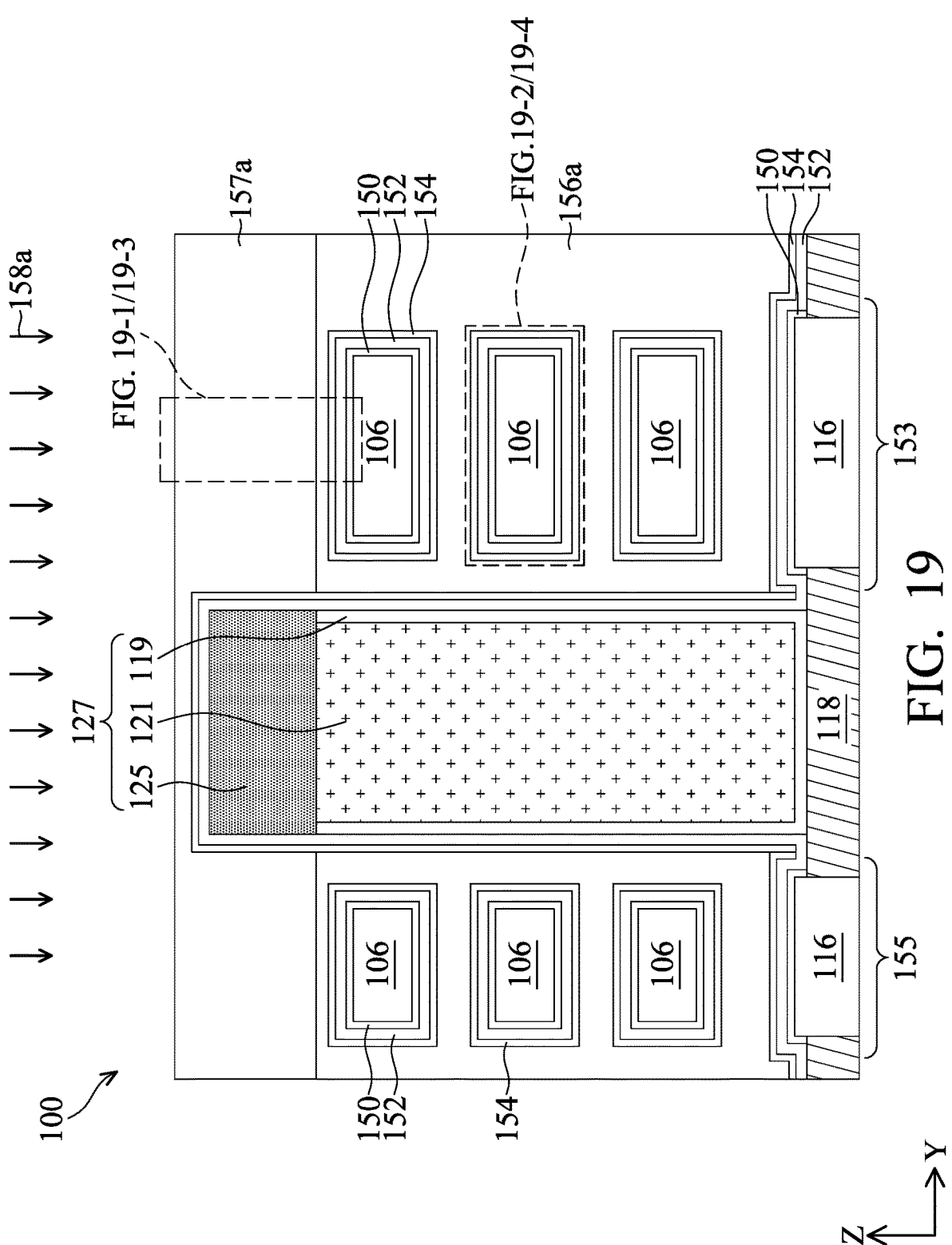
Figures 2, 19:
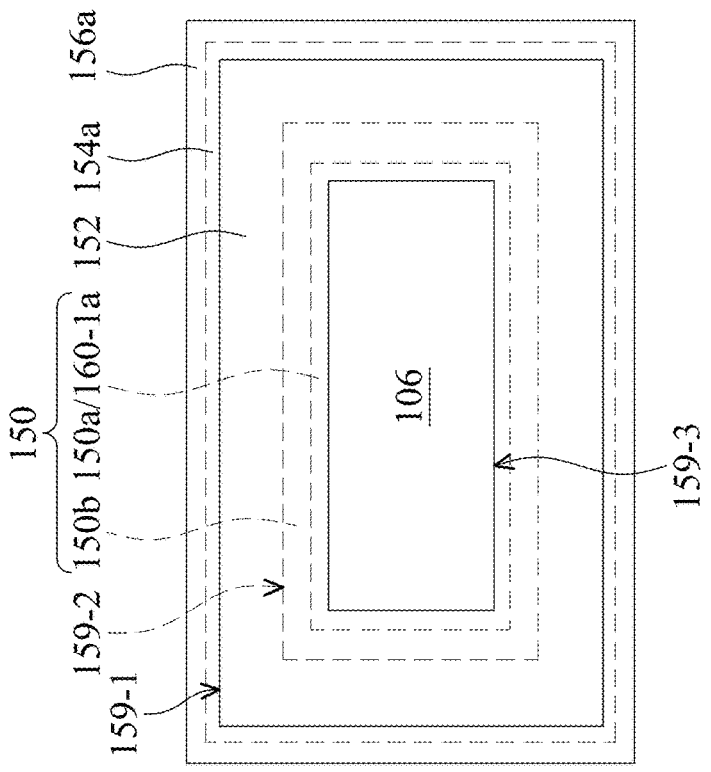
Figures 1, 19:
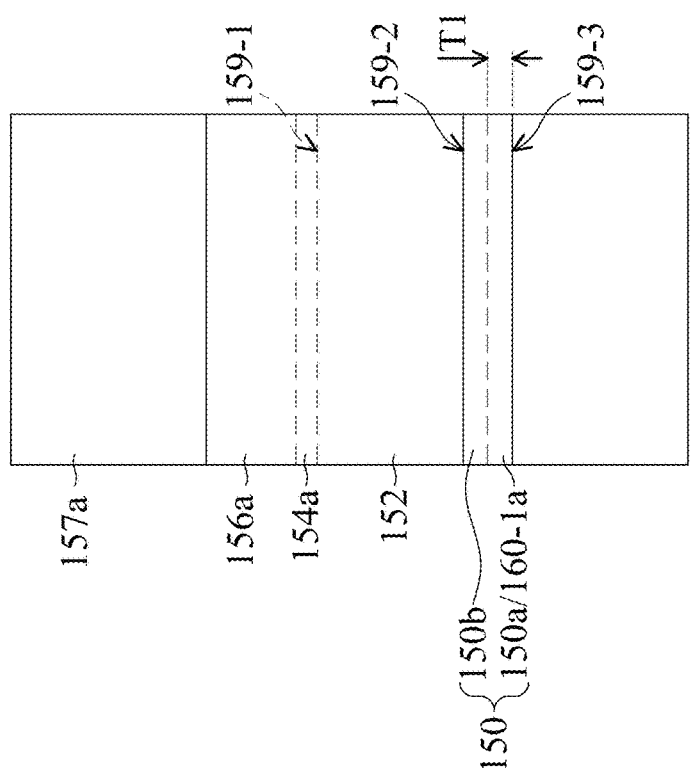
Figures 4, 19:
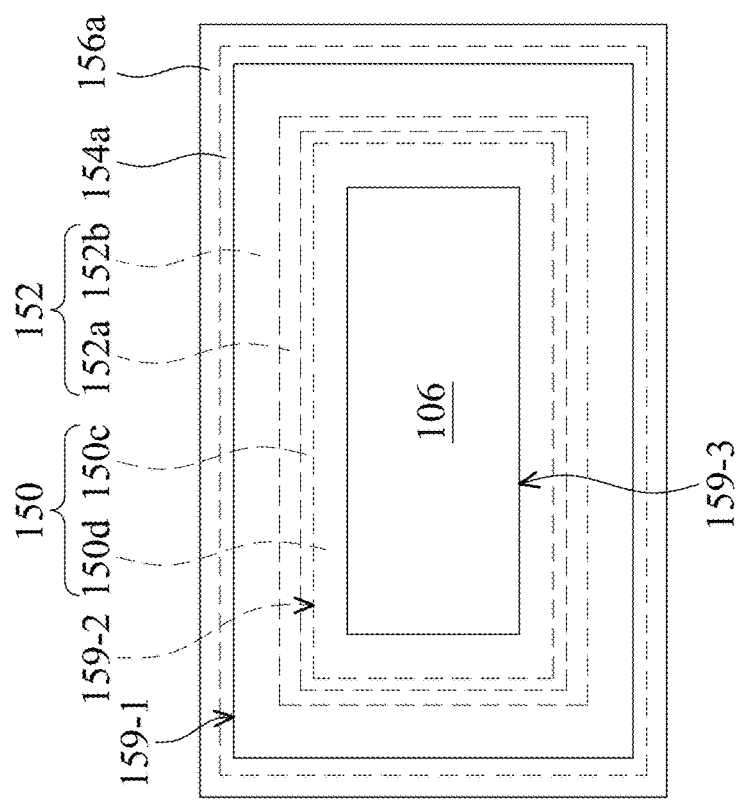
Figures 3, 19:
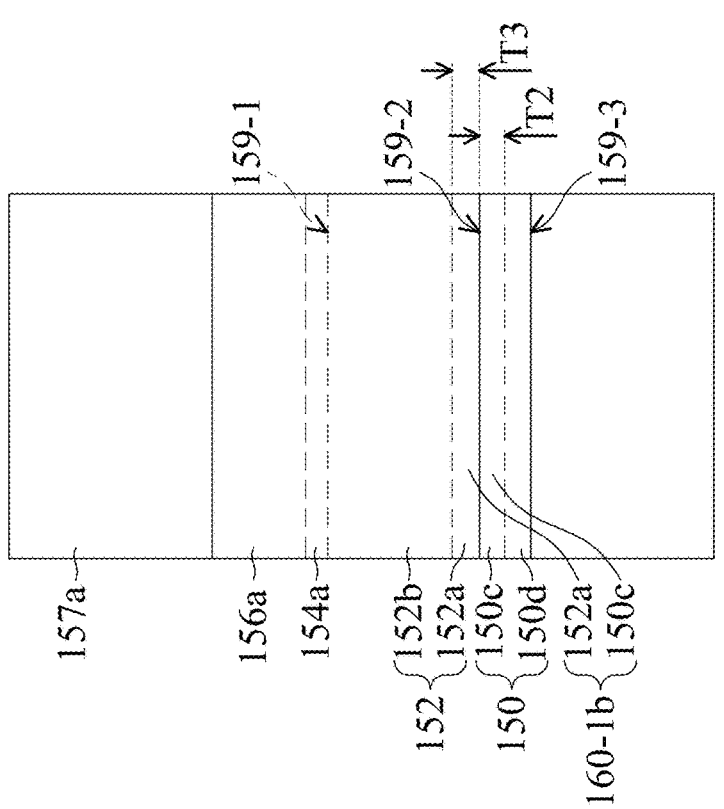

In FIG. 19, a capping layer 156a is formed to cover the nanosheet transistors at the regions 153, 155. The capping layer 156a surrounds the first semiconductor layers 106 and over the well portion 116 of the substrate 101. The capping layer 156a fills the openings 151 (FIG. 18) to a level so that at least the nanosheet transistors at the regions 153, 155 are submerged in the capping layer 156a. In some embodiments, the capping layer 156a is formed to a level at or slightly below an interface defined by the dielectric material 121 and the dielectric material 125. The first additive layer 154 can function as a barrier to prohibit the first HK dielectric layer 152 from contacting ambient atmosphere when transferring between different process chambers (e.g., from a deposition chamber to a thermal process chamber). The capping layer 156a enhances the barrier and prevents the dopant atoms from penetrating through during the subsequent processes, such as a thermal treatment. The capping layer 156a may include or be formed of TiN, TaN, $AlO_x$, or the like, and may be formed by any suitable deposition techniques such as PVD, CVD, etc. In one embodiment, the capping layer 156a is TiN.

Next, a hard mask layer 157a is formed on the capping layer 156a. In some embodiments, the hard mask layer 157a is deposited to a height over the top surface of the first additive layer 154 on the dielectric feature 127. The hard mask layer 157a is in contact with the capping layer 156a and the exposed first additive layer 154 over the dielectric feature 127. The hard mask layer 157a and the capping layer 156a prevent the first additive layer 154 from being oxidized when transferring between different process chambers. The hard mask layer 157a may include or be formed of a silicon-containing material or an oxygen-containing material, such as Si, SiN, SiO$_2$, SiCN, SiCON, the like, or a combination thereof, and may be formed by any suitable deposition techniques such as CVD, PVD, ALD, etc. In one embodiment, the hard mask layer 157a is a silicon layer, such as amorphous silicon.

Thereafter, the semiconductor device structure 100 is subjected to a thermal treatment 158a (e.g., a rapid thermal anneal or a laser anneal process). The thermal treatment 158a causes the dopants (e.g., metal ions) in the first additive layer 154 to diffuse into the first HK dielectric layer 152 and the IL 150. In general, the dopants are distributed over the first HK dielectric layer 152 and the IL 150 in both lateral and vertical directions. In some embodiments, the thermal treatment 158a is performed so that the dopants in the first additive layer 154 are diffused through the first HK dielectric layer 152 and into a portion of the IL 150. The thermal treatment 158a provides a thermal driving force to pull out dopants from the first additive layer 154. By tuning the elevated temperature and the dwell time of the thermal treatment, the target dopants can be positioned at desired diffusion depth in the first HK dielectric layer 152 and the IL 150, thereby controlling the flat band voltage (VFB) with the shifts of the threshold voltage of the N-type or P-type transistors at the regions 153, 155.

The first HK dielectric layer 152 after the thermal treatment may have a concentration gradient profile having a first dopant concentration at and/or near an interface 159-1 (FIG. 19-1) of the first additive layer 154 and the first HK dielectric layer 152 and a second dopant concentration at and/or near an interface 159-2 of the IL 150 and the first HK dielectric layer 152. In some embodiments, the second dopant concentration is greater than the first dopant concentration. In some embodiments, the second dopant concentration is less than the first dopant concentration. The region between the interface 159-1 and the interface 159-2 has a dopant concentration gradually changed along the thickness of the region from the first dopant concentration to the second dopant concentration. Likewise, the IL 150 after the thermal treatment may have a concentration gradient profile having a third dopant concentration at and/or near the interface 159-2 of the IL 150 and the first HK dielectric layer 152 and a fourth dopant concentration at and/or near an interface 159-3 of the IL 150 and the first semiconductor layer 106. In some embodiments, the third dopant concentration is greater than the fourth dopant concentration. In some embodiments, the third dopant concentration is less than the fourth dopant concentration. The region between the interface 159-2 and the interface 159-3 has a dopant concentration gradually changed along the thickness of the region from the third dopant concentration to the fourth dopant concentration. While not discussed, the dopant profile mentioned herein may equally apply to the first HK dielectric layer 152 and the IL 150 disposed over the dielectric feature 127 and the well portion 116 of the substrate 101. By controlling the degree of dopant penetration in the first HK dielectric layer 152 and the IL 150, the threshold voltage of the N-type or P-type transistors in the regions 153, 155 is adjustable.

In one exemplary embodiment, the thermal treatment 158a is performed such that the majority of the dopants (e.g., metal ions) are accumulated at and/or near the interface 159-3 of the IL 150 and the first semiconductor layer 106.

FIGS. 19-1 and 19-2 illustrate enlarged views of a portion of the semiconductor device structure 100 showing layers with dopant distribution after the thermal treatment 158a according to the exemplary embodiment. As shown in FIGS. 19-1 and 19-2, the dopant atoms (e.g., Zn ions) are diffused into and reacted with the IL 150 to form a modified region 150a of the IL 150 as a result of the thermal treatment 158a. The modified region 150a of the IL 150 may extend a thickness T1 from the interface 159-3 into the IL 150. In one embodiment, the thickness T1 is about 10% to about 60% of the thickness of the IL 150. When compared to the modified region 150a of the IL 150, the remainder of the IL 150 other than the modified region 150a of the IL 150 has less dopant concentration and is indicated as region 150b. The modified region 150a of the IL 150 may be referred to as a threshold voltage (Vth) tuning layer 160-1a in this disclosure. After the thermal treatment 158a, the first additive layer 154 has a reduced concentration of the dopant atoms and become a modified first additive layer 154a.

In another exemplary embodiment, the thermal treatment 158a is performed such that the majority of the dopants (e.g., metal ions) are accumulated at and/or near the second interface 159-2 of the IL 150 and the first HK dielectric layer 152. FIGS. 19-3 and 19-4 illustrate enlarged views of a portion of the semiconductor device structure 100 showing layers with dopant distribution after the thermal treatment 158a according to another exemplary embodiment. As shown in FIGS. 19-3 and 19-4, the dopant atoms (e.g., Zn ions) are diffused into and reacted with the IL 150 and the first HK dielectric layer 152 to form a modified region 150c of the IL layer 150 and a modified region 152a of the first HK dielectric layer 152 as a result of the thermal treatment 158a. The modified region 150c of the IL 150 may extend a thickness T2 from the interface 159-2 into the IL 150. In one embodiment, the thickness T2 is about 10% to about 55% of the thickness of the IL 150. The remainder of the IL 150 other than the modified region 150c of the IL 150 has less dopant concentration and is indicated as region 150d.

Likewise, the modified region 152a of the first HK dielectric layer 152 may extend a thickness T3 from the interface 159-2 into the first HK dielectric layer 152. In one embodiment, the thickness T3 is about 5% to about 35% of the thickness of the first HK dielectric layer 152. The remainder of the first HK dielectric layer 152 other than the modified region 152a of the first HK dielectric layer 152 has less dopant concentration and is indicated as region 152b. The modified region 150c of the IL 150 and the modified region 152a of the first HK dielectric layer 152 may be referred to as a Vth tuning layer 160-1b in this disclosure. While FIGS. 20-30D below show the semiconductor device structure 100 using the Vth tuning layer 160-1b as an example, it is contemplated that the Vth tuning layer 160-1a shown in FIGS. 19-1 and 19-2 is equally applicable to various embodiments of this disclosure.

In some embodiments, the modified region 150c of the IL 150 and the modified region 152a of the first HK dielectric layer 152 may be the IL 150 and the first HK dielectric layer 152 doped with metal ions from the first additive layer 154. In some embodiments, the modified region 150c of the IL 150 and the modified region 152a of the first HK dielectric layer 152 may be a reaction product of the first additive layer 154 and the IL and the first HK dielectric layer 150, 152, which may be a compound, a composition or a mixture, depending on the thermal treatment used. In either case, the modified region 150c of the IL 150 and the modified region 152a of the first HK dielectric layer 152 are formed with a dopant concentration significantly higher than that of the IL 150 and the first HK dielectric layer 152. For example, the dopant concentration in the modified region 150c of the IL 150 and the modified region 152a of the first HK dielectric layer 152 may be about 70% higher, such as about 85%-95% higher, than the dopant concentration in the IL 150 and the first HK dielectric layer 152, respectively. After the thermal treatment 158a, the first additive layer 154 has a reduced concentration of the dopant atoms and become a modified first additive layer 154a.

The thermal treatment 158a may be performed in-situ or ex-situ and can be any type of anneal, such as rapid thermal anneal, a spike anneal, a soak anneal, a laser anneal, a furnace anneal, etc. The dwell time of the thermal treatment 158a may be about 1 microsecond to about 20 microseconds, and at a temperature range of about 450° C. to about 1800° C., for example about 900° C. to about 1500° C. The thermal treatment may be performed in an atmosphere of gas, such as an oxygen-containing gas, a hydrogen-containing gas, an argon-containing gas, a helium-containing gas, or any combinations thereof. Exemplary gas may include, but are not limited to, $N_2$, $NH_3$, $O_2$, $N_2O$, Ar, He, H, etc.

Figure 20:
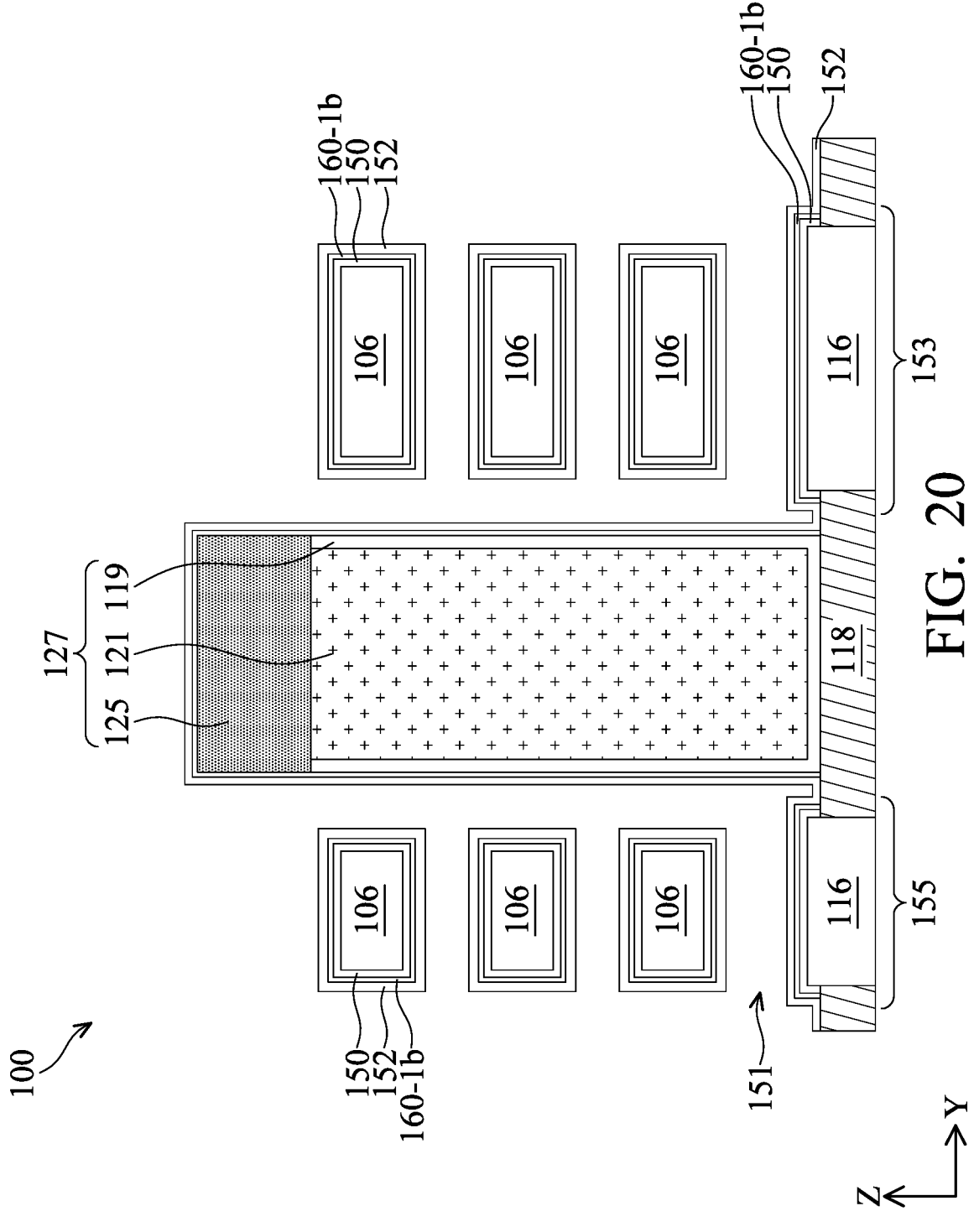

In FIG. 20, the hard mask layer 157a, the capping layer 156a, and the modified first additive layer 154a are removed. The hard mask layer 157a, the capping layer 156a, and the modified first additive layer 154a may be removed using one or more etch processes, such as dry etch, wet etch, or a combination thereof. In some embodiments, the hard mask layer 157a, the capping layer 156a, and the modified first additive layer 154a are removed by one or more wet etch processes. The wet etch process may be an APM process, which includes at least water ($H_2O$), ammonium hydroxide ($NH_4OH$), and hydrogen peroxide ($H_2O_2$), a HPM process, which includes at least $H_2O$, $H_2O_2$, and hydrogen chloride (HCl), a SPM process (also known as piranha clean), which includes at least $H_2O_2$ and sulfuric acid ($H_2SO_4$), or any combination thereof. The semiconductor device structure 100 may be further cleaned with a hot deionized water to remove any residues of the modified first additive layer 154a. The one or more etch processes and the wet clean process may be performed under real-time monitoring to avoid unnecessary damage to the first HK dielectric layer 152. The openings 151 (FIGS. 15A, 15B) over the regions 153, 155 are revealed upon removal of the hard mask layer 157a and the capping layer 156a, exposing the modified first additive layer 154a.

Figure 21:
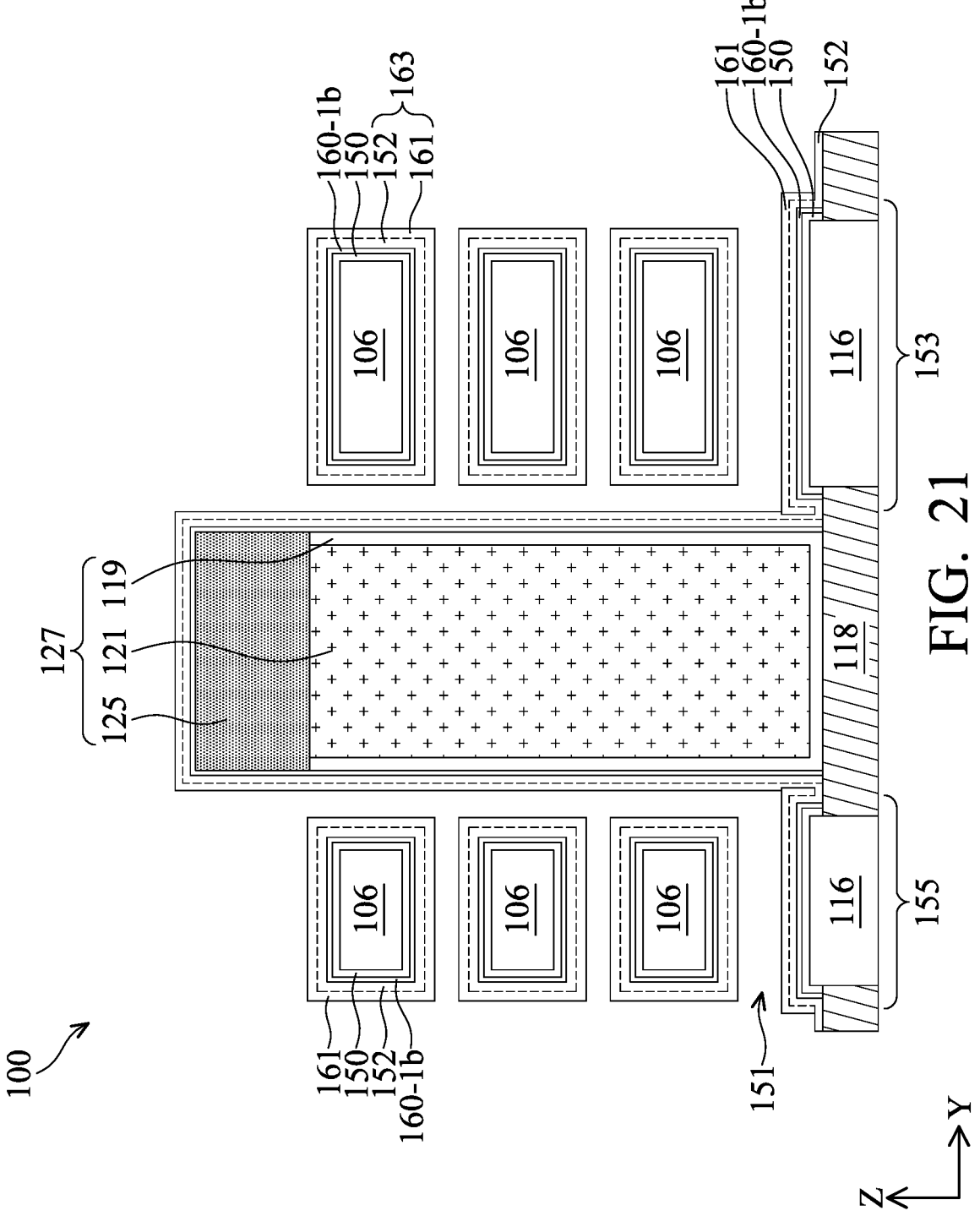

In FIG. 21, a second HK dielectric layer 161 is formed on the first HK dielectric layer 152. The second HK dielectric layer 161 may use the same material as the first HK dielectric layer 152 and be deposited using the same fashion discussed above with respect to FIG. 17. In one embodiment, the first and second HK dielectric layers 152, 161 include or are made of hafnium oxide ($HfO_2$). The second HK dielectric layer 161 may have the same thickness as the first HK dielectric layer 152. However, greater or lesser thickness of the second HK dielectric layer 161 is also contemplated. The first and second HK dielectric layers 152, 161 may be referred to as a HK dielectric stack 163 in this disclosure. The second HK dielectric layer 161 confines the inserted additives (i.e., dopant atoms from the first additive layer 154) near the interface of the IL 150 and the first HK dielectric layer 152. In addition to the thickness of the first HK dielectric layer 152, the additional thickness provided by the second HK dielectric layer 161 ensures the dopants from a subsequent second additive layer 147 have enough space to be thermally driven and distributed at desired regions of the HK dielectric stack 163.

In some embodiments, the second HK dielectric layer 161 includes a different material than the first HK dielectric layer 152. For example, in one embodiment the first HK dielectric material layer 152 includes $HfO_x$ and the second HK dielectric layer 161 includes $LaO_x$; in one embodiment the first HK dielectric material layer 152 includes $HfO_x$ and the second HK dielectric layer 161 includes $AlO_x$; in one embodiment the first HK dielectric material layer 152 includes $LaO_x$ and the second HK dielectric layer 161 includes $AlO_x$; in one embodiment the first HK dielectric material layer 152 includes $HfO_x$ and the second HK dielectric layer 161 includes $LaO_x$ and $AlO_x$; in one embodiment the first HK dielectric material layer 152 includes $LaO_x$ and the second HK dielectric layer 161 includes $HfO_x$ and $AlO_x$; in one embodiment the first HK dielectric material layer 152 includes $AlO_x$ and the second HK dielectric layer 161 includes $HfO_x$ and $LaO_x$. These embodiments may be used for P-type or N-type nanosheet transistors at regions 153, 155, and can be used in conjunction with the embodiments shown in FIGS. 23-1 to 23-8, as will be discussed in more detail below.

Figure 22:
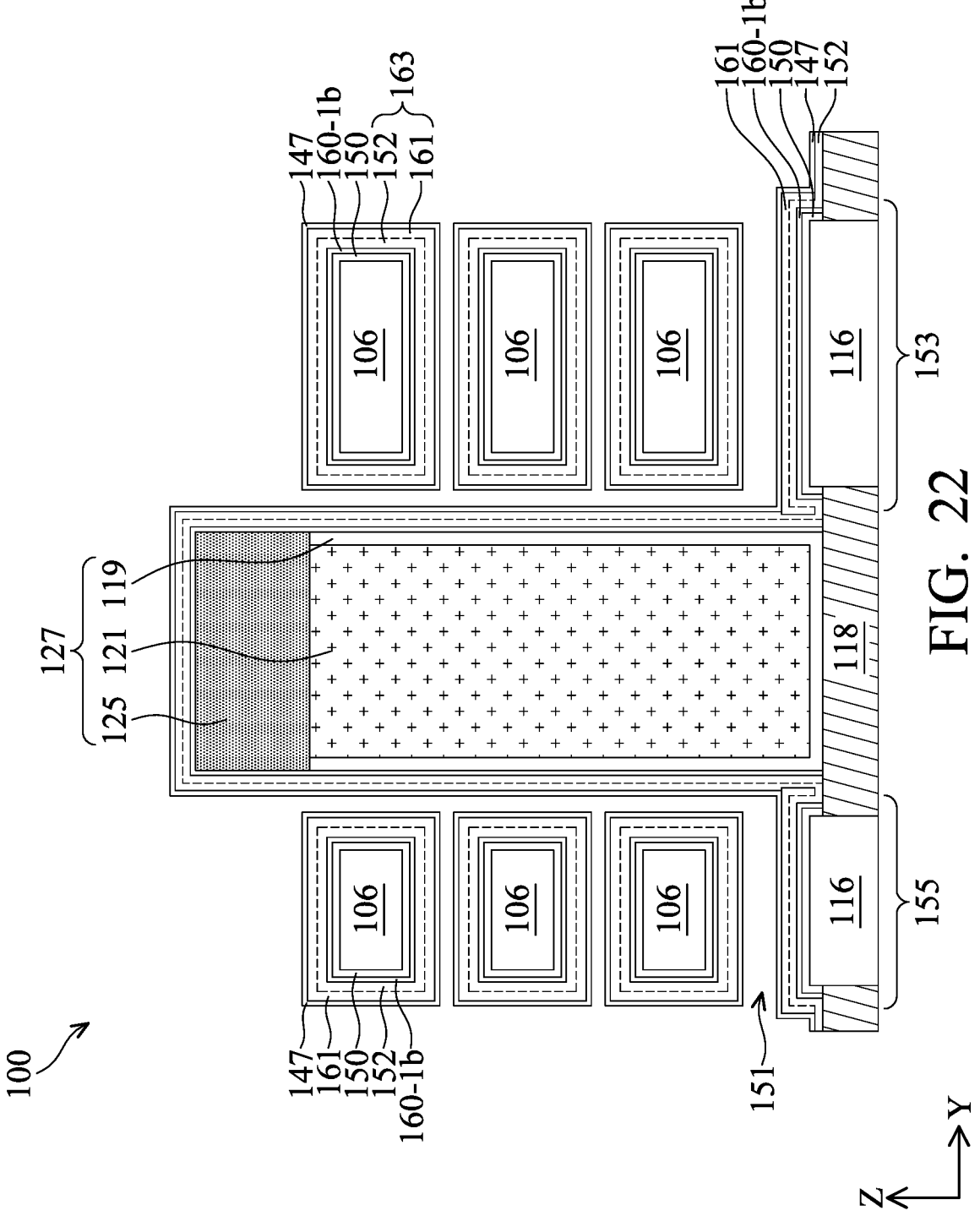

In FIG. 22, a second additive layer 147 is formed on the second HK dielectric layer 161. The second additive layer 147 surrounds the first semiconductor layers 106 and over the well portion 116 of the substrate 101. Depending on the conductivity type of the nanosheet transistor, the second additive layer 147 may include dopants having positive polarity or negative polarity. In the embodiment shown in FIG. 22, the nanosheet transistor at the region 153 is designated as an N-type FET and the nanosheet transistor at the region 155 is designated as a P-type FET. In such cases, the second additive layer 147 may include a material with dopants having a negative polarity. The second additive layer 147 functions as a source for the dopants to be introduced into the first HK dielectric layer 152 and the second HK dielectric layer 161. Like the first additive layer 154, the dopants (e.g., metal ions) from the second additive layer 147 can be controlled to be distributed in the first and second HK dielectric layers 152, 161 to adjust a threshold voltage of the N-type or P-type transistors in the regions 153, 155. The concentration of the dopant atoms in the Vth tuning layer 160-1b (or the Vth tuning layer 160-1a in some embodiments) and the concentration of the dopant atoms to be distributed in the first and second HK dielectric layers 152, 161, as well as the thickness of the various Vth tuning layers may be configured so that the VFB of the nanosheet transistors in the N-type region and the VFB of the nanosheet transistors in the P-type region is at a ratio of about 1 to about 1.2. In various embodiments, the concentration of the dopants in the second additive layer 147 may range from about 10 ppm to about 400 ppm. Stated differently, the concentration of the dopants in the second additive layer 147 may be in a range of about $1E10^{17}$ atoms/cm$^{-3}$ to about $5E10^{21}$ atoms/cm$^{-3}$.

In some embodiments, the second additive layer 147 may include a material inherently having a negative polarity. Exemplary materials may include, but are not limited to, a lanthanum-containing material, a magnesium-containing material, an yttrium-containing material, a gadolinium-containing material, or the like. In some embodiments, the second additive layer 147 may further contain oxygen. In such cases, the second additive layer 147 may include, but are not limited to, lanthanum oxide ($La_2O_3$), magnesium oxide (MgO), yttrium oxide ($Y_2O_3$), gadolinium oxide ($Gd_2O_3$), or the like. In one exemplary embodiment, the second additive layer 147 is $La_2O_3$. The second additive layer 147 can be formed by ALD, ALE, CVD, or any suitable conformal deposition technique. In some embodiments, the second additive layer 147 may have a thickness of about 0.1 nm to about 1 nm. Greater or lesser thickness is contemplated depending on the threshold voltage requirement of the devices.

Figure 23:
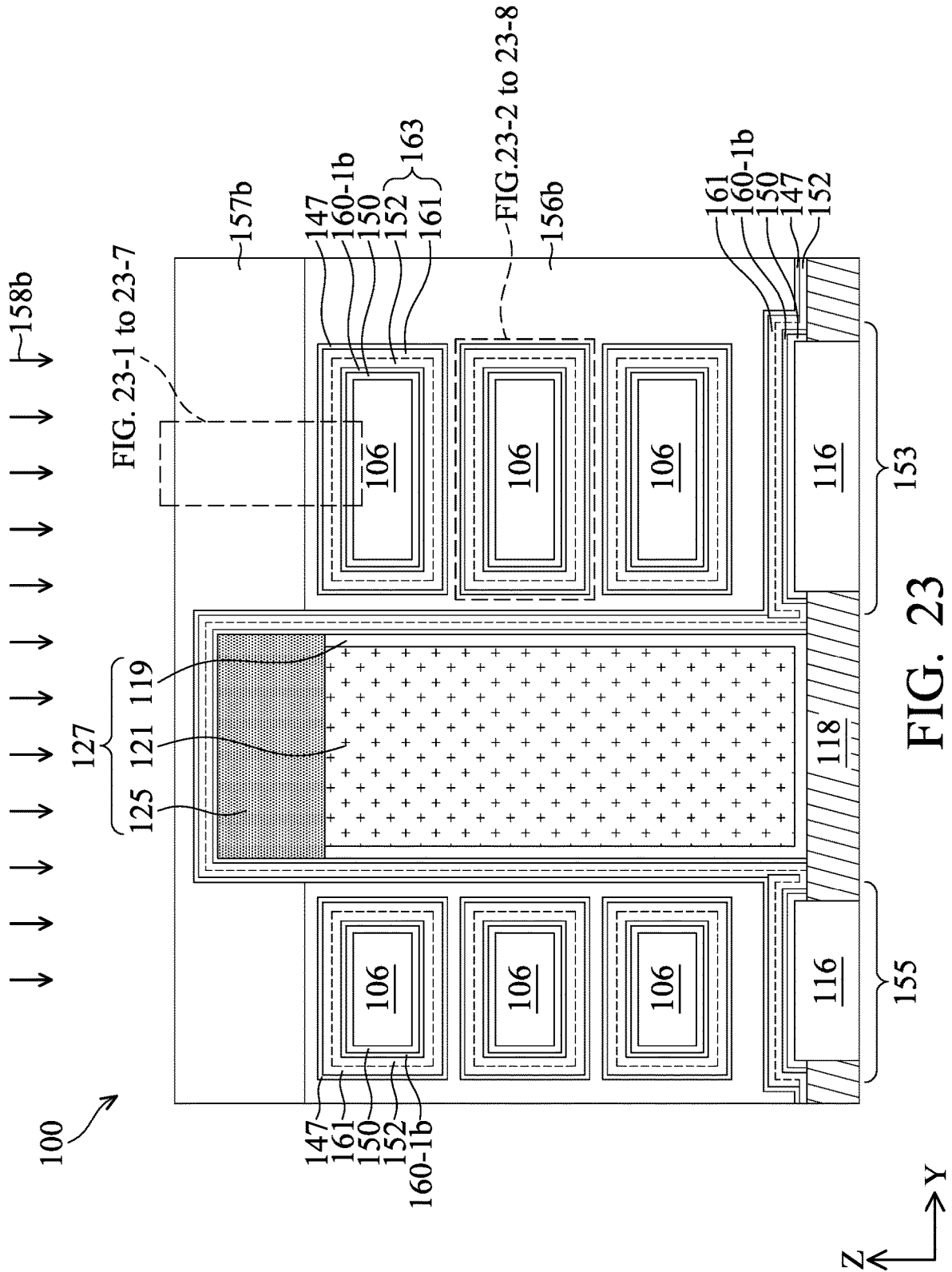
Figures 1, 2, 23:
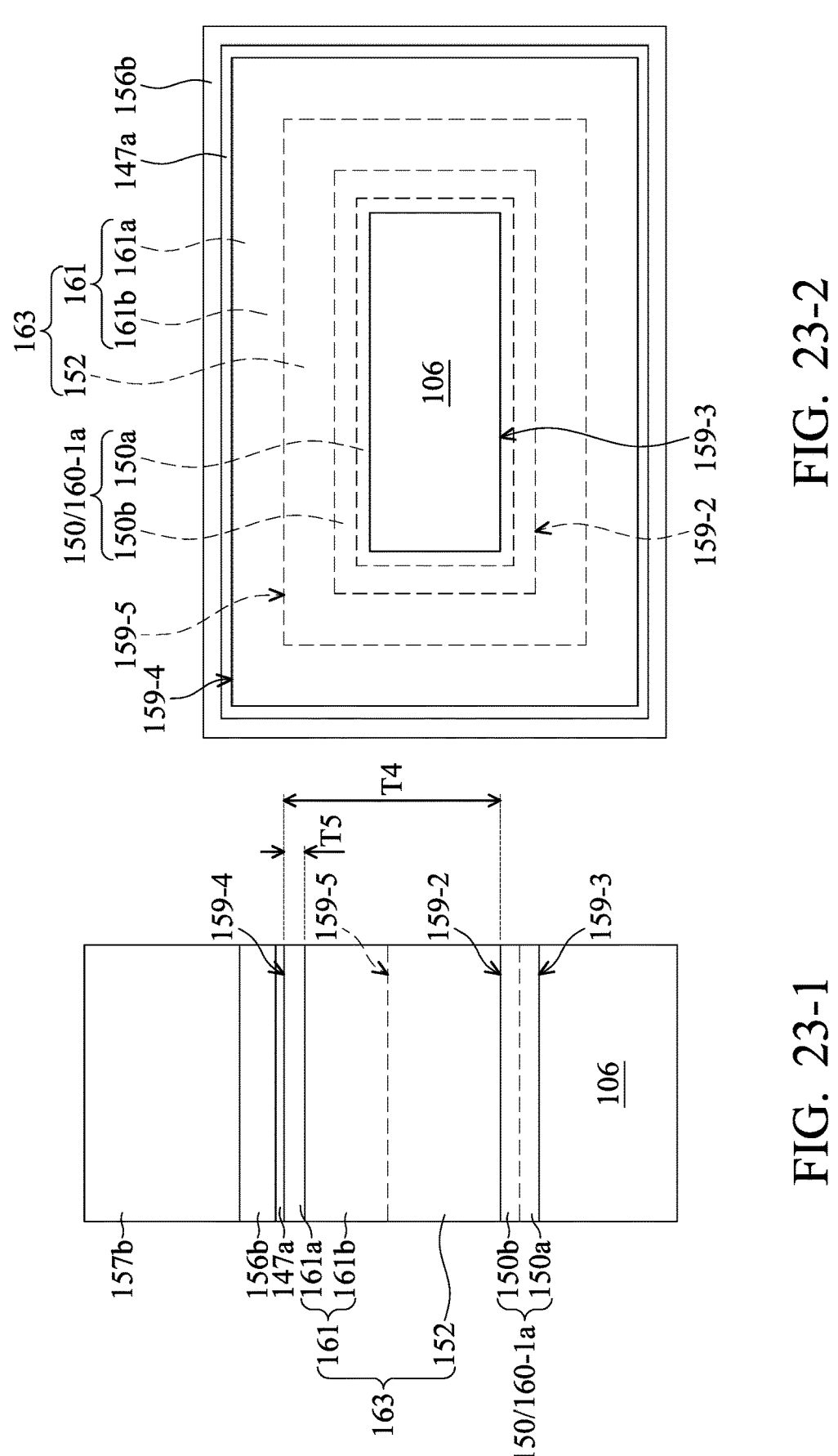
Figures 3, 4, 23:
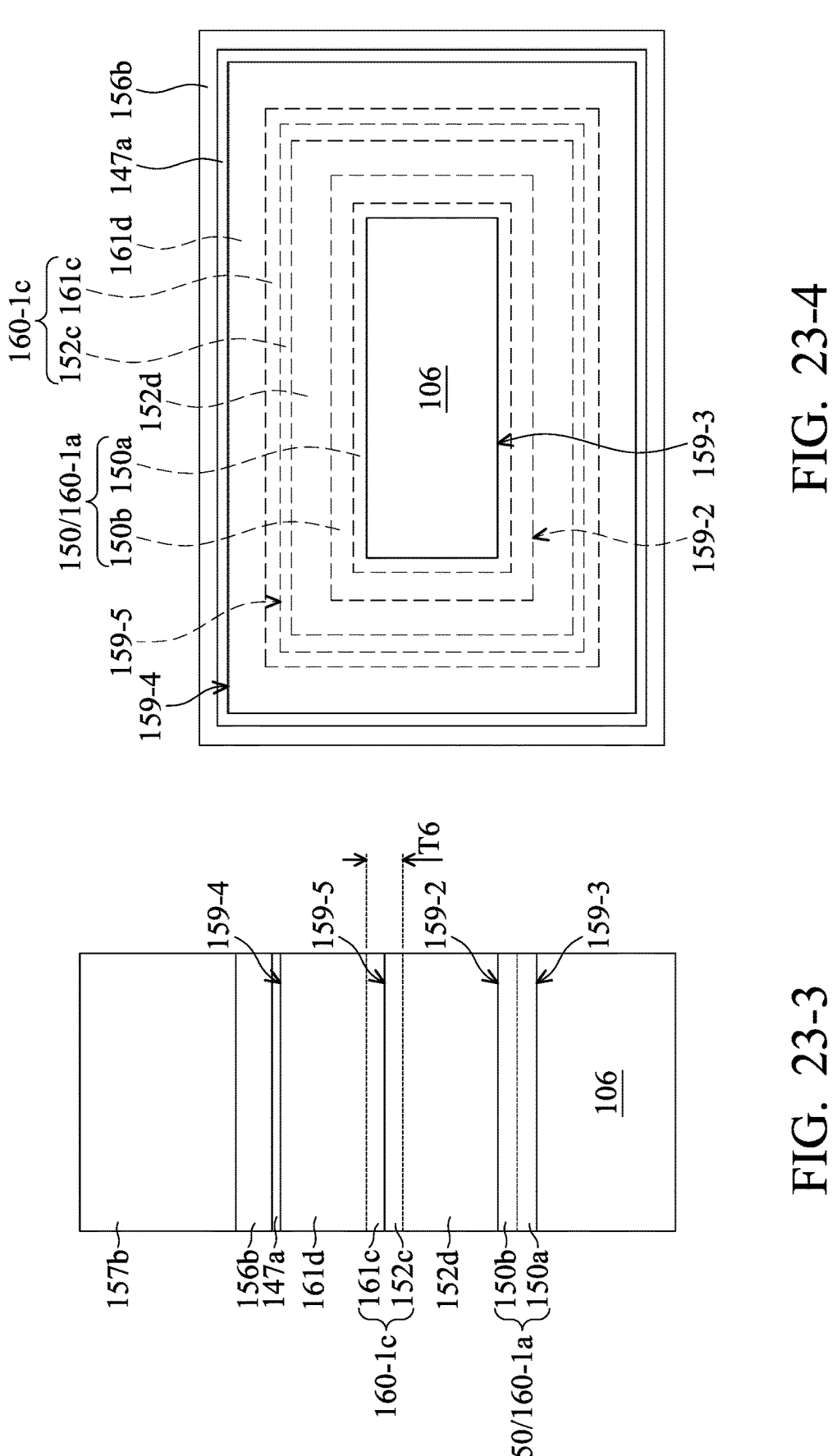
Figures 5, 6, 23:
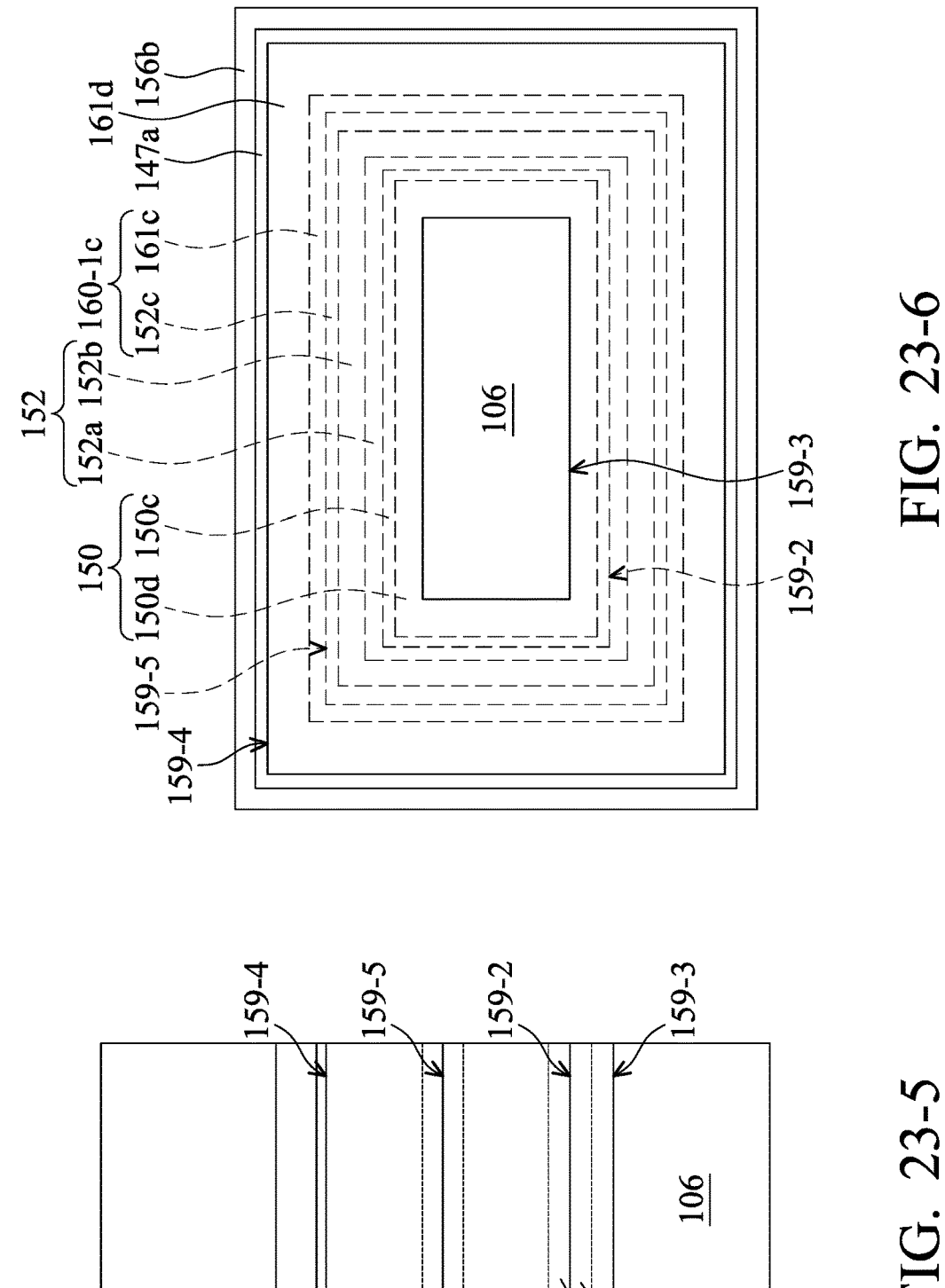
Figures 7, 8, 23:
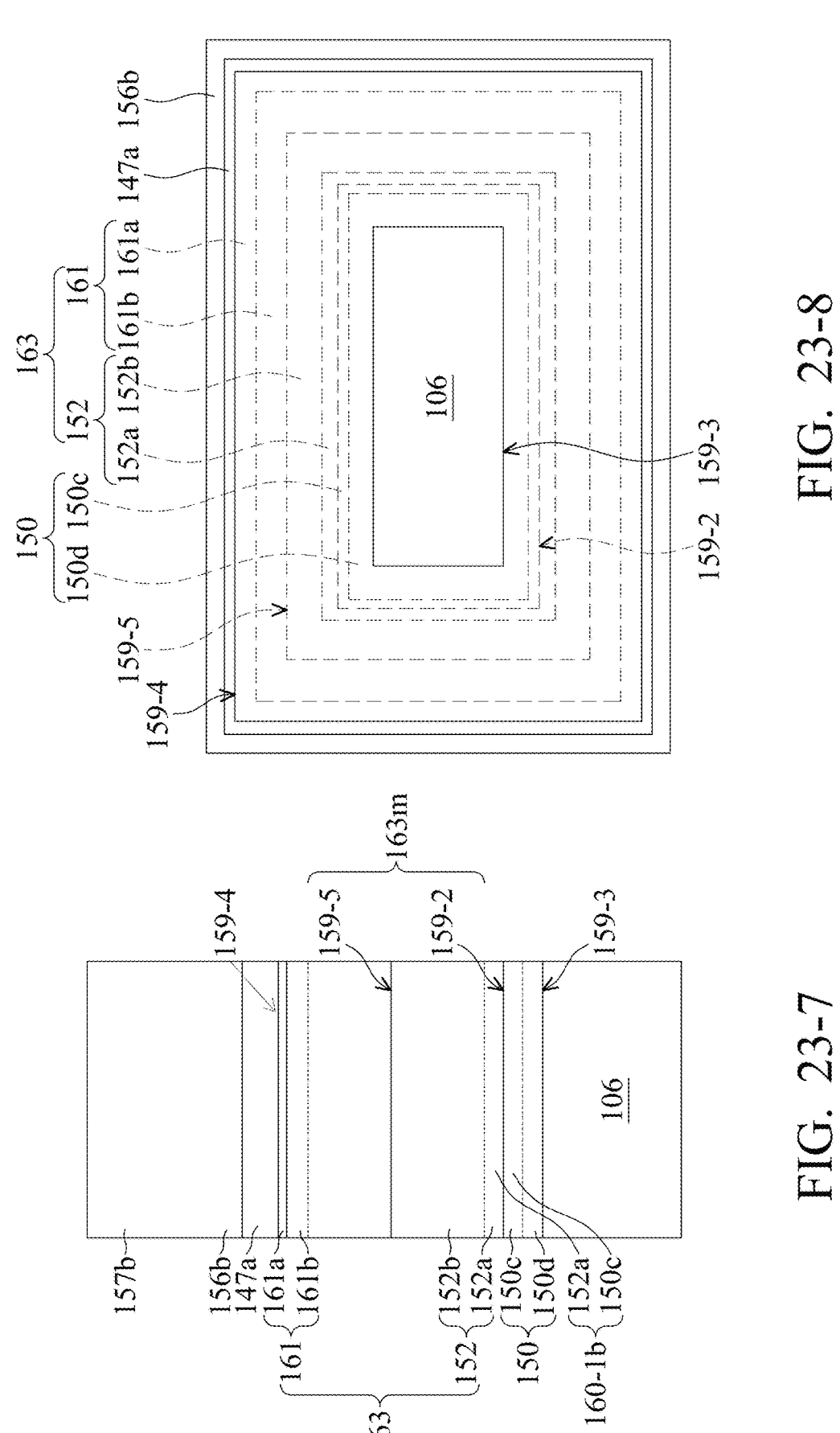

In FIG. 23, a capping layer 156b is formed to cover the nanosheet transistors at the regions 153, 155. A hard mask layer 157b is then formed on the capping layer 156b. The capping layer 156b and the hard mask layer 157b may include the same material as the capping layer 156a and the hard mask layer 157a, respectively, and may be deposited in a similar fashion as those discussed above with respect to FIG. 19. Thereafter, a thermal treatment 158b is performed so that the dopants (e.g., metal ions) in the second additive layer 147 are diffused into the HK dielectric stack 163. The thermal treatment 158b may be the same or similar to the thermal treatment 158a, and is configurable to achieve desired distribution profile of the dopants in the first and second HK dielectric layer 152, 161. For example, in some embodiments the thermal treatment 158b may be performed so that the dopants (e.g., La ions) are diffused into the second HK dielectric layer 161. In some embodiments, the dopants are diffused through the second HK dielectric layer 161 and into a portion of the first HK dielectric layer 152. In some embodiments, the dopants are diffused through the second HK dielectric layer 161 and the first HK dielectric layer 152 and accumulated at and/or near the interface 159-2. By controlling a degree of penetration of the dopants in the HK dielectric stack 163, the threshold voltage of the N-type or P-type transistors in the regions 153, 155 can be further adjusted.

The second HK dielectric layer 161 after the thermal treatment 158b may have a concentration gradient profile having a first dopant concentration at and/or near an interface 159-4 of the second additive layer 147 and the second HK dielectric layer 161 and a second dopant concentration at the interface 159-2 of the first HK dielectric layer 152 and the IL 150. In some embodiments, the first dopant concentration is greater than the second dopant concentration. In some embodiments, the second dopant concentration is greater than the first dopant concentration. The region between the interface 159-5 and the interface 159-2 has a dopant concentration gradually changed along the thickness of the region from the first dopant concentration to the second dopant concentration. FIGS. 23-1 and 23-2 illustrate enlarged views of a portion of the semiconductor device structure 100 showing layers with dopant distribution after the thermal treatment 158b according to one exemplary embodiment. The dopant atoms (e.g., La ions) are diffused into and reacted with the second HK dielectric layer 161 to form a modified region 161a of the second HK dielectric layer 161 as a result of the thermal treatment 158b. The remainder of the second HK dielectric layer 161 other than the modified region 161a of the second HK dielectric layer 161 has a lesser dopant concentration and is indicated as region 161b. The modified region 161a of the second HK dielectric layer 161 functions as a Vth tuning layer and can work with other Vth tuning layers (e.g., the Vth tuning layers 160-1a, 160-1b, and 160-1c) discussed in this disclosure for effective tuning of the flat band voltage (VFB) of the N-type or P-type FETs at the regions 153, 155.

The HK dielectric stack 163 may have a thickness T4 measuring from the interface 159-5 to the interface 159-2, and the modified region 161a of the second HK dielectric layer 161 may have a thickness T5. In some embodiments, the thickness T5 is about 10% to about 60% of the thickness T4, for example about 25% to about 45% of the thickness T4. The modified region 161a of the second HK dielectric layer 161 may be the second HK dielectric layer 161 doped with metal ions (e.g., La ions) from the second additive layer 147. In some embodiments, the modified region 161a of the second HK dielectric layer 161 may be a reaction product of the second additive layer 147, which may be a compound, a composition or a mixture, depending on the thermal treatment used. In either case, the modified region 161a of the second HK dielectric layers 161 has a dopant concentration significantly higher than that of the second HK dielectric layer 147. For example, the dopant concentration in the modified region 161a of the second HK dielectric layer 161 may be about 70% higher, such as about 85%-95% higher, than the dopant concentration in the second HK dielectric layer 147. After the thermal treatment 158b, the second additive layer 147 has a reduced concentration of the dopant atoms and become a modified second additive layer 147a.

FIGS. 23-3 and 23-4 illustrate enlarged views of a portion of the semiconductor device structure 100 showing layers with dopant distribution after the thermal treatment 158b according to another exemplary embodiment. The embodiment in FIGS. 23-3 and 23-4 are similar to the embodiment of FIGS. 23-1 and 23-2 except that the majority of the dopants (e.g., metal ions) are accumulated at and/or near interface 159-5. The dopants from the second additive layer 147 (e.g., La ions) react with an upper portion of the first HK dielectric layer 152 and a lower portion of the second HK dielectric layer 161 to form a modified region 152c of the first HK dielectric layer 152 and a modified region 161c of the second HK dielectric layer 161, respectively. The remainder of the first HK dielectric layer 152 other than the modified region 152c of the first HK dielectric layer 152 has a lesser dopant concentration and is indicated as region 152d. The remainder of the second HK dielectric layer 161 other than the modified region 161c of the second HK dielectric layer 161 has a lesser dopant concentration and is indicated as region 161d. For example, the dopant concentration in the modified region 152c of the first HK dielectric layer 152 and the modified region 161c of the second HK dielectric layer 161 may be about 70% higher, such as about 85%-95% higher, than the dopant concentration in the first and second HK dielectric layers 152, 161, respectively. The modified region 152c of the first HK dielectric layer 152 and the modified region 161c of the second HK dielectric layer 161 may be referred to as a threshold voltage (Vth) tuning layer 160-1c in this disclosure. In some embodiments, the Vth tuning layer 160-1c may have a thickness T6 that is about 10% to about 60% of the thickness T4, for example about 25% to about 45% of the thickness T4.

FIGS. 23-5 and 23-6 illustrate enlarged views of a portion of the semiconductor device structure 100 showing layers with dopant distribution after the thermal treatment 158b according to one another exemplary embodiment. The embodiment in FIGS. 23-5 and 23-6 are substantially identical to the embodiment of FIGS. 23-3 and 23-4 except that the Vth tuning layer 160-1a is not formed but being replaced with the Vth tuning layer 160-1b as discussed above with respect to FIGS. 19-3 and 19-4. In this embodiment, the second HK dielectric layer 152 has an upper portion (e.g., modified region 152c having dopants from the second additive layer 147), a lower region (e.g., modified region 152a having dopants from the first additive layer 154), and a middle region (e.g., region 152b) having dopants from the first and second additive layers 154, 147.

FIGS. 23-7 and 23-8 illustrate enlarged views of a portion of the semiconductor device structure 100 showing layers with dopant distribution after the thermal treatment 158b according to yet another exemplary embodiment. The embodiment in FIGS. 23-7 and 23-8 are substantially identical to the embodiment of FIGS. 23-5 and 23-6 except that the Vth tuning layer 160-1c is not formed but being replaced with the modified region 161a of the second HK dielectric layer 161 as discussed above with respect to FIGS. 23-1 and 23-2. In this embodiment, the HK dielectric stack 163 has an upper region (i.e., the modified region 161a of the second HK dielectric layer 161) adjacent the interface 159-4 of the second additive layer 147 and the second HK dielectric layer 161 and a lower region (i.e., the modified region 152a of the first HK dielectric layer 152) adjacent the interface 159-2 of the first HK dielectric layer 152 and the IL 150. The upper region includes a majority of the dopants (e.g., La ions) from the second additive layer 147 and the lower region includes a majority of the dopants (e.g., Zn ions) from the first additive layer 154. The middle region 163m between the interface 159-4 and the interface 159-2 may include a small amount of dopants from both first and second additive layers 154, 147, and the concentration of the dopants (either dopants from first or second additive layers 154, 147) in the middle region 163m are smaller than that of the dopants in the upper and lower regions. While the dopants are distributed over the HK dielectric stack 163 in both lateral and vertical directions, the concentration of the dopants from the second additive layer 147 in the middle region 163m is gradually reduced in a direction away from the interface 159-4, and the concentration of the dopants from the first additive layer 154 in the middle region 163m is gradually reduced in a direction away from the interface 159-2. In most cases, the upper and lower regions of the HK dielectric stack 163 have a dopant concentration that is significantly greater (e.g., about 80-95% higher) than the dopant concentration in the middle region 163m.

Figure 24:
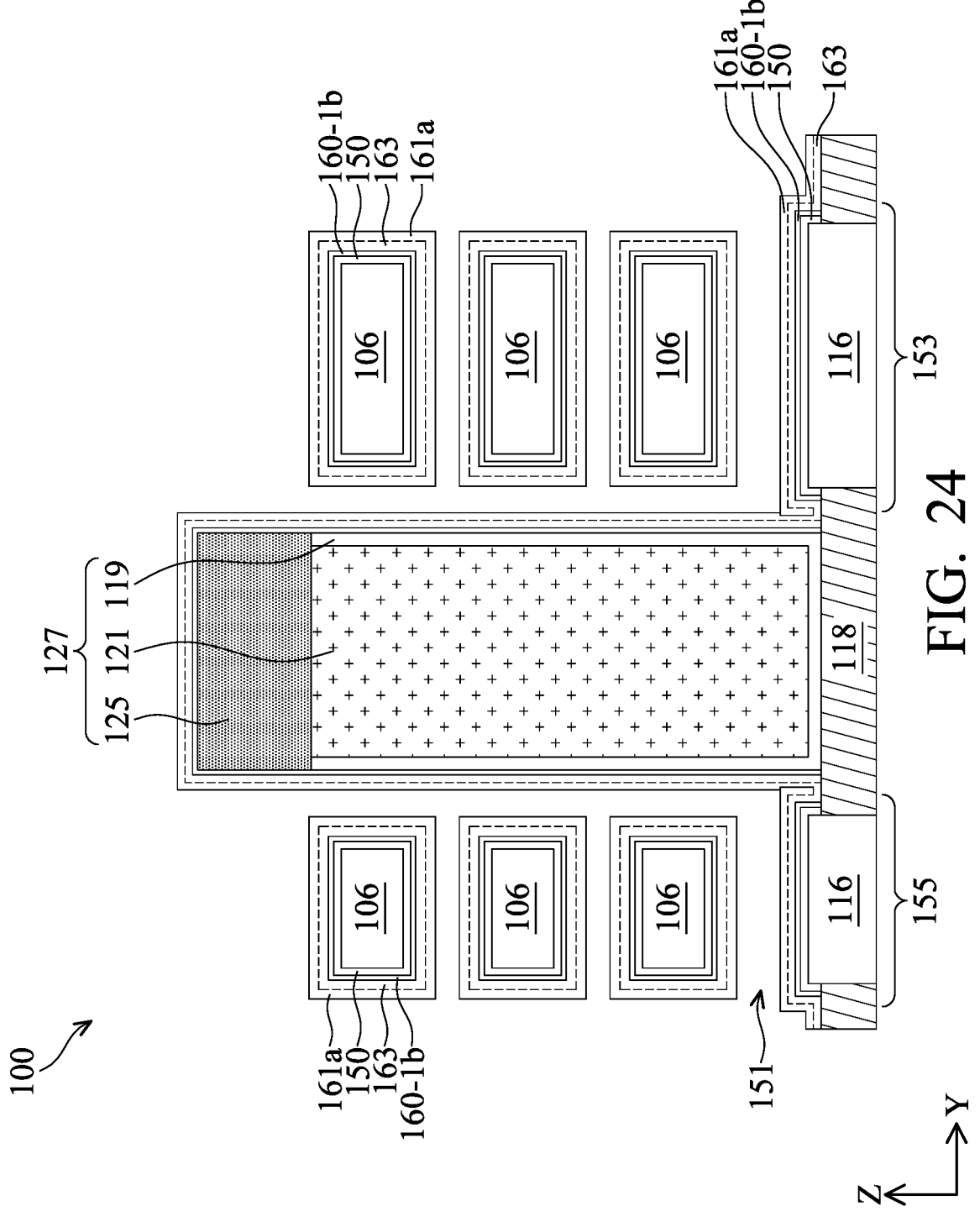

In FIG. 24, the hard mask layer 157b, the capping layer 156b, and the modified second additive layer 147a are removed. The hard mask layer 157b, the capping layer 156b, and the modified second additive layer 147a may be removed in a similar fashion as those discussed above with respect to FIG. 20. While the semiconductor device structure 100 in FIGS. 24-30D is based on the embodiment of FIGS. 23-7 and 23-8, it is contemplated that layer arrangement of FIGS. 23-1 to 23-6 is equally applicable to various embodiments of this disclosure. In cases where the embodiment of FIGS. 23-7 and 23-8 is used, the modified region 161a of the second HK dielectric layer 161 is exposed upon removal of the hard mask layer 157b, the capping layer 156b, and the modified second additive layer 147a, resulting the HK dielectric stack 163 and IL 150 with at least two $V_{th}$ tuning layers (e.g., the modified region 161a of the second HK dielectric layer 161 and the $V_{th}$ tuning layer 160-1b) embedded therein. This is advantageous for miniaturization of metal gate structures because a typical metal gate structure may require multiple metal layers between the HK dielectric layer and the work function metal layer (or gate electrode layer) for tuning threshold voltage for the N-type/P-type FETs. With the inventive approach discussed herein, dopant atoms with positive polarity or negative polarity are diffused into and positioned at certain regions (rather than throughout the thickness) of the IL 150 and/or HK dielectric stack 163 by a thermal drive-in process to meet different threshold voltage requirements. Therefore, there is no need to use multiple metal layers between the HK dielectric layer and the work function metal layers, which saves extra space for post work function metal filling. In addition, since the dopant atoms are diffused into the HK dielectric layers through a thermal drive-in process instead of a multi-layer stacking process, surface defects that would have otherwise generated during the formation of a HK dielectric layer (e.g., La-doped $HfO_2$) due to metal segregation are minimized or eliminated. As a result, threshold voltage degradation is avoided.

Figure 25:
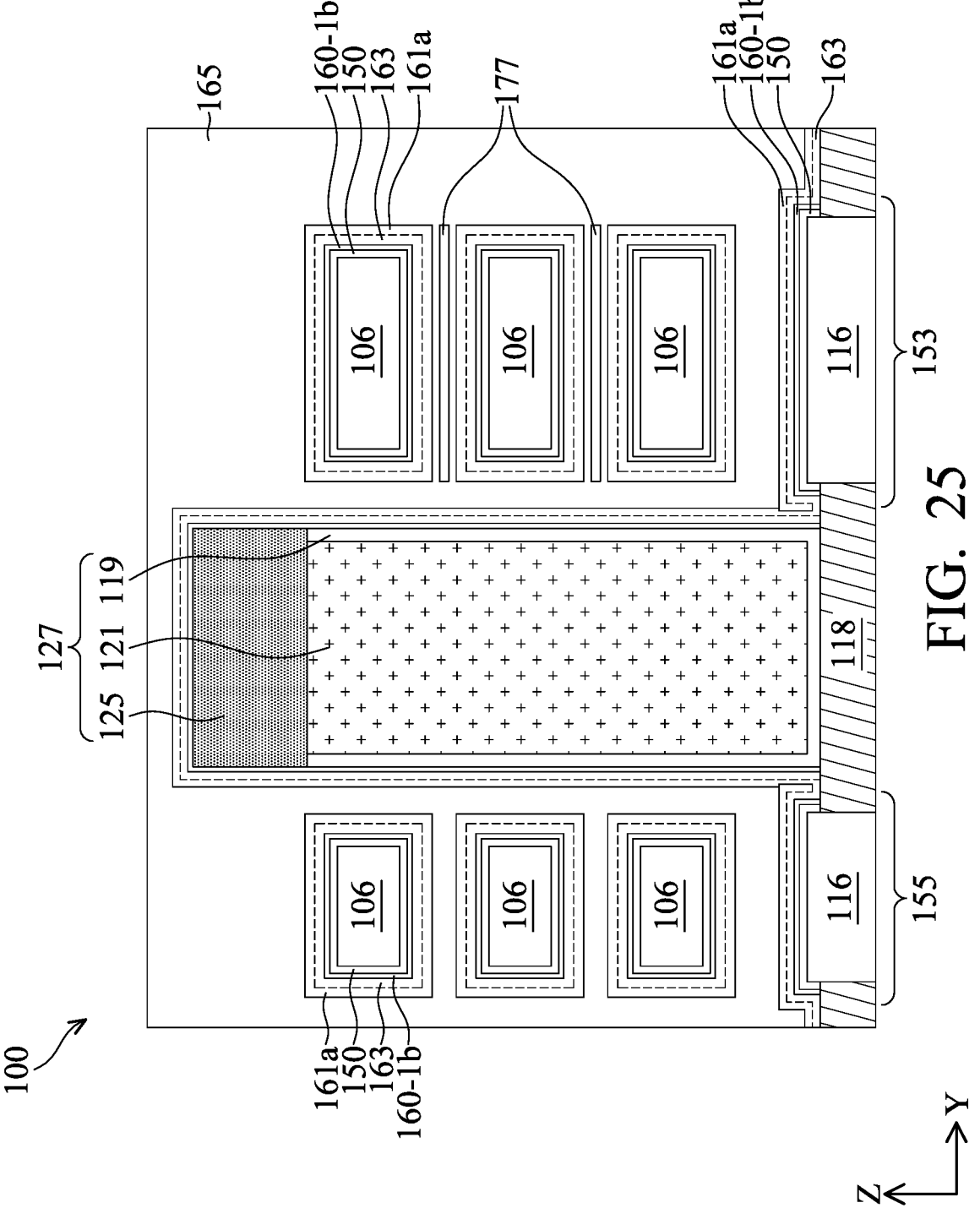

In FIG. 25, a P-type work function metal (or P-metal) 165 is formed over the modified region 161a of the second HK dielectric layer 161. The P-type work function metal 165 may be deposited so that at least the nanosheet transistors at the regions 153, 155 are submerged in the P-type work function metal 165. In some embodiments, the P-type work function metal 165 is deposited to a height over a top surface of the modified region 161a of the second HK dielectric layer 161 over the dielectric feature 127. The P-type work function metal 165 may be formed by ALD, PVD, CVD, electro-plating, or other suitable method. Exemplary P-type work function metals may include, but are not limited to, TiN, TaN, Ru, Mo, Al, WN, TiSiN, TiTaN, TiAlN, WCN, $ZrSi_2$, $MoSi_2$, $TaSi_2$, $NiSi_2$, or other suitable P-type work function materials, or any combination thereof. The P-type work function metal 165 may include a plurality of layers (e.g., a composite layer). In one embodiment, the P-type work function layer metal is TiN.

In some embodiments, the P-type work function metal 165 may fully fill the openings 151 (FIG. 24) between adjacent first semiconductor layers 106 of the nanosheet transistors at the region 155, while the openings 151 between adjacent first semiconductor layers 106 of the nanosheet transistors at the region 153 may not be fully filled due to the loading effect. In such cases, voids 177 may be formed in the P-type work function metal 165 at the region 153.

Figure 26:
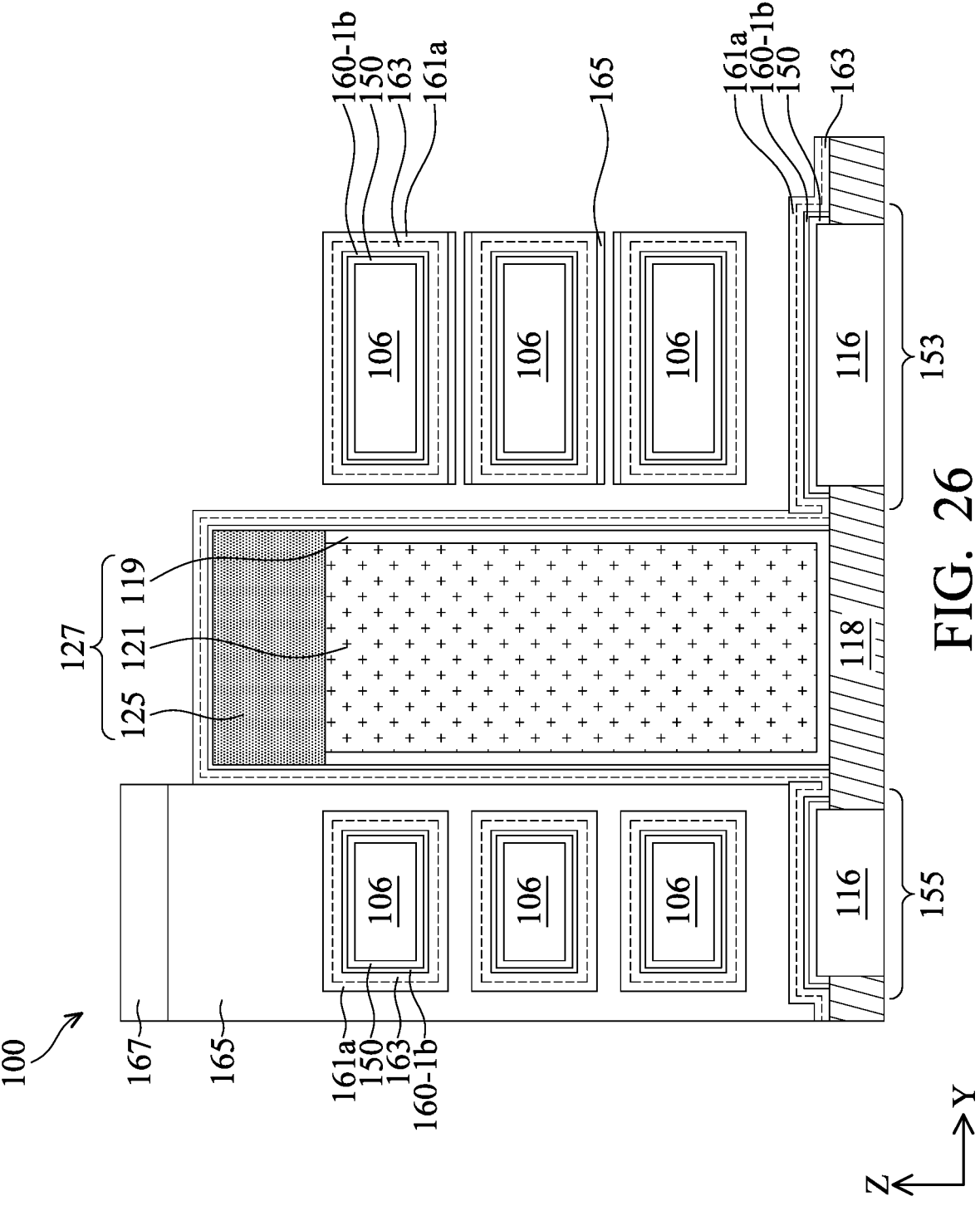

In FIG. 26, a patterned resist layer 167 is formed to cover P-type FETs, such as nanosheet transistors at the region 155, while the dielectric features 127 and N-type FETs, such as nanosheet transistors at the region 153 are left uncovered. The patterned resist layer 167 protects the P-type work function metal 165 and the nanosheet transistors at the region 155 so that the P-type work function metal 165 over the dielectric features 127 and the nanosheet transistors at the region 153 are removed. The patterned resist layer 167 may be formed by first forming a blanket layer on the semiconductor device structure 100, followed by patterning and etching processes to remove portions of the blanket layer at selected regions to form the patterned resist layer 167. The patterned resist layer 167 may be any suitable masking material, such as a photoresist layer, a BARC (bottom anti-reflective coating) layer, a SOG (spin-on-glass) layer, or a SOC (spin-on-carbon) layer, and may be deposited by spin coating or any suitable deposition technique. Once the patterned resist layer 167 is formed, the P-type work function metal 165 over the dielectric features 127 and the nanosheet transistors at the region 153 are removed. The P-type work function metal 165 may be removed using any suitable processes, such as dry etch, wet etch, or a combination thereof. The removal process may be a selective etch process that removes the P-type work function metal 165 but not the modified region 161a of the second HK dielectric layer 161. In some embodiments, a portion of the P-type work function metal 165 may remain between adjacent first semiconductor layers 106 of the nanosheet transistors at the region 153 due to the narrow spacing.

Figure 27:
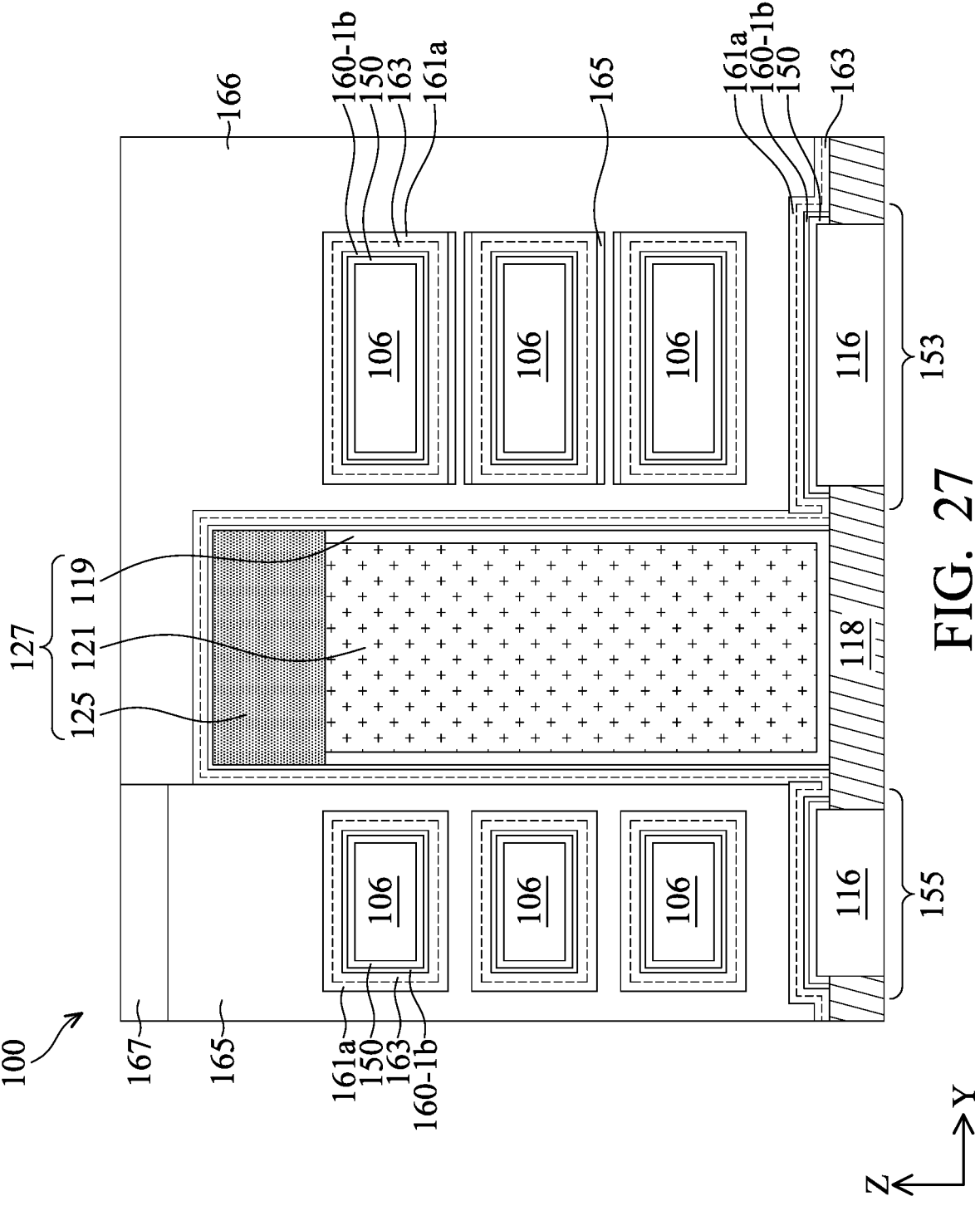

In FIG. 27, an N-type work function metal 166 is formed over the modified region 161a of the second HK dielectric layer 161 not covered by the patterned resist layer 167. The N-type work function metal 166 may be deposited so that at least the nanosheet transistors at the regions 153 are submerged in the N-type work function metal 166. In some embodiments, the N-type work function metal 166 is deposited to a height over the top surface of the modified region 161*a* of the second HK dielectric layer 161 over the dielectric feature 127. The N-type work function metal 166 may be formed by ALD, PVD, CVD, electro-plating, or other suitable method. The N-type work function metal 166 may include or be formed of Ti, Ag, TaAl, TaAlC, TiAlN, TaC, TaCN, TaSiN, TiAl, TiTaN, Mn, Zr, other suitable N-type work function materials, or any combination thereof. The N-type work function metal 166 may include a plurality of layers (e.g., a composite layer). In one embodiment, the N-type work function metal 166 is TiAl. In some embodiments, the P-type work function metal 165 and the N-type work function metal 166 are both disposed between adjacent first semiconductor layers 106 of the nanosheet transistors at the region 153, as shown in FIG. 27.

Figure 28:
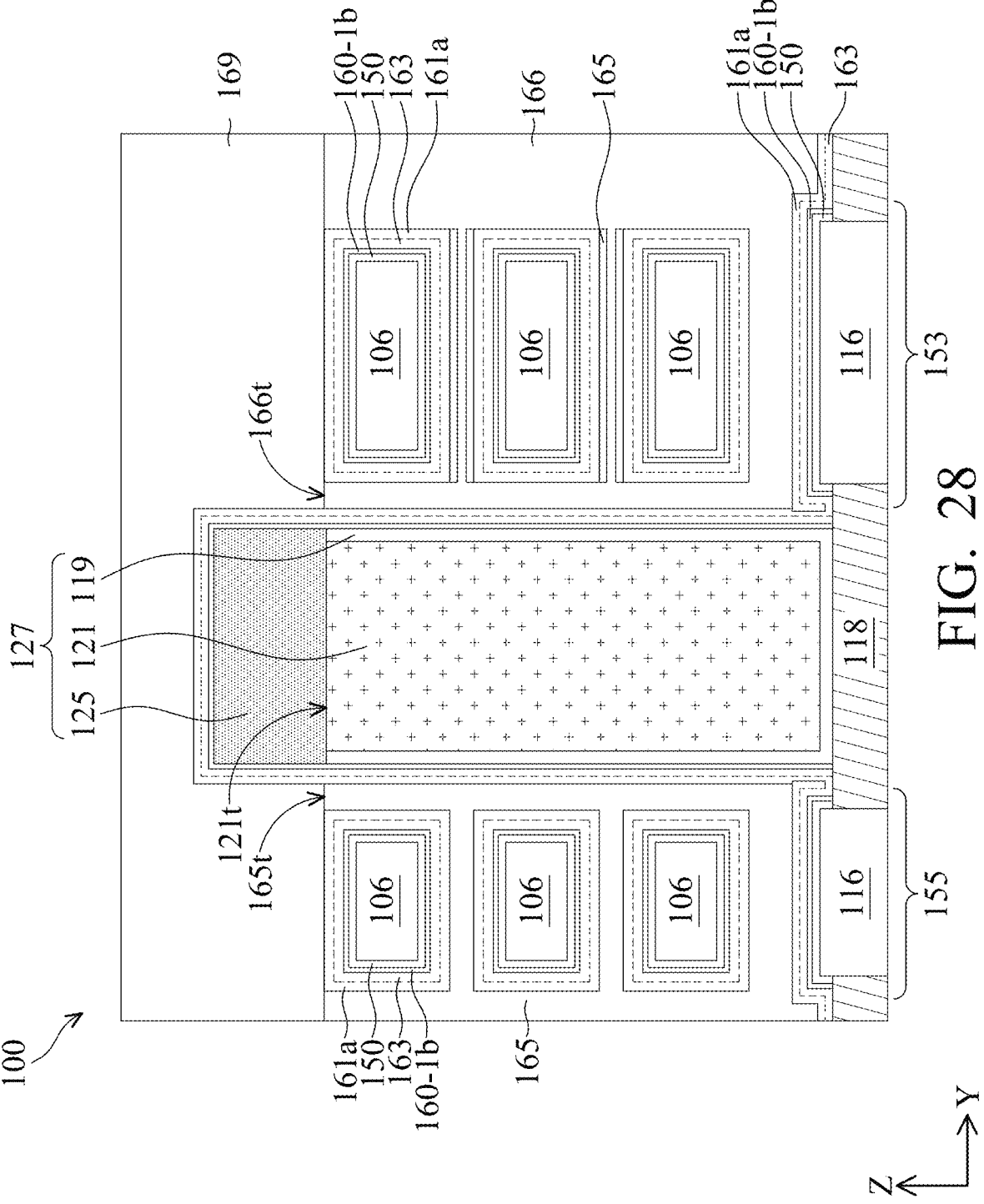

In FIG. 28, portions of the P-type work function metal 165 and the N-type work function metal 166 are recessed, and a metal layer 169 is formed on the recessed P-type work function metal 165 and the N-type work function metal 166. A first etch-back process may be performed on the N-type work function metal 166 to recess the N-type work function metal 166, while the P-type work function metal 165 is covered by the patterned resist layer 167. The first etch-back process uses an etchant that selectively removes the N-type work function metal 166 but not the P-type work function metal 165 and the modified region 161*a* of the second HK dielectric layer 161. A portion of the patterned resist layer 167 may be removed during the first etch-back process. The N-type work function metal 166 may be recessed so that a top surface 166*t* of the N-type work function metal 166 is at a level near or slightly below a top surface 12 It of the dielectric material 121. Next, the patterned resist layer 167 is removed using, for example, an ash process or other suitable removal process. A patterned resist layer (not shown) may be formed on the N-type work function metal 166 to protect the N-type work function metal 166 during the subsequent processes. Then, a second etch-back process may be performed on the exposed P-type work function metal 165 to recess the P-type work function metal 165. The second etch-back process uses an etchant that selectively removes the P-type work function metal 165 but not the N-type work function metal 166 and the modified region 161*a* of the second HK dielectric layer 161. The P-type work function metal 165 may be recessed so that a top surface 165*t* of the P-type work function metal 165 is at a level near or slightly below the top surface 121*t* of the dielectric material 121. As a result of the first and second etch-back processes, the top surface 166*t* of the N-type work function metal 166 and the top surface of the modified region 161*a* of the second HK dielectric layer 161 at the region 153 are at a similar elevation, and the top surface 165*t* of the P-type work function metal 165 and the top surface of the modified region 161*a* of the second HK dielectric layer 161 at the region 155 are at a similar elevation. The patterned resist layer over the N-type work function metal 166 is then removed.

Thereafter, the metal layer 169 is formed on the dielectric features 127, the recessed P-type work function metal 165, and the N-type work function metal 166. The metal layer 169 is deposited to a height over the top surface of the ILD layer 164. The metal layer 169 may be an electrically conductive material, such as a metal. Suitable materials may include, but are not limited to, W, Ru, Mo, Co, Ni, Ti, Ta, Cu, Al, or the like. In one embodiment, the metal layer 169 includes fluorine-free tungsten (FFW). The metal layer 169 may be formed by CVD, PVD, ALD, electro-plating, or other suitable deposition method. In some embodiments, the metal layer 169 is one continuous layer in contact with the P-type work function metal 165, the N-type work function metal 166, and the modified region 161*a* of the second HK dielectric layer 161 at the regions 153, 155 and over the dielectric feature 127. In some embodiments, the metal layer 169 may have a thickness of about 5 nm to about 45 nm. If the thickness of the metal layer 169 is less than 5 nm, the work function of the metal layer 169 may be lost. On the other hand, if the thickness of the metal layer 169 is greater than 45 nm, there may be growth selective loss when filling metal (e.g., tungsten) in the gate contact openings at a later stage.

FIGS. 29A-29D are perspective views of one of the various stages of manufacturing the semiconductor device structure 100 taken along cross-sections A-A, B-B, C-C, and D-D of FIG. 8, in accordance with some embodiments. FIGS. 30A-30D are perspective views of one of the various stages of manufacturing the semiconductor device structure 100 taken along cross-sections A-A, B-B, C-C, and D-D of FIG. 8, in accordance with some embodiments. In FIGS. 29A-29D, after the metal layer 169 is formed, a planarization process, such as a CMP process, is performed on the semiconductor device structure 100. The planarization process removes excess portions of the metal layer 169 until a top surface of the ILD layer 164 is exposed. After the planarization process, the top surfaces of the metal layer 169, the modified region 161*a* of the second HK dielectric layer 161, the HK dielectric stack 163, the gate spacer 138, the CESL 162, and ILD layer 164 are substantially co-planar.

Figures 29A, 29B, 29C:
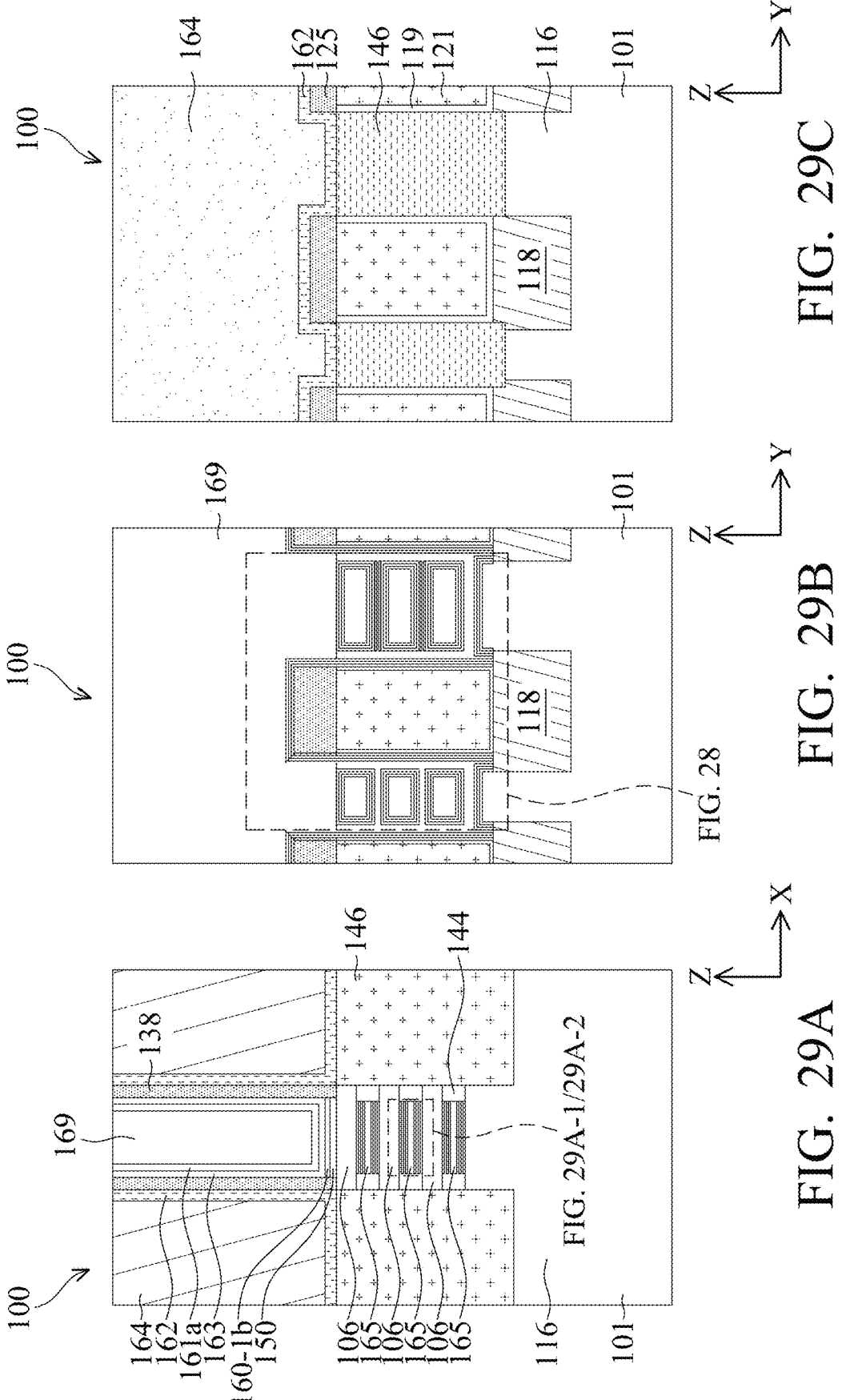
FIGS. 29A-29D are cross-sectional side views of one of the various stages of manufacturing the semiconductor device structure taken along cross-sections A-A, B-B, C-C, and D-D of FIG. 8, in accordance with some embodiments.
Figure 29D:
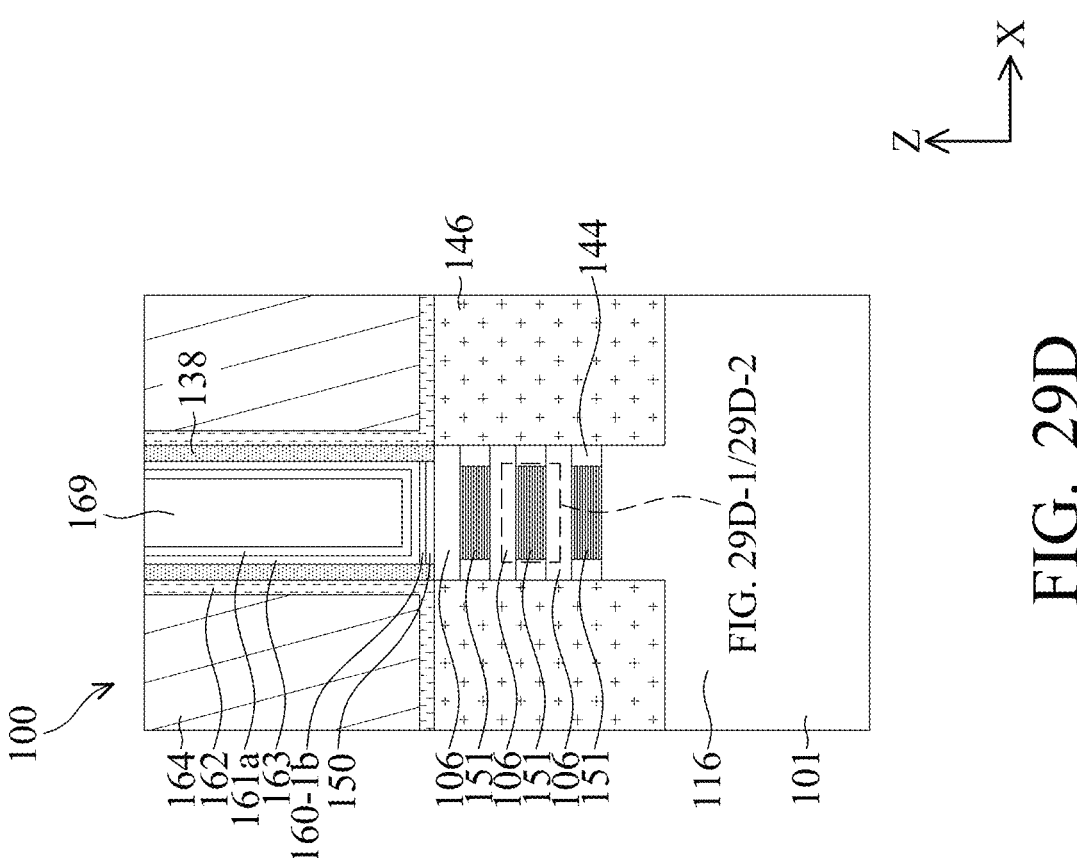
Figures 1, 29A, 29D:
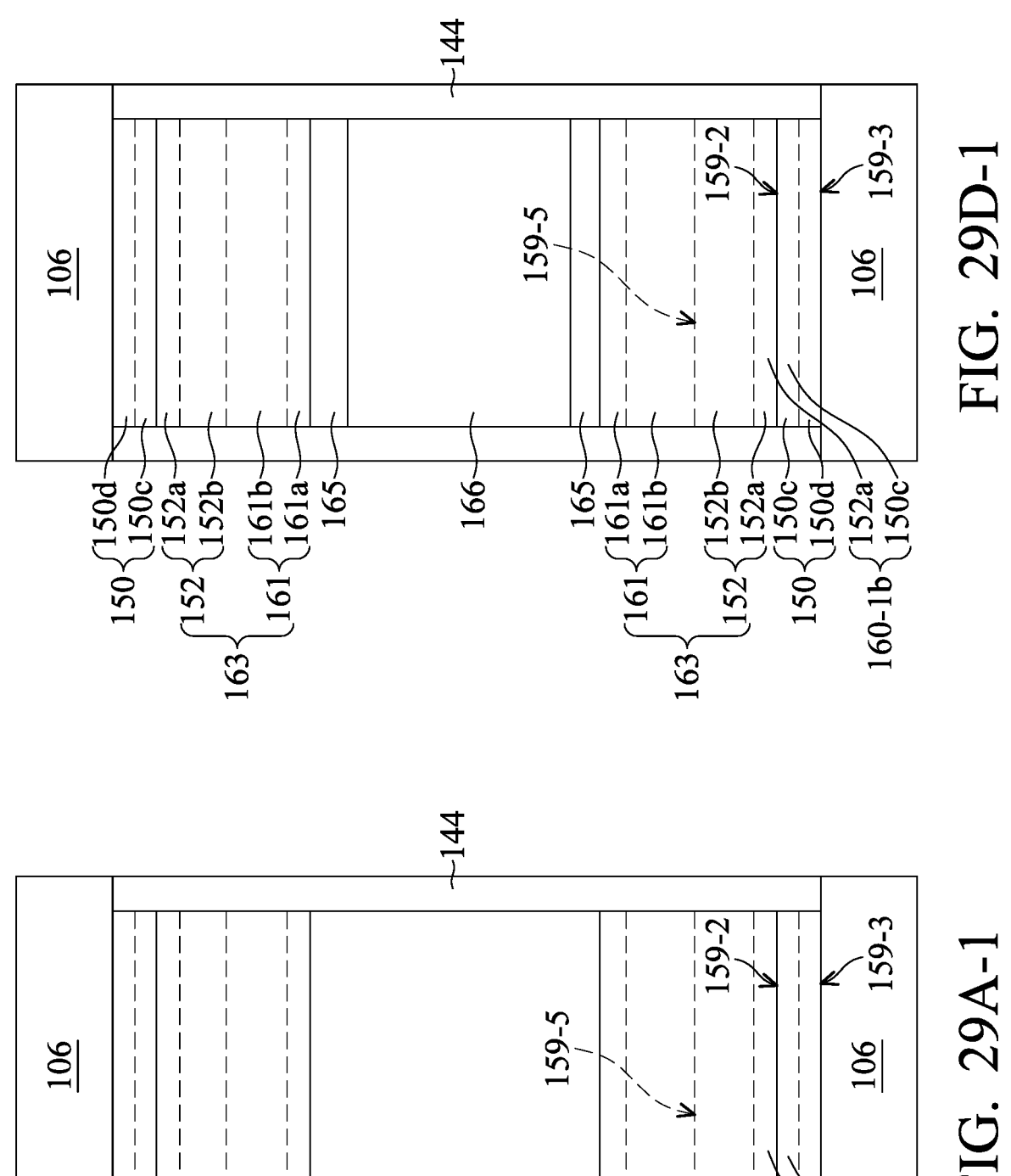
Figures 2, 29A, 29D:
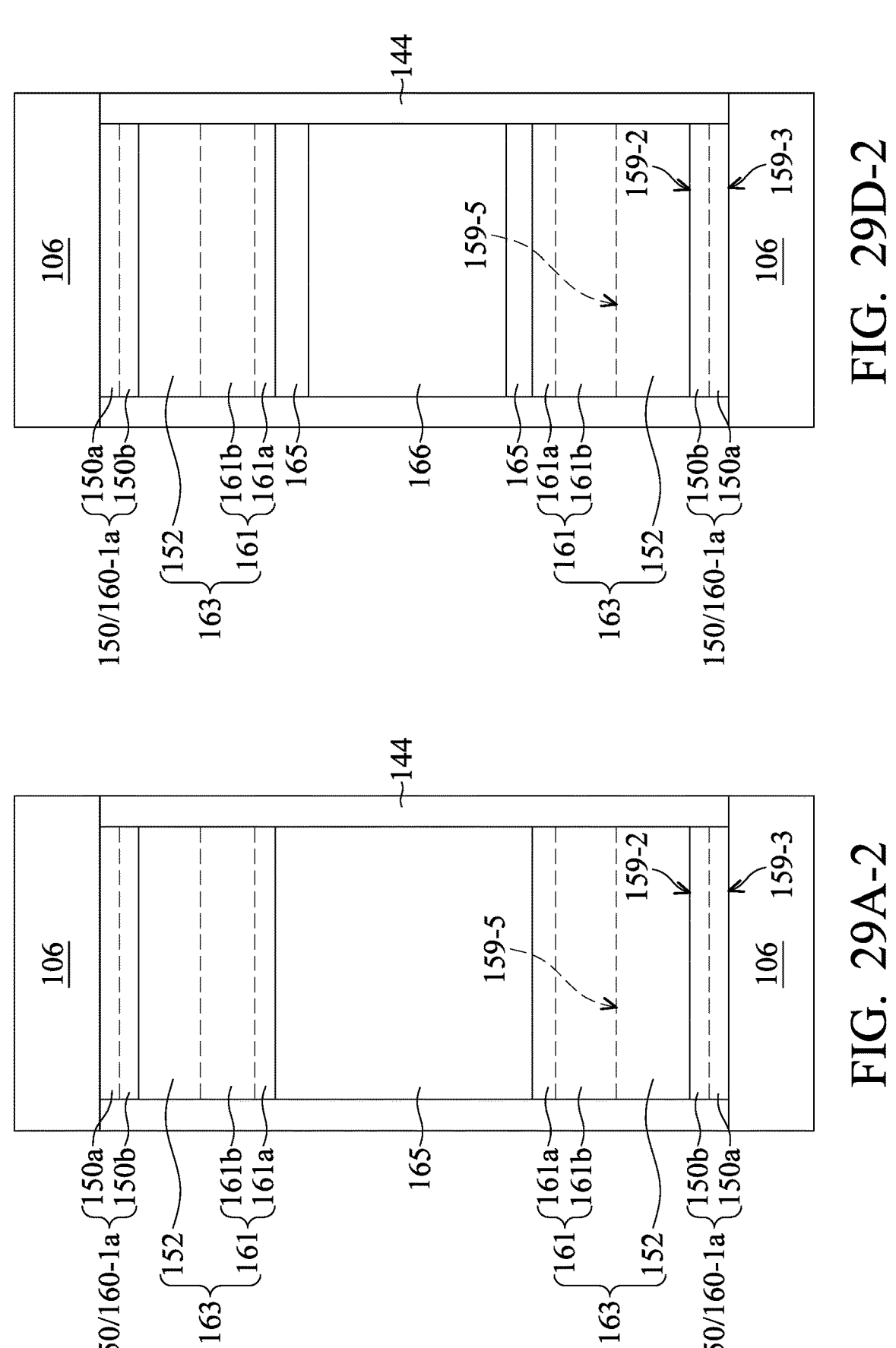

FIGS. 29A-1 and 29D-1 are enlarged views of a portion of the semiconductor device structure 100 in FIGS. 29A and 29D, respectively, showing arrangement of the layers between adjacent first semiconductor layers 106 in accordance with the embodiment of FIG. 28. FIGS. 29A-2 and 29D-2 are enlarged views of a portion of the semiconductor device structure 100 in FIGS. 29A and 29D, respectively, showing arrangement of the layers between adjacent first semiconductor layers 106 in accordance with the embodiment of FIG. 23-1. FIGS. 29A-1, 29A-2 and 29D-1, 29D-2 show portions of the first semiconductor layers 106 at the regions 153, 155 are wrapped around by the layers shown in the embodiment of FIGS. 28 and 23-1, respectively. It is contemplated that various embodiments of FIGS. 23-3 and 23-4 to 23-5 and 23-6, particularly layers between interfaces 159-4 and 159-3, may otherwise be used, either alone or in combination, to adjust the threshold voltage of the N-type and/or P-type FETs at regions 153, 155.

Figures 30A, 30B, 30C:
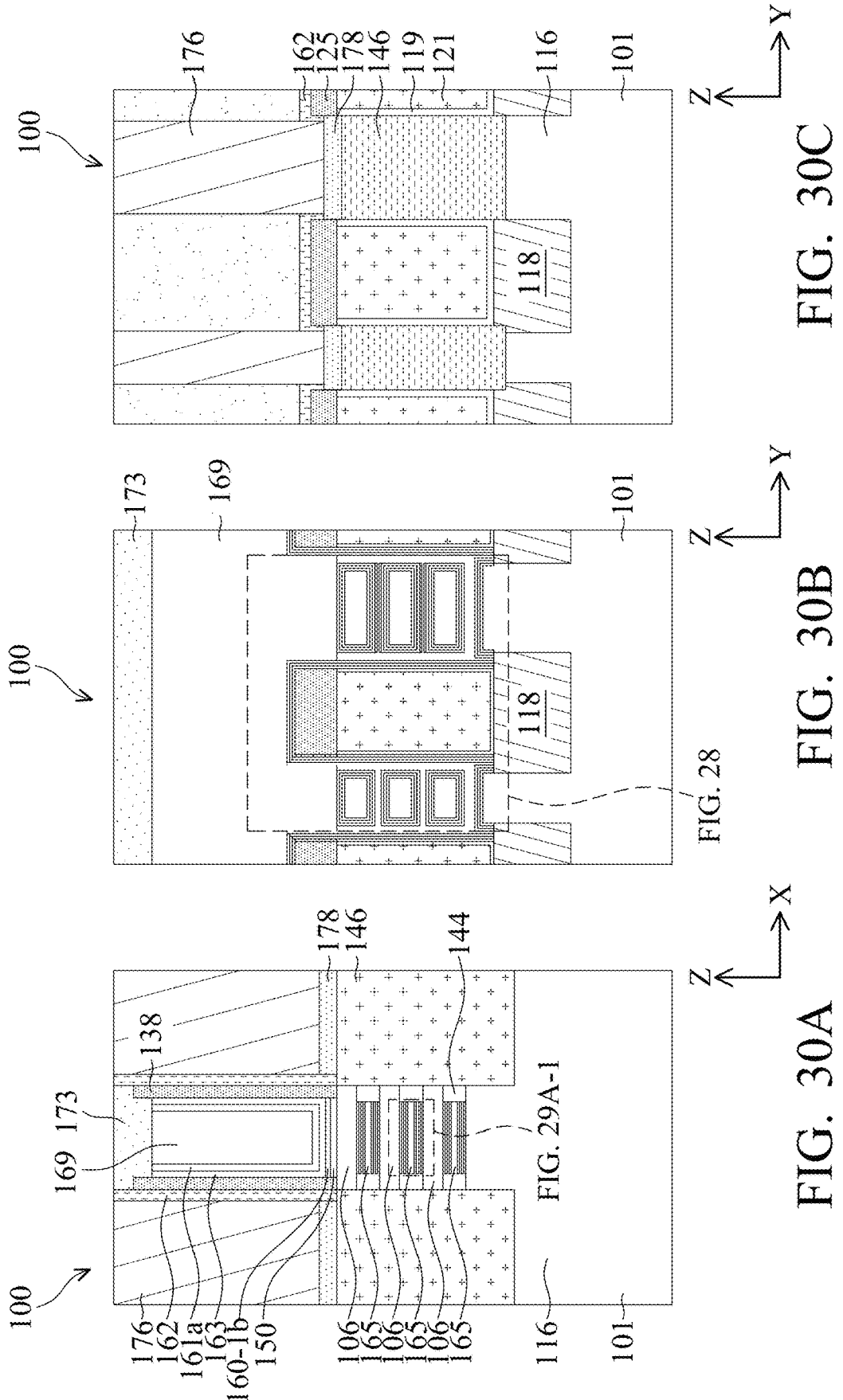
FIGS. 30A-30D are cross-sectional side views of one of the various stages of manufacturing the semiconductor device structure taken along cross-sections A-A, B-B, C-C, and D-D of FIG. 8, in accordance with some embodiments.
Figure 30D:
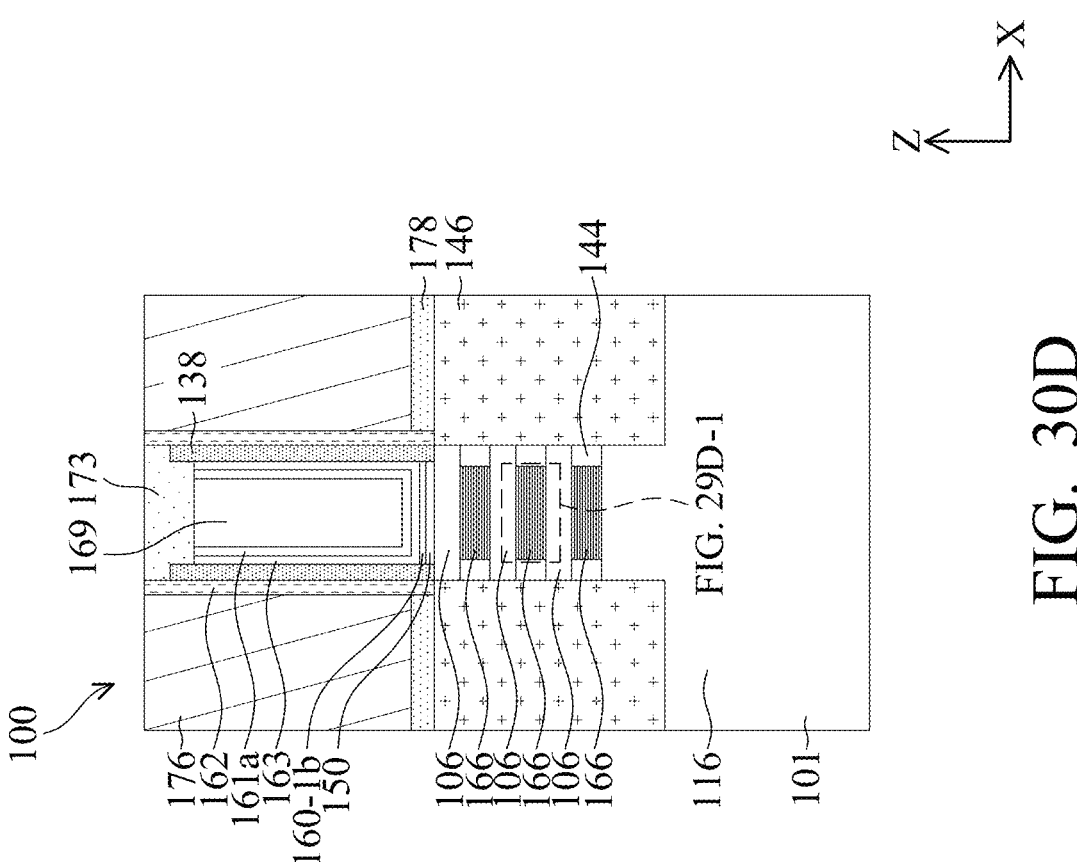

In FIGS. 30A-30D, one or more metal gate etching back (MGEB) processes are performed on the N-type and P-type FETs at regions 153, 155. The MGEB processes are performed so that the top surfaces of metal layer 169, the modified region 161*a* of the second HK dielectric layer 161, and the HK dielectric stack 163 are recessed to a level below the top surface of the gate spacers 138. In some embodiments, the gate spacers 138 are also recessed to a level below the top surface of the CESL 162, as shown in FIGS. 30A, 30D. A self-aligned contact layer 173 is formed over the metal layer 169, the modified region 161*a* of the second HK dielectric layer 161, and the HK dielectric stack 163 between the gate spacers 138. The self-aligned contact layer 173 may be a dielectric material having an etch selectivity relative to the gate spacers 138. In some embodiments, the self-aligned contact layer 173 includes silicon nitride. The self-aligned contact layer 173 can be used to define self-aligned contact regions for the semiconductor device structure 100.

After formation of the self-aligned contact layer 173, contact openings are formed through the ILD layer 164 and the CESL 162 (FIGS. 29A and 29D) to expose the epitaxial S/D feature 146. A silicide layer 178 is then formed on the epitaxial S/D features 146 to conductively couple the epitaxial S/D features 146 to the subsequently formed S/D contacts 176. The silicide layer 178 may be formed by depositing a metal source layer over the epitaxial S/D features 146 and performing a rapid thermal annealing process. The metal source layer includes an electrically conductive layer selected from W, Co, Ni, Ti, Mo, and Ta, or a metal nitride layer selected from tungsten nitride, cobalt nitride, nickel nitride, titanium nitride, molybdenum nitride, and tantalum nitride. During the rapid anneal process, the portion of the metal source layer over the epitaxial S/D features 146 reacts with silicon in the epitaxial S/D features 146 to form the silicide layer 178. Unreacted portion of the metal source layer is then removed.

After formation of the silicide layer 178, a conductive material is formed in the contact openings and form the S/D contacts 176. The conductive material may be made of a material including one or more of Ru, Mo, Co, Ni, W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and until the top surface of the self-aligned contact layer 173 is exposed.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 by flipping over the semiconductor device structure 100, removing the substrate 101, and selectively connecting source or drain feature/terminal of the epitaxial S/D features 146 to a backside power rail (e.g., positive voltage VDD or negative voltage VSS) through the backside contacts. Depending on the application, the source or drain feature/terminal of the epitaxial S/D features 146 and the metal layer 169 may be connected to a frontside power source.

Various embodiments or examples described herein offer multiple advantages over the state-of-art technology. According to embodiments of the present disclosure, during the replacement gate process, one or more additive layers having dopants with positive polarity or negative polarity are deposited over an interfacial layer (IL)/HK dielectric layer, and the dopant atoms are diffused into and positioned at certain regions (rather than throughout the thickness) of the IL and/or the HK dielectric layer to adjust threshold voltage for P-type and/or N-type work function layers. With this approach, there is no need to use multiple metal layers between the HK dielectric layer and subsequent work function metal layers, which saves extra space for post work function metal filling. In addition, since the dopant atoms are diffused into the HK dielectric layer through a thermal drive-in process instead of a multi-layer stacking process, surface defects that would have otherwise generated during formation of the HK dielectric layer (e.g., La-doped $HfO_2$) due to metal segregation are minimized or eliminated. As a result, threshold voltage degradation is avoided.

An embodiment is a semiconductor device structure. The structure includes one or more semiconductor layers, an interfacial layer surrounding at least one semiconductor layer of the one or more semiconductor layers, a work function metal disposed over the interfacial layer, and a high-K (HK) dielectric layer disposed between the interfacial layer and the work function metal. The HK dielectric layer includes a first dopant region adjacent to a first interface of the HK dielectric layer and the interfacial layer, wherein the first dopant region comprises first dopants having a first polarity. The HK dielectric layer also includes a second dopant region adjacent to a second interface of the HK dielectric layer and the work function metal, wherein the second dopant region comprises second dopants having a second polarity opposite the first polarity.

Another embodiment is a semiconductor device structure. The structure includes a dielectric feature, one or more first semiconductor layers disposed adjacent a first side of the dielectric feature, wherein each first semiconductor layer of the one or more first semiconductor layers has a first width. The structure includes one or more second semiconductor layers disposed adjacent a second side of the dielectric feature, wherein each second semiconductor layer of the one or more second semiconductor layers has a second width greater than the first width. The structure also includes an interfacial layer surrounding each first and second semiconductor layer of the one or more first and second semiconductor layers, wherein the interfacial layer comprises a first dopant region adjacent to a first interface of the interfacial layer and the first semiconductor layer and a second interface of the interfacial layer and the second semiconductor layer, respectively, and wherein the first dopant region comprises first dopant having a first polarity. The structure further includes a first work function metal disposed over the interfacial layer surrounding at least one first semiconductor layer and one second semiconductor layer, wherein the first work function metal has a first conductivity type. The structure further includes a second work function metal disposed over the interfacial layer surrounding at least one second semiconductor layer, wherein the second work function metal has a second conductivity type opposite the first conductivity type. The structure further includes a high-k (HK) dielectric stack, which includes a first HK dielectric layer comprising a second dopant region in contact with the first work function metal, wherein the second dopant region comprises second dopants having a second polarity opposite the first polarity. The HK dielectric stack also includes a second HK dielectric layer disposed between and in contact with the first HK dielectric layer and the interfacial layer.

A further embodiment is a method for forming a semiconductor device structure. The method includes forming a fin structure comprising a plurality of first semiconductor layers and a plurality of second semiconductor layers alternatingly stacked, forming a sacrificial gate structure over the fin structure, forming a source/drain feature on opposite sides of the sacrificial gate structure, the source/drain feature being in contact with the plurality of first semiconductor layers of the fin structure, removing portions of the plurality of second semiconductor layers to expose portions of each of the plurality of first semiconductor layers, surrounding an interfacial layer around exposed portions of each of the plurality of first semiconductor layers, depositing a first high-k (HK) dielectric layer on the interfacial layer, depositing a first additive layer on the first HK dielectric layer, wherein the first additive layer comprises first dopant having a first polarity, subjecting the fin structure to a first thermal treatment, removing the first additive layer to expose the first HK dielectric layer, depositing a second HK dielectric layer on the first HK dielectric layer, depositing a second additive layer on the second HK dielectric layer, wherein the second additive layer comprises second dopant having a second polarity opposite the first polarity, subjecting the fin structure to a second thermal treatment, and removing the second additive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
one or more semiconductor layers;
an interfacial layer surrounding at least one semiconductor layer of the one or more semiconductor layers;
a work function metal disposed over the interfacial layer; and
a high-K (HK) dielectric layer disposed between the interfacial layer and the work function metal, comprising:
a first dopant region adjacent to a first interface of the HK dielectric layer and the interfacial layer, wherein the first dopant region comprises first dopants having a first polarity, and a majority of the first dopants are accumulated at and/or near the first interface; and
a second dopant region adjacent to a second interface of the HK dielectric layer and the work function metal, wherein the second dopant region comprises second dopants having a second polarity opposite the first polarity, and a majority of the second dopants are accumulated at and/or near the second interface.

2. The semiconductor device structure of claim 1, wherein the HK dielectric layer further comprises:
a third dopant region between the first dopant region and the second dopant region, wherein the third dopant region comprises first and second dopants, and a concentration of the first and second dopants in the third dopant region is lesser than a concentration of the first or second dopants in the first and second dopant regions.

3. The semiconductor device structure of claim 2, wherein the concentration of the first dopants in the third dopant region is gradually reduced in a direction away from the first interface, and the concentration of the second dopants in the third dopant region is gradually reduced in a direction away from the second interface.

4. The semiconductor device structure of claim 1, wherein the interfacial layer comprises a fourth dopant region adjacent to the first interface, wherein the fourth dopant region comprises the first dopants.

5. The semiconductor device structure of claim 4, wherein the first dopants in the fourth dopant region have a concentration gradually reduced in a direction away from the first interface.

6. The semiconductor device structure of claim 1, wherein the first dopants comprise zinc and the second dopants comprise lanthanum.

7. The semiconductor device structure of claim 1, further comprising:
a metal layer in contact with the work function metal and the first dopant region.

8. The semiconductor device structure of claim 7, wherein the metal layer comprises a fluorine-free tungsten.

9. A semiconductor device structure, comprising:
a dielectric feature;
one or more first semiconductor layers disposed adjacent a first side of the dielectric feature, wherein each first semiconductor layer of the one or more first semiconductor layers has a first width;
one or more second semiconductor layers disposed adjacent a second side of the dielectric feature, wherein each second semiconductor layer of the one or more second semiconductor layers has a second width greater than the first width;
an interfacial layer surrounding each first and second semiconductor layer of the one or more first and second semiconductor layers, wherein the interfacial layer comprises a first dopant region adjacent to a first interface of the interfacial layer and the first semiconductor layer and a second interface of the interfacial layer and the second semiconductor layer, respectively, and wherein the first dopant region comprises first dopant having a first polarity, and a majority of the first dopants are accumulated at and/or near the first interface and the second interface, respectively;
a first work function metal disposed over the interfacial layer surrounding at least one first semiconductor layer, wherein the first work function metal has a first conductivity type;
a second work function metal disposed over the interfacial layer surrounding at least one second semiconductor layer, wherein the second work function metal has a second conductivity type opposite the first conductivity type; and
a high-k (HK) dielectric stack, comprising:
a first HK dielectric layer comprising a second dopant region in contact with the first work function metal, wherein the second dopant region comprises second dopants having a second polarity opposite the first polarity; and
a second HK dielectric layer disposed between and in contact with the first HK dielectric layer and the interfacial layer.

10. The semiconductor device structure of claim 9, wherein the first HK dielectric layer and the second HK dielectric layer include the same material.

11. The semiconductor device structure of claim 10, wherein the first dopants are zinc, the second dopants are lanthanum, and the first and second HK dielectric layer include hafnium oxide.

12. The semiconductor device structure of claim 9, wherein the first HK dielectric layer and the second HK dielectric layer include a material chemically different from each other.

13. The semiconductor device structure of claim 9, wherein the second dopants in the second dopant region have a concentration gradually reduced in a direction away from the first work function metal.

14. The semiconductor device structure of claim 9, wherein the first dopants in the first dopant region have a concentration gradually reduced in a direction away from the first and second interfaces.

15. The semiconductor device structure of claim 9, further comprising:

a metal layer in contact with the first and second work function metals.

16. The semiconductor device structure of claim 15, wherein the metal layer is further in contact with the second dopant region.

17. A semiconductor device structure, comprising:

a plurality of semiconductor layers vertically stacked;

an interfacial layer surrounding each semiconductor layer of the plurality of semiconductor layers, wherein the interfacial layer comprises a first dopant region adjacent to a first interface of the interfacial layer and the semiconductor layer, and the first dopant region comprises first dopant having a first polarity, and a majority of the first dopants are accumulated at and/or near the first interface;

a first work function metal surrounding at least one semiconductor layer;

a high-k (HK) dielectric stack, comprising:

a first HK dielectric layer comprising a second dopant region disposed immediately adjacent the first work function metal, wherein the second dopant region comprises second dopants having a second polarity opposite the first polarity; and a second HK dielectric layer disposed between the first HK dielectric layer and the interfacial layer.

18. The semiconductor device structure of claim 17, wherein the first HK dielectric layer and the second HK dielectric layer comprise the same material.

19. The semiconductor device structure of claim 17, wherein the second dopants in the second dopant region have a concentration gradually reduced in a direction away from the first work function metal.

20. The semiconductor device structure of claim 19, wherein the first dopants in the first dopant region have a concentration gradually reduced in a direction away from the first interface.

* * * * *